(12) United States Patent
Matan et al.

(10) Patent No.: US 10,158,232 B2
(45) Date of Patent: Dec. 18, 2018

(54) TOTAL HARMONIC CONTROL

(71) Applicant: XSLENT Energy Technologies, LLC, Novato, CA (US)

(72) Inventors: Stefan Matan, Novato, CA (US); Fred C Horton, Santa Rosa, CA (US); Frank P Marrone, Cloverdale, CA (US)

(73) Assignee: XSLENT Energy Technologies, LLC, Novato, CA (US)

( * ) Notice: Subject to any disclaimer, the term of this patent is extended or adjusted under 35 U.S.C. 154(b) by 567 days.

(21) Appl. No.: 14/791,433

(22) Filed: Jul. 4, 2015

(65) Prior Publication Data

US 2016/0087436 A1 Mar. 24, 2016

Related U.S. Application Data

(60) Provisional application No. 62/021,085, filed on Jul. 4, 2014.

(51) Int. Cl.
*G05F 1/66* (2006.01)
*H02J 13/00* (2006.01)
(Continued)

(52) U.S. Cl.
CPC ............... *H02J 3/28* (2013.01); *G01R 11/54* (2013.01); *G05B 13/026* (2013.01); *G05B 15/02* (2013.01);
(Continued)

(58) Field of Classification Search
CPC ...... G01R 11/54; G05B 13/026; G05B 15/02; G05F 1/66; G06G 7/635; H02J 13/0006;
(Continued)

(56) References Cited

U.S. PATENT DOCUMENTS

| 4,315,248 A | 2/1982 | Ward |
| 4,752,697 A | 6/1988 | Lyons et al. |

(Continued)

FOREIGN PATENT DOCUMENTS

| EP | 2515406 A1 | 10/2012 |
| JP | 2012130243 A | 7/2012 |

(Continued)

OTHER PUBLICATIONS

Australian Examination Report for Patent Application No. 2015283878, dated Feb. 2, 2018, 5 pages.

(Continued)

*Primary Examiner* — Abdelmoniem I Elamin
(74) *Attorney, Agent, or Firm* — Compass IP Law PC

(57) ABSTRACT

A distributed control node enables total harmonic control. The control node measures current drawn by a load, including harmonics of the primary current. A metering device can generate an energy signature unique to the load including recording a complex current vector for the load in operation identifying the primary current with a real power component and a reactive power component, and identifying the harmonics with a real power component, a reactive power component, and an angular displacement relative to the primary current. The control node can control a noise contribution of the load due to the harmonics as seen at a point of common coupling to reduce noise introduced onto the grid network from the load.

19 Claims, 16 Drawing Sheets

(51) Int. Cl.

| | |
|---|---|
| *H02J 3/01* | (2006.01) |
| *H02J 3/28* | (2006.01) |
| *H02J 3/38* | (2006.01) |
| *G06G 7/635* | (2006.01) |
| *H02J 3/18* | (2006.01) |
| *G01R 11/54* | (2006.01) |
| *H02J 3/06* | (2006.01) |
| *G05B 15/02* | (2006.01) |
| *H02J 3/00* | (2006.01) |
| *G05B 13/02* | (2006.01) |
| *H02J 3/12* | (2006.01) |
| *H02M 1/42* | (2007.01) |

(52) U.S. Cl.
CPC ............. *G05F 1/66* (2013.01); *G06G 7/635* (2013.01); *H02J 3/00* (2013.01); *H02J 3/01* (2013.01); *H02J 3/06* (2013.01); *H02J 3/12* (2013.01); *H02J 3/18* (2013.01); *H02J 3/382* (2013.01); *H02J 3/383* (2013.01); *H02J 13/0006* (2013.01); *H02M 1/42* (2013.01); *Y02B 70/3216* (2013.01); *Y02E 40/40* (2013.01); *Y02E 40/72* (2013.01); *Y04S 10/123* (2013.01); *Y04S 20/221* (2013.01); *Y04S 20/224* (2013.01)

(58) Field of Classification Search
CPC ........ H02J 3/00; H02J 3/01; H02J 3/06; H02J 3/12; H02J 3/18; H02J 3/28; H02J 3/382; H02J 3/383; H02M 1/42; Y02B 70/3216; Y02E 40/40; Y02E 40/72; Y04S 10/123; Y04S 20/221; Y04S 20/224
See application file for complete search history.

(56) References Cited

U.S. PATENT DOCUMENTS

| | | |
|---|---|---|
| 5,731,965 A | 3/1998 | Cheng et al. |
| 5,798,631 A | 8/1998 | Spee et al. |
| 6,219,623 B1 | 4/2001 | Wills |
| 6,281,601 B1 | 8/2001 | Edelman et al. |
| 6,323,620 B1 | 11/2001 | Miyoshi et al. |
| 6,697,951 B1 | 2/2004 | Sinha et al. |
| 6,925,361 B1 | 8/2005 | Sinnock |
| 7,633,284 B2 | 12/2009 | Ingram et al. |
| 8,121,741 B2 | 2/2012 | Taft et al. |
| 8,352,091 B2 | 1/2013 | Haugh |
| 8,406,019 B2 | 3/2013 | Garces et al. |
| 8,423,194 B2 | 4/2013 | Besore et al. |
| 8,432,052 B2 | 4/2013 | Lu et al. |
| 8,768,528 B2 | 7/2014 | Millar et al. |
| 8,810,202 B2 | 8/2014 | Nomura |
| 8,922,056 B2 | 12/2014 | Thisted |
| 8,933,572 B1 | 1/2015 | Abdur-Rahim et al. |
| 8,990,114 B2 | 3/2015 | Terano et al. |
| 9,046,077 B2 | 6/2015 | Kirchner et al. |
| 9,168,839 B2 | 10/2015 | Paupert |
| 9,244,446 B2 | 1/2016 | Bhageria et al. |
| 9,318,947 B2 | 4/2016 | Schauder et al. |
| 9,325,173 B2 * | 4/2016 | Varma ................... H02J 3/01 |
| 9,368,968 B2 | 6/2016 | Schrock et al. |
| 9,418,393 B2 | 8/2016 | Forbes |
| 9,455,577 B2 | 9/2016 | Bhageria et al. |
| 9,457,680 B2 | 10/2016 | Shinzaki et al. |
| 9,469,203 B2 | 10/2016 | Momose et al. |
| 9,473,042 B1 | 10/2016 | Chu et al. |
| 9,515,491 B2 | 12/2016 | Bhageria et al. |
| 9,639,074 B2 | 5/2017 | Hibiya et al. |
| 9,640,997 B2 | 5/2017 | Chandrashekhara et al. |
| 9,656,567 B2 | 5/2017 | Kothavale et al. |
| 9,685,887 B2 | 6/2017 | Martin |
| 2002/0072868 A1 | 6/2002 | Bartone et al. |
| 2002/0149953 A1 | 10/2002 | Smedley et al. |
| 2003/0020333 A1 | 1/2003 | Ying |
| 2003/0047209 A1 | 3/2003 | Yanai et al. |
| 2003/0187550 A1 | 10/2003 | Wilson et al. |
| 2004/0071000 A1 | 4/2004 | Escobar et al. |
| 2004/0111226 A1 | 6/2004 | Brewster et al. |
| 2004/0260488 A1 | 12/2004 | Al-Hamrani |
| 2005/0212688 A1 | 9/2005 | Chung |
| 2007/0005195 A1 | 1/2007 | Pasquale et al. |
| 2007/0073445 A1 | 3/2007 | Gonzalez et al. |
| 2008/0106098 A1 | 5/2008 | Miller et al. |
| 2008/0143290 A1 | 6/2008 | Chavakula |
| 2008/0167756 A1 | 7/2008 | Golden et al. |
| 2008/0211230 A1 | 9/2008 | Gurin |
| 2009/0096211 A1 | 4/2009 | Stiesdal |
| 2009/0200988 A1 | 8/2009 | Bridges et al. |
| 2009/0200994 A1 | 8/2009 | Fornage |
| 2010/0076613 A1 | 3/2010 | Imes |
| 2010/0138063 A1 | 6/2010 | Cardinal et al. |
| 2010/0179704 A1 | 7/2010 | Ozog |
| 2010/0187914 A1 | 7/2010 | Rada et al. |
| 2010/0208501 A1 | 8/2010 | Matan et al. |
| 2010/0217451 A1 | 8/2010 | Kouda et al. |
| 2010/0238003 A1 | 9/2010 | Chan et al. |
| 2010/0306027 A1 | 12/2010 | Haugh |
| 2011/0074152 A1 | 3/2011 | Yasugi |
| 2011/0088748 A1 | 4/2011 | Lee |
| 2011/0103110 A1 | 5/2011 | Godridge et al. |
| 2011/0130889 A1 | 6/2011 | Khajehoddin et al. |
| 2011/0198846 A1 | 8/2011 | Wakasa et al. |
| 2011/0202418 A1 | 8/2011 | Kempton et al. |
| 2011/0204717 A1 | 8/2011 | Shaffer |
| 2011/0285130 A1 | 11/2011 | Thisted |
| 2011/0316480 A1 | 12/2011 | Mills-Price et al. |
| 2012/0029720 A1 | 2/2012 | Cherian et al. |
| 2012/0049629 A1 | 3/2012 | Miller et al. |
| 2012/0053741 A1 | 3/2012 | Beyerle et al. |
| 2012/0059527 A1 | 3/2012 | Beaston et al. |
| 2012/0086273 A1 | 4/2012 | Rognli |
| 2012/0197449 A1 | 8/2012 | Sanders |
| 2012/0205981 A1* | 8/2012 | Varma ................... H02J 3/01 307/64 |
| 2012/0245744 A1 | 9/2012 | Prosser et al. |
| 2012/0249048 A1 | 10/2012 | Nishibayashi et al. |
| 2012/0310559 A1 | 12/2012 | Taft |
| 2012/0326503 A1 | 12/2012 | Birkelund |
| 2013/0015708 A1 | 1/2013 | Ukita et al. |
| 2013/0015713 A1 | 1/2013 | Hagihara |
| 2013/0018516 A1 | 1/2013 | Chee et al. |
| 2013/0043725 A1 | 2/2013 | Birkelund |
| 2013/0076140 A1 | 3/2013 | Darden et al. |
| 2013/0131878 A1 | 5/2013 | Wilkins et al. |
| 2013/0154570 A1 | 6/2013 | Nomura |
| 2013/0162215 A1 | 6/2013 | Cooper |
| 2014/0012427 A1 | 1/2014 | Katayama et al. |
| 2014/0052310 A1 | 2/2014 | Baba et al. |
| 2014/0070617 A1 | 3/2014 | Detmers et al. |
| 2014/0078625 A1 | 3/2014 | Zheng et al. |
| 2014/0094985 A1 | 4/2014 | Hibiya et al. |
| 2014/0103727 A1 | 4/2014 | Taimela et al. |
| 2014/0114844 A1 | 4/2014 | Forbes |
| 2014/0121849 A1 | 5/2014 | Ansari et al. |
| 2014/0129160 A1 | 5/2014 | Tran |
| 2014/0156095 A1 | 6/2014 | Rouse et al. |
| 2014/0159485 A1 | 6/2014 | Daniel et al. |
| 2014/0176090 A1 | 6/2014 | Harjeet et al. |
| 2014/0225457 A1 | 8/2014 | Elliott |
| 2014/0265695 A1 | 9/2014 | Thompson |
| 2014/0306533 A1 | 10/2014 | Paquin et al. |
| 2014/0376278 A1 | 12/2014 | Fornage et al. |
| 2014/0379156 A1 | 12/2014 | Kamel et al. |
| 2015/0120070 A1 | 4/2015 | Tarnowski |
| 2015/0270712 A1 | 9/2015 | Kanayama et al. |
| 2015/0357815 A1 | 12/2015 | Luh et al. |
| 2015/0364919 A1 | 12/2015 | Schumer et al. |
| 2016/0087439 A1* | 3/2016 | Matan ................... H02J 3/382 307/24 |
| 2016/0091912 A1 | 3/2016 | Stanlake |

(56) References Cited

U.S. PATENT DOCUMENTS

2017/0005515 A1 1/2017 Sanders et al.
2017/0155249 A1 6/2017 Thompson

FOREIGN PATENT DOCUMENTS

| JP | 2013544063 A | 12/2013 |
|---|---|---|
| WO | 2009083448 A2 | 7/2009 |
| WO | 2011032265 A1 | 3/2011 |
| WO | 2012015507 A1 | 2/2012 |
| WO | 2012058114 A2 | 5/2012 |
| WO | 2014019055 A1 | 2/2014 |

OTHER PUBLICATIONS

Australian Examination Report for Patent Application No. 2015283879, dated Feb. 17, 2017, 3 pages.
Extended European Search Report for Patent Application No. 15814562.3, dated Jan. 31, 2018, 6 pages.
Extended European Search Report for Patent Application No. 15814617.5, dated Jan. 31, 2018, 6 pages.
Final Office Action for U.S. Appl. No. 14/791,429, dated Dec. 20, 2017, 14 pages.
Final Office Action for U.S. Appl. No. 14/791,435, dated Mar. 2, 2018, 16 pages.
Final Office Action for U.S. Appl. No. 14/791,436, dated Mar. 5, 2018, 18 pages.
Final Office Action for U.S. Appl. No. 14/791,437, dated Mar. 8, 2018, 12 pages.
Final Office Action for U.S. Appl. No. 14/791,436, dated Jan. 25, 2018, 47 pages.
Final Office Action for U.S. Appl. No. 14/791,440, dated Jan. 25, 2018, 62 pages.
Final Office Action for U.S. Appl. No. 14/791,441, dated Feb. 5, 2018, 63 pages.
Final Office Action for U.S. Appl. No. 14/791,442, dated Feb. 2, 2018, 68 pages.
International Preliminary Report on Patentability, PCT/US2015/039230, dated Jan. 19, 2017, 15 pages.
International Preliminary Report on Patentability, PCT/US2015/039232, dated Jan. 19, 2017, 13 pages.
International Search Report and Written Opinion for PCT Patent Application No. PCT/US2015/039230, dated Sep. 30, 2015, 16 pages.
International Search Report and Written Opinion for PCT Patent Application No. PCT/US2015/039232, dated Sep. 24, 2015, 14 pages.
Korean and English Translation of Korean Office Action for Patent Application No. 10-2017-7003169, dated Mar. 15, 2018, 6 pages.
Korean and English Translation of Korean Office Action for Patent Application No. 10-2017-7003170, dated Mar. 15, 2017, 3 pages.
Moroccan Search Report for Patent Application No. 39560, dated Oct. 24, 2017, 6 pages.
Moroccan Search Report for Patent Application No. 39561, dated Sep. 21, 2017, 6 pages.
Notice of Allowance for U.S. Appl. No. 14/791,432, dated Dec. 26, 2017, 8 pages.
Notice of Allowance for U.S. Appl. No. 14/791,434, dated Feb. 16, 2018, 10 pages.
NPL—P. Sheaffer, et al., Universal Interconnection Technology Workshop Proceedings, [on line]. NREL/BK-560-32865. Colorado: National Renewable Energy Laboratory, U.S. Department of Energy Laboratory Operated by Midwest Research Institute, 2002 [retrieved on Jun. 7, 2017]. Retrieved from the Internet:> URL: https://www.researchgate.net/publication/25519894.
Office Action for U.S. Appl. No. 14/791,429, dated Aug. 30, 2017, 13 pages.
Office Action for U.S. Appl. No. 14/791,431, dated Oct. 3, 2017, 7 pages.
Office Action for U.S. Appl. No. 14/791,432, dated Aug. 31, 2017, 12 pages.
Office Action for U.S. Appl. No. 14/791,434, dated Sep. 25, 2017, 12 pages.
Office Action for U.S. Appl. No. 14/791,435, dated Sep. 21, 2017, 24 pages.
Office Action for U.S. Appl. No. 14/791,436, dated Oct. 10, 2017, 16 pages.
Office Action for U.S. Appl. No. 14/791,437, dated Oct. 13, 2017, 10 pages.
Office Action for U.S. Appl. No. 14/791,438, dated Jan. 11, 2018, 8 pages.
Office Action for U.S. Appl. No. 14/791,439, dated Jun. 1, 2017, 39 pages.
Office Action for U.S. Appl. No. 14/791,440, dated Jun. 15, 2017, 68 pages.
Office Action for U.S. Appl. No. 14/791,441, dated Jun. 26, 2017, 73 pages.
Office Action for U.S. Appl. No. 14/791,442, dated Jun. 27, 2017, 74 pages.
Final Office Action for U.S. Appl. No. 14/791,438, dated Jun. 21, 2018, 5 pages.
Office Action for U.S. Appl. No. 14/791,422, dated Jun. 28, 2018, 82 pages.
Office Action for U.S. Appl. No. 14/791,429, dated May 24, 2018, 14 pages.
Office Action for U.S. Appl. No. 14/791,435, dated Jul. 6, 2018, 14 pages.
Office Action for U.S. Appl. No. 14/791,436, dated Jul. 23, 2018, 19 pages.
Office Action for U.S. Appl. No. 15/791,437, dated Aug. 1, 2018, 12 pages.
Office Action for U.S. Appl. No. 14/791,439, dated Jul. 11, 2018, 47 pages.
Office Action for U.S. Appl. No. 14/791,440, dated Jun. 28, 2018, 65 pages.
Office Action for U.S. Appl. No. 14/791,441, dated Jun. 28, 2018, 74 pages.

\* cited by examiner

TOTAL HARMONIC CONTROL

RELATED CASES

The present application is a nonprovisional application based on U.S. Provisional Application No. 62/021,085, filed Jul. 4, 2014, and claims the benefit of priority of that provisional application. The provisional application is hereby incorporated by reference.

The present application is related to the following U.S. Patent Applications filed concurrently herewith, and having common ownership: U.S. patent application Ser. No. 14/791,429, entitled "HIERARCHICAL AND DISTRIBUTED POWER GRID CONTROL," U.S. patent application Ser. No. 14/791,431, entitled "DISTRIBUTED POWER GRID CONTROL WITH LOCAL VAR CONTROL," U.S. patent application Ser. No. 14/791,432, entitled "DISTRIBUTED POWER GRID CONTROL WITH LOCAL VAR GENERATION," U.S. patent application Ser. No. 14/791,434, entitled "ENERGY SIGNATURES TO REPRESENT COMPLEX CURRENT VECTORS," U.S. patent application Ser. No. 14/791,435, entitled "POWER GRID SATURATION CONTROL WITH DISTRIBUTED GRID INTELLIGENCE," U.S. patent application Ser. No. 14/791,436, entitled "VIRTUAL POWER GRID," U.S. patent application Ser. No. 14/791,437, entitled "MODULAR POWER GRID."

The present application is related to the following U.S. Patent Applications filed concurrently herewith, and having common ownership: U.S. patent application Ser. No. 14/791,438, entitled "GRID NETWORK GATEWAY AGGREGATION," U.S. patent application Ser. No. 14/791,439, entitled "INTELLIGENT BATTERY BACKUP AT A DISTRIBUTED GRID NODE," U.S. patent application Ser. No. 14/791,440, entitled "LOCAL METERING RESPONSE TO DATA AGGREGATION IN DISTRIBUTED GRID NODE," U.S. patent application Ser. No. 14/791,441, entitled "DATA AGGREGATION WITH OPERATION FORECASTS FOR A DISTRIBUTED GRID NODE," U.S. patent application Ser. No. 14/791,442, entitled "DATA AGGREGATION WITH FORWARD PREDICTION FOR A DISTRIBUTED GRID NODE."

FIELD

Embodiments of the invention are generally related to an electrical power grid, and more particularly to distributed and hierarchical control within a power grid.

COPYRIGHT NOTICE/PERMISSION

Portions of the disclosure of this patent document may contain material that is subject to copyright protection. The copyright owner has no objection to the reproduction by anyone of the patent document or the patent disclosure as it appears in the Patent and Trademark Office patent file or records, but otherwise reserves all copyright rights whatsoever. The copyright notice applies to all data as described below, and in the accompanying drawings hereto, as well as to any software described below: Copyright © 2015, Apparent Inc., All Rights Reserved.

BACKGROUND

Traditional utility power grids include a centralized power source (such as a coal-powered generator, a nuclear-power generator, a hydroelectric dam generator, wind farm, or others) and centralized management. The "grid" may connect to other power sources as well so that power can be shared across grid infrastructure from different power sources at a macro-level. However, traditionally, the grid includes a substantial amount of infrastructure, such as utility power lines with associated poles and towers, as well as substations to distribute the power. The grid is traditionally based on a massive generator that can provide enough power to satisfy peak demand of interconnected consumers. A consumer can include a dwelling place, a business, a cellphone tower or other utility box, or other user of power. The different consumers can have different peak demands, from the smallest user of energy to large businesses that have high power demands for heavy commercial equipment.

Traditional grid infrastructure is expensive to build and maintain. Furthermore, it requires the pushing of energy out from the central power source to the consumers, which can be hundreds of miles away. The substations and other infrastructure such as neighborhood transformers are controlled by the centralized management to keep voltages in-phase with current delivered on the grid, and keep voltage levels at regulated levels. Typically, motorized equipment drawing power from the grid will cause a degradation of power factor of the grid. On a macro scale, the grid management has attempted to control the power factor disturbance of the grid due to such motorized equipment. Newer switching power supply designs in modern electronics further complicate the power factor and voltage regulation of the grid by requiring reactive power and introducing noise back onto the grid.

Power delivered by the grid generally consists of a real power component and a reactive power component. Real power is power delivered where the voltage waveform and current waveform are perfectly aligned in-phase. Reactive power is power delivered where the voltage waveform and current waveform are not phase-aligned. Reactive power can be leading or lagging, based on the phase difference between the current and voltage waveforms.

Power as seen by a consumer can be understood differently from energy itself provided to calculate the power. Power is typically represented by W dot h or Watt-hours. Multiplying the Watt-hours by the rate charged by the utility provides the dollar amount owed by the consumer to the utility. But energy can be represented in different ways, and can be measured in multiple different ways. Examples include (VA) V dot I (voltage vector multiplied by current vector for volt-amps), V dot I dot PF (voltage vector multiplied by current vector times the power factor for Watts), and the square root of W^2 (square root of Watts squared for volt-amps-reactive). The consumer typically sees the power in Watt-hours which gives the cost of the energy delivered to the premises. Utilities have also started to measure and charge for reactive power consumption at the user premises.

There has been a significant increase in grid consumers adding renewable sources locally at the consumer locale to produce power. The renewable energy sources tend to be solar power and/or wind power, with a very significant number of solar systems being added. One limitation to customer power sources is that they tend to produce power at the same time, and may produce more power than can be used on the grid. The grid infrastructure is traditionally a one-way system, and the real power pushed back from the customer premises toward the central management and the central power source can create issues of grid voltage control and reactive power instability on the grid. These issues have caused grid operators to limit the amount of renewable energy that can be connected to the grid. In some cases, additional hardware or grid infrastructure is required at or near the consumer to control the flow of power back onto the grid.

In addition to the issues caused by renewable sources, the increase in use of air conditioning units and other loads that draw heavily on reactive power create additional strain for the grid management to keep voltage levels at needed levels. Recent heat waves have resulted in rolling brownouts and blackouts. Other times there are temporary interruptions on the grid as equipment interfaces are reset to deal with the changes in load when people return home from work and increase power consumption there. Traditionally, the central management must maintain compliance of grid regulations (such as voltage levels). Whenever something connected to the grid enters an overvoltage scenario, it shuts off from the grid, which can then create additional load on surrounding areas, resulting in larger areas of the grid coming down before the central management can restore grid stability.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, and/or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

Figure 1:
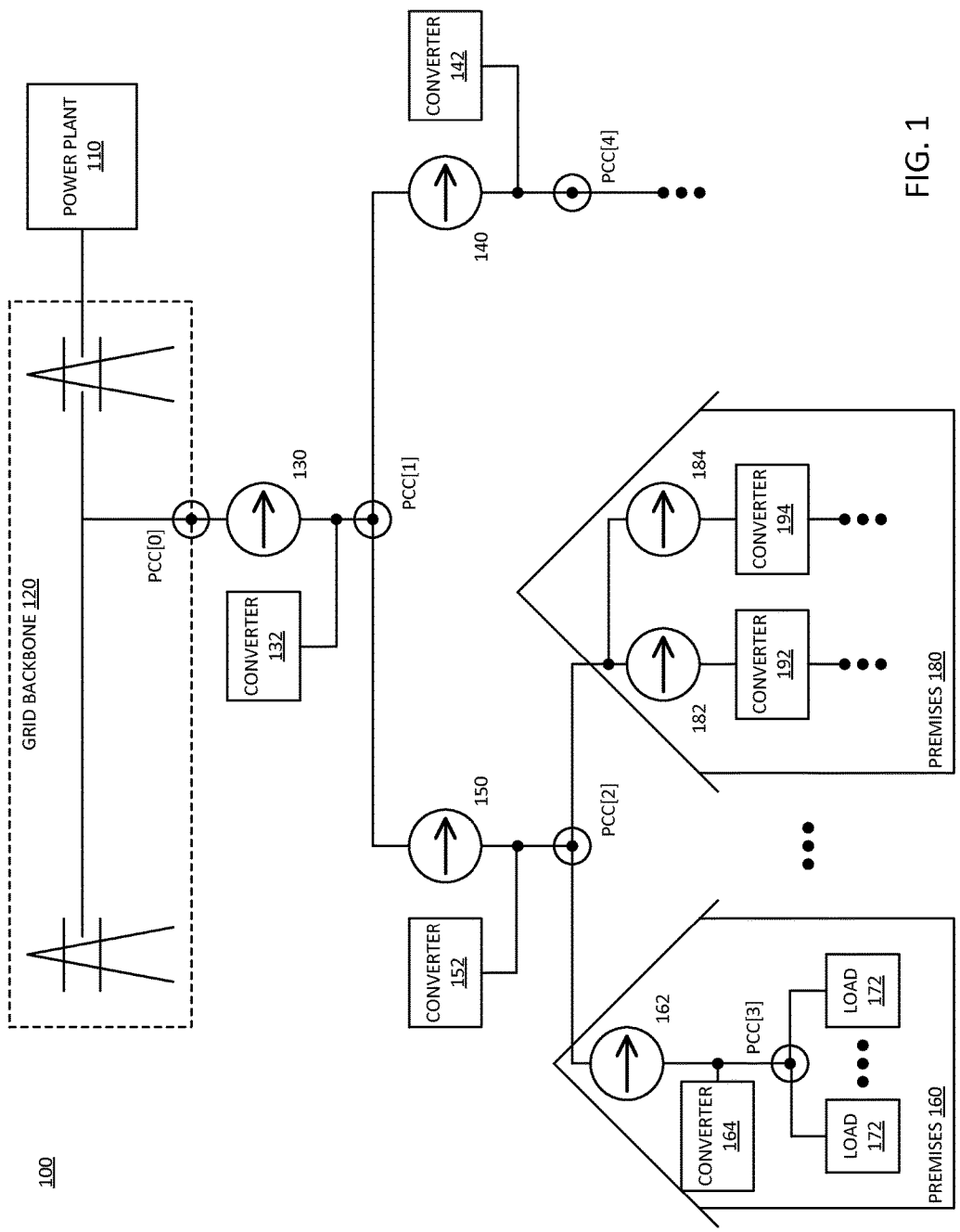
FIG. 1 is a block diagram of an embodiment of a system with tiered grid control.

Descriptions of certain details and implementations follow, including a description of the figures, which may depict some or all of the embodiments described below, as well as discussing other potential embodiments or implementations of the inventive concepts presented herein.

DETAILED DESCRIPTION

As described herein, a distributed control node enables total harmonic control. The control node measures current drawn by a load, including harmonics of the primary current. A metering device can generate an energy signature unique to the load including recording a complex current vector for the load in operation identifying the primary current with a real power component and a reactive power component, and identifying the harmonics with a real power component, a reactive power component, and an angular displacement relative to the primary current. The control node can control a noise contribution of the load due to the harmonics as seen at a point of common coupling to reduce noise introduced onto the grid network from the load.

As described herein, a control node enables distributed grid control. Multiple independent control nodes can be distributed throughout the grid. The control nodes can be hierarchically organized by connecting multiple control nodes to a common control node of the multiple control nodes. Each control node manages a point of common coupling (PCC) to the grid. A PCC is an interconnection point where multiple downstream loads and/or local power sources connect to the grid. For purposes herein, each control node couples to multiple loads and/or energy sources, and is thus associated with a PCC. Because each control node manages its interface or interconnection to the grid independently of any other control node, grid control intelligence can be distributed throughout the grid.

In one embodiment, each control node operates independently of other control nodes by monitoring and managing power generation and power demand at its PCC between a utility power grid and all devices downstream from the PCC or from the control node. The downstream devices can include energy sources such as solar and/or wind power generation, loads such as real and/or reactive power consumers (e.g., consumer nodes), as well as other PCCs or other control nodes. In one embodiment, each control node manages its interface or interconnection to the grid to maintain compliance with grid regulations. In one embodiment, the control node has any number of consumer nodes and any number of energy sources connected downstream. A consumer node can be a customer premises. In one embodiment, a customer premises can include multiple consumer nodes. In one embodiment, a consumer node can include multiple customer premises. In one embodiment, one control node manages multiple customer premises. Each control node can monitor power generation and power demand from downstream and ensure that demand on the grid is within accepted levels. The control node can provide grid control by adjusting the interface between the control node and the central grid management via the PCC to maintain compliance with grid regulations at the PCC.

In one embodiment, the control node adjusts downstream active power consumption. In one embodiment, the control node adjusts downstream reactive power consumption. In one embodiment, the control node adjusts downstream reactive power generation. In one embodiment, the control node adjusts downstream active power generation. In one embodiment, the control node controls energy at the PCC to manage the amount and types of power seen at the PCC from the perspective of the grid (i.e., from the grid side or as seen from central grid management or the grid infrastructure looking downstream through the PCC).

FIG. 1 is a block diagram of an embodiment of a system with tiered grid control. System 100 represents a power grid with tiered control. In one embodiment, system 100 includes power plant 110 and grid backbone 120, although in one embodiment, the tiered grid can be applied without connection to a central grid management and central grid power plant. System 100 represents a grid system in which power consumers are connected to each other and to power sources.

Power plant 110 represents a large-scale power plant that powers grid backbone 120. Power plant 110 is traditionally a hydroelectric dam generator, a nuclear power plant, a coal-powered generator plant, or a large wind farm. Recent large-scale solar farms have also been added. Grid backbone 120 includes towers, lines, transformers, substations, and other infrastructure to interconnect consumers to power plant 110. Grid backbone 120 includes grid infrastructure with high voltage power lines that transport power many miles. In practice, multiple power sources or power plants can be connected to the same grid backbone 120, but all are large scale and typically designed to generate as much power and service as many consumers as possible. Grid backbone 120 is traditionally designed for one-way distribution of power from power plant 110 to the consumers. Reference to "the grid" or a "utility grid" can refer to power plant 110 and the infrastructure of grid backbone 120.

In one embodiment, the grid can be thought of as a network that can be hierarchically separated into various different segments of the grid. Each grid segment can be controlled by a separate control node. In one embodiment, system 100 includes control nodes 130, 140, and 150. Each control node can manage a PCC or point of common coupling point where multiple loads and/or multiple sub-segments of the grid couple together. The PCCs can connect each segment and sub-segment to each other and/or to the grid.

It will be understood that a PCC can be both an electrical-equivalency point as well as or instead of a geographical connection. At the top of the hierarchy illustrated is PCC[0], which directly connects all downstream segments and portions to each other. PCC[0] can also connect all downstream point to grid backbone 120. Reference to "downstream" refers to devices or items that are farther away along the path of distribution. Thus, a residence or customer premises can be at one point on the distribution path of the grid, and a customer premises further along the distribution path is downstream. It will be understood that other grid segments with additional structure can be downstream from PCC[0] by virtue of being farther away from power plant 110 and thus farther down a distribution path as seen from central grid management.

System 100 can be referred to as a grid network, which may or may not include grid backbone 120 and power plant 110. The grid network can be hierarchical in that each PCC can aggregate multiple lower-level PCCs. Each PCC provides a connection point for all downstream devices. PCC[0] is at the top of the hierarchy of system 100. In one embodiment, multiple additional devices that are not shown can connect to PCC[0]. Such other devices not shown would be coupled in parallel with node 130 to PCC[0]. It will be understood that a lowest level of the grid network hierarchy is a control node at a customer premises, such as node 162 at customer premises 160, with PCC[3]. In one embodiment, there are one or more control nodes at a customer premises. In one embodiment, there are customer premises with no control nodes in system 100.

In system 100, two customer premises are illustrated, customer premises 160 and customer premises 180. The customer premises can also be referred to as consumers or consumer nodes. In one embodiment, customer premises can include homes, businesses, parks, loads, thermostats, pumps, vehicle charging stations, and/or other consumers of power. Each customer premises includes one or more loads or devices that rely on electrical power to operate. In one embodiment, customer premises 160 includes a single control node, 162. In one embodiment, customer premises 180 includes multiple control nodes, 182 and 184. There can be zero or more control nodes at a customer premises. There may be many control nodes at a single customer premises, depending on the design of the grid network and the number of loads and power sources at the customer premises. Other customer premises can be included in system 100. Zero or more of the customer premises can include energy generation, which is described in more detail below with respect to other drawings.

In one embodiment, each PCC is associated with a control node. The control node associated with the PCC manages or controls the electrical operation at that control node. For example, in one embodiment, in system 100, control node 130 is associated with PCC[1], and manages load demand and power generation downstream from PCC[1] as seen at PCC[1] from the grid side. Reference to looking from the grid side, or seeing from the grid side refers to what net power demand (either power needed or power produced) exists at that point. Seeing from the grid side can also refer to what phase offset or reactive power net exists at that point looking downstream from that point. The PCCs are aggregation points for generation and demand. A net power demand can be a difference in real and reactive power needed based on load demand against real and reactive power generated within the same segment or area of the PCC. Within the same segment can be referred to as being "within" a PCC, meaning within a downstream network connected to the PCC.

In one embodiment, each control node can independently control its own PCC. Thus, control node 130 controls PCC[1], control node 150 controls PCC[2], control node 140 controls PCC[4], and control node 162 controls PCC[3]. In one embodiment, independent control refers to the fact that each control node monitors and controls operation at its PCC to maintain the PCC as close to compliance with grid rules as possible. It may not always be possible for each control node to achieve full compliance. In one embodiment, the control nodes operate based on what neighboring control nodes output, such as what demand is seen looking toward the neighboring control node from the present control node. However, controlling operation by looking at the operation of another control node does not imply that the operation of each control node is dependent on each other. To the contrary, in one embodiment, each control node seeks to make sure that the node as a whole (everything connected "underneath" or downstream from it) complies with all requirements, regardless of the operation of others. Monitoring the performance or operation of neighboring control nodes or neighboring PCCs can be a consideration to determine how to operate, and whether to provide support upstream to the grid. In one embodiment, each control node is capable of receiving and responding to input from a central data center and/or from central grid management, but can operate with or without such input. Thus, each control node operates independently to control the net power operation as seen at its connection point.

In one embodiment, each control node includes a converter or inverter device and a metering device. In one embodiment, the converter is referred to as a power conversion device or simply conversion device. Reference to a converter can include one or multiple converters that can operate together to control operation and/or an interface at a PCC. In one embodiment, the control node and converter are separate devices. Thus, converter 132 can be part of control node 130, or simply connected to it at PCC[1]. Similarly, converter 142 is associated with control node 140, converter 152 is associated with control node 150, converter 164 is associated with control node 162, converter 192 is associated with control node 182, and converter 194 is associated with control node 184. Other network configurations are possible. It will be understood that the entirety of system 100 is not illustrated.

As mentioned, each customer premises can be or include a load. Customer premises 160 includes one or more loads 172. Each load 172 consumes power. Loads 172 can generate a demand for power that has a real power component to the demand and a reactive power component to the demand. Traditionally reactive power has been provided by the grid, with the exception of heavy equipment (e.g., capacitor banks and/or inductive motors) on-site at the customer premises. Loads 172 can be any form of load, such as lighting, computer equipment, entertainment devices, motors, HVAC (heating, ventilation, and air conditioning) equipment, household and kitchen appliances, or any other type of device that requires electricity to operate. Such devices can include rechargeable devices that are charged by plugging to a power outlet. Many of these devices generate reactive demand. That demand for reactive power will be seen at the PCC for the load, and can be seen upstream at other PCCs unless the demand is satisfied. In one embodiment, node 162 and converter 164 can provide reactive power for loads 172.

It will be understood that there are loads (not specifically shown) within customer premises 180. In one embodiment, converter 164 is coupled to PCC[3] where loads 172 are coupled. In one embodiment, converter 192 and converter 194 can be coupled between the loads and the PCC (PCC [2]). Converter 164 is coupled to PCC[3], and can be configured to operate to maintain certain performance parameters at PCC[3]. In one embodiment, in practice, converter 164 is coupled between PCC[3] and a meter of control node 162. The performance parameters can be associated with controlling real and reactive power at the PCC. In one embodiment, when a converter is coupled between the loads and the PCC, the converter is configured to maintain the particular load or loads coupled to it.

In one embodiment, each control node includes a metering device or energy meter built into or associated with or part of the control node. More details about embodiments of a metering device are provided below. The metering device measures energy usage at the PCC and can determine a net power demand or power generation from downstream. In one embodiment, the metering device enables monitoring the operation of the grid network at the PCC. In one embodiment, the metering device can measure energy signatures. Each converter can control the power usage at the PCC. In one embodiment, the converter controls the use of real and/or reactive power at the PCC.

In one embodiment, the grid hierarchy of system 100 can include one or more control nodes at a consumer premises, one or more control nodes within a neighborhood, one or more control nodes at a substation, or other hierarchy. Each control node in the hierarchy independently controls operation below it and reports upstream. Thus, each control node can independently manage compliance of the grid. If a segment of the grid network experiences a failure, a node higher up the hierarchy or higher upstream can attempt to adjust operation to prevent the failure from being seen or experienced outside the subnetwork below its PCC. Thus, a distributed grid can recover more quickly and efficiently from failures, and can reduce the risk that other segments of the grid will experience failure. For example, each distributed control node of the grid network can dynamically adjust reactive and real power consumption to maintain the connection at its PCC in compliance with connection requirements for the grid.

In one embodiment, each distributed control node of system 100 can control how the grid or grid network sees the segment of the grid via the associated PCC. Thus, control node 130 can control how the grid sees everything downstream from PCC[1], control node 150 can control how the grid or grid network sees everything downstream from PCC[3], and so on. The ability to control how the grid sees a segment of the grid via a PCC can allow more adaptive behavior within a segment of the grid network. For example, whereas current regulations would require certain inverters to drop offline because of the violation of certain conditions (overvoltage, overcurrent, islanding, and/or other condition(s)), controlling the connection of the PCC to the grid allows the grid to see the segment only through the PCC. Thus, each control node can control its connection to the grid network at the PCC, which can allow inverters to stay online longer to try to recover. Each inverter downstream from a PCC could in theory temporarily violate the passthrough requirements and/or overvoltage requirements for a period if collectively the devices connected to the PCC comply. In one embodiment, if the control node and converter at a PCC can cause support from other converters to be provided, or behavior changed at those converters to alter the net condition at the PCC, each inverter could similarly temporarily violate grid conditions while the control node maintains the PCC within compliance by changing operation of other devices within the PCC.

In one embodiment, distributed control or a grid or grid network includes pushing the point of common coupling out in the case of a disruption to the grid. Consider a problem at PCC[2] that would normally cause a failure of the grid at that point. In one embodiment, control nodes 150 and 130 can detect the condition. Control node 150 can attempt to change the grid condition at PCC[2] via operation of converter 152, such as by changing reactive power control. Control node 150 can also notify control node 130 of the condition. In one embodiment, control node 130 responds to the condition by signaling control node 140 to change its operation (e.g., via converter 142) to balance the net condition seen at PCC[1]. Control node 130 can also change the operation of converter 132 in response to the condition. Based on the operation of the control nodes, while PCC[2] may experience a failure condition for longer than is permissible by standard, the condition at PCC[1] can be made to comply with standards and regulations. Thus, PCC[2] and its equipment can stay up to attempt to correct the problem.

Thus, distribution of control nodes and distribution of control operations via those nodes can push the point of compliance as far towards the generator and/or grid backbone as possible to minimize the impact of a local disturbance. Thus, in one embodiment, each point in a hierarchy of grid network 100 is a separate point of control for compliance. In one embodiment, system 100 provides distributed redundant compliance up and down the hierarchy. In one embodiment, each control node attempts to operate within compliance. Such operation can normally ensure that each segment and sub-segment of the grid operates towards compliance, but if there is a failure at one level, it will not result in the grid going down if a higher level is able to correct for it. For example, if control node 130 can adjust operation in response to a failure at PCC[2], then control node 150 and everything downstream from it can remain online to attempt to correct the error condition. With such operation, a segment of the grid will not go down unless and until there is a last point of control and compliance that cannot compensate for the condition.

Figure 2:
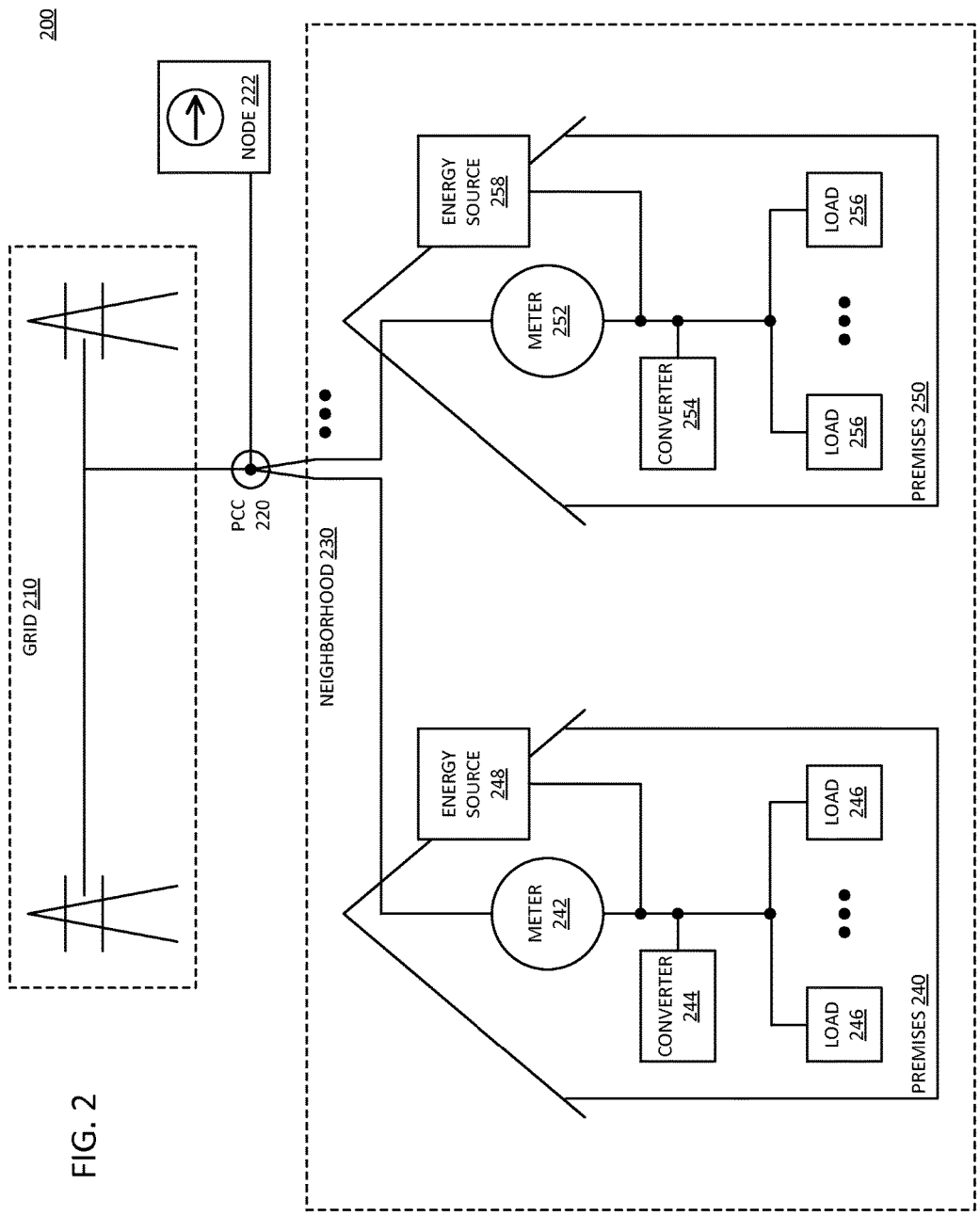
FIG. 2 is a block diagram of an embodiment of a system with monitoring and control at a point of common coupling within a neighborhood.

FIG. 2 is a block diagram of an embodiment of a system with monitoring and control at a point of common coupling within a neighborhood. System 200 includes a grid network, and can be one example of a grid network and/or system in accordance with an embodiment of system 100 of FIG. 1. Grid 210 represents the grid infrastructure, which can include a central generator or power plant and central grid control (not specifically shown).

Neighborhood 230 represents a segment or sub-segment of the grid network. Neighborhood 230 couples to grid 210 via PCC 220. PCC 220 has associated control node 222. Control node 222 can be a control node in accordance with any embodiment described herein, and can include processing logic to control the performance of the grid at PCC 220. In one embodiment, control node 222 includes a converter to control the operation of the PCC. In one embodiment, neighborhood is one level within a hierarchy of distributed control for system 200. Other levels of the hierarchy are not specifically shown. However, PCC 220 can couple to grid 210 via other PCC with distributed control nodes.

In one embodiment, neighborhood 230 can be any segment or sub-segment of the grid. Neighborhood 230 generally represents a collection or grouping of customer premises of the grid. The grouping can be any arbitrary grouping controlled by a control node. In one embodiment, the grouping can be, for example, all customer premises served by one transformer, one substation, or some other grouping. In one embodiment, neighborhood can be a large customer premises with multiple building and/or loads and power generation that couples to grid 210 via a common point (PCC 220). In such a scenario, there can be groupings within a single customer premises. In one embodiment, everything attached to a control meter or downstream from the same control meter and/or control node can be a separately controlled by other devices (loads) coupled to a different control meter. The control meters can control the connection of all their attached loads to the grid.

Consider customer premises 240. In one embodiment, customer premises 240 includes meter 242, converter 244, loads 246, and energy source 248. Loads 246 can include any type and number of loads. Converter 244 can be a converter in accordance with any embodiment described herein. Energy source 248 can include any type of local source of energy. Solar and wind generation are common local power sources. Such sources are typically referred to as "power" sources because they generate power that can be used locally and/or returned to the grid. However, traditional systems regulate the output of the sources in terms of power, or voltage times current (P=VI). Such traditional operation fails to consider that energy can be more flexibly used if not fixed to a specific current and/or voltage. Regulation of the power necessarily results in wasting power.

In contrast to traditional approaches, converter 244 can convert the energy generated by source 248 into any type of power needed by loads 246, whether real, reactive, or a mix. Furthermore, converter 244 can return energy back to grid 210 via PCC 220 as real and/or reactive power. Thus, source 248 is more properly referred to as an "energy" source in the context of system 200, seeing that it transfers the energy without regulating the output to specific voltages or currents. More details on such a converter are provided below.

Just as power is limiting in the sense of generation, power metering can be limiting in the sense of monitoring and metering the operation of customer premises 240. There are multiple ways to perform measurement of energy. In general, it will be assumed that it is possible to accurately measure energy without going into detail about the ways to perform energy measurement. Thus, meter 242 can perform energy measurement. In one embodiment, meter 242 is a control meter that measures energy instead of Watt-hours (W-h). In one embodiment, the operation of meter 242 can be used be controlling energy consumption and energy transfer in system 200. In one embodiment, meter 242 can track energy signatures of loads 246 to determine how to control a point of common coupling. While not specifically shown and labeled as such, it will be understood that the combination of meter 242 and converter 244 can provide a control node at customer premises 240. Thus, the connection point of loads 246 to converter 244 and meter 246 can be a PCC. The PCC of customer premises 240 includes the generation of power via energy source 248 in addition to the consumption of power or power demand from loads 246.

In one embodiment, neighborhood 230 includes an additional customer premises 250 that similarly includes meter 252, converter 254, loads 256, and energy source 258. There is no requirement that the amount and type of loads 256 and/or energy source 258 be the same as loads 246 or energy source 248. Rather, each customer premises can have any number of loads and/or power generation. In one embodiment, neighborhood 230 can have any number of customer premises with energy sources. In one embodiment, neighborhood 230 can include one or more customer premises that do not have energy sources. In one embodiment, a customer premises without an energy source can still be fitted with a control node, such as a meter and a power converter, in accordance with more details below.

In meters within neighborhood 230 (e.g., meter 242 and meter 252, and others) can talk to each other to share metering and/or control information. In one embodiment, such sharing of information between meters or between control nodes can enable the meters and/or control nodes to control how the point of common coupling (PCC) for the neighborhood (PCC 220) moves in the network or how control via different PCCs occurs in the network or grid as a whole. Any medium can be used for communication between the metering nodes. The ability to share information with each other and/or with a central data center can enable the network or grid to adaptively operate based on what is happening on the grid. Thus, in one embodiment, system 200 enables distributed realtime data monitoring and sharing. Other devices that receive the data can provide reactive power compensation to give voltage support and/or change real power operation within their control to change net operation at a PCC.

As mentioned above, in one embodiment, one or more customer premises coupled to a PCC includes an energy source, such as a solar system. As illustrated, both customer premises 240 and customer premises 250 include respective energy sources 248 and 258. Each customer premises within neighborhood 230 that includes an energy source can include a respective power converter 246 and 256 to control distribution of the energy from the source. In one embodiment, each converter enables the customer premises to provide real and/or reactive power from the energy source to the local loads (such as 246 and 256). In one embodiment, each converter can provide real and/or reactive power from the energy source back to the grid (e.g., to grid 210 via PCC 220 at which neighborhood 230 connects to the grid). In one embodiment, the power provided by one converter at one consumer premises can affect the power usage as seen at the PCC. For example, power generated for local consumption and/or for return to the grid by converter 244 at customer premises 240 can change net power usage seen at PCC 220 by meter 252 and converter 254. In one embodiment, each converter can support the power use of a neighboring customer premises within the neighborhood. Thus, each customer premises 240 and 250 can operate to first be self-sufficient, and extend out to neighborhood 230, and then further up the grid hierarchy to other neighborhoods and/or to grid 210 as a whole.

As power can be provided up the hierarchy of system 200, system 200 can also achieve isolation at each different level of hierarchy or organization of the grid network. In one embodiment, each meter 242 and 252 monitors local operation within the segment of the grid downstream from the device itself and to local operation from neighboring meters. For example, meters within neighborhood 230 or within each hierarchy level of the grid can share or distribute monitoring information, which can include power demand and power generation information. Thus, each meter can listen to local operation and be aware of what is happening outside of its local area. In one embodiment, such operation enables system 200 to move the PCC based on what is happening on the grid as a whole. Similar to what is mentioned above, if something within neighborhood 230 went down or experienced an error condition, neighborhood 230 can reroute isolation to shift the reactions of the grid. Neighborhood 230 can reroute isolations via the individual operations of control nodes within the neighborhood, and via control node 222. Such operation will allow the grid to stay up longer. In one embodiment, neighborhood 230 can effectively control the reactive needs within its subgroup of the grid while possibly only taking real power from the grid as a whole. Such operation is possible via aggregation of information at PCC 220 and other PCCs within the grid network hierarchy. Thus, in one embodiment, neighborhood 230 itself responds to grid events at PCC 220 without needing or waiting for central dispatch or grid management operation of grid 210. In one embodiment, system 200 can dynamically redefine the scope of the PCC depending on the event(s) of the grid.

Figure 3:
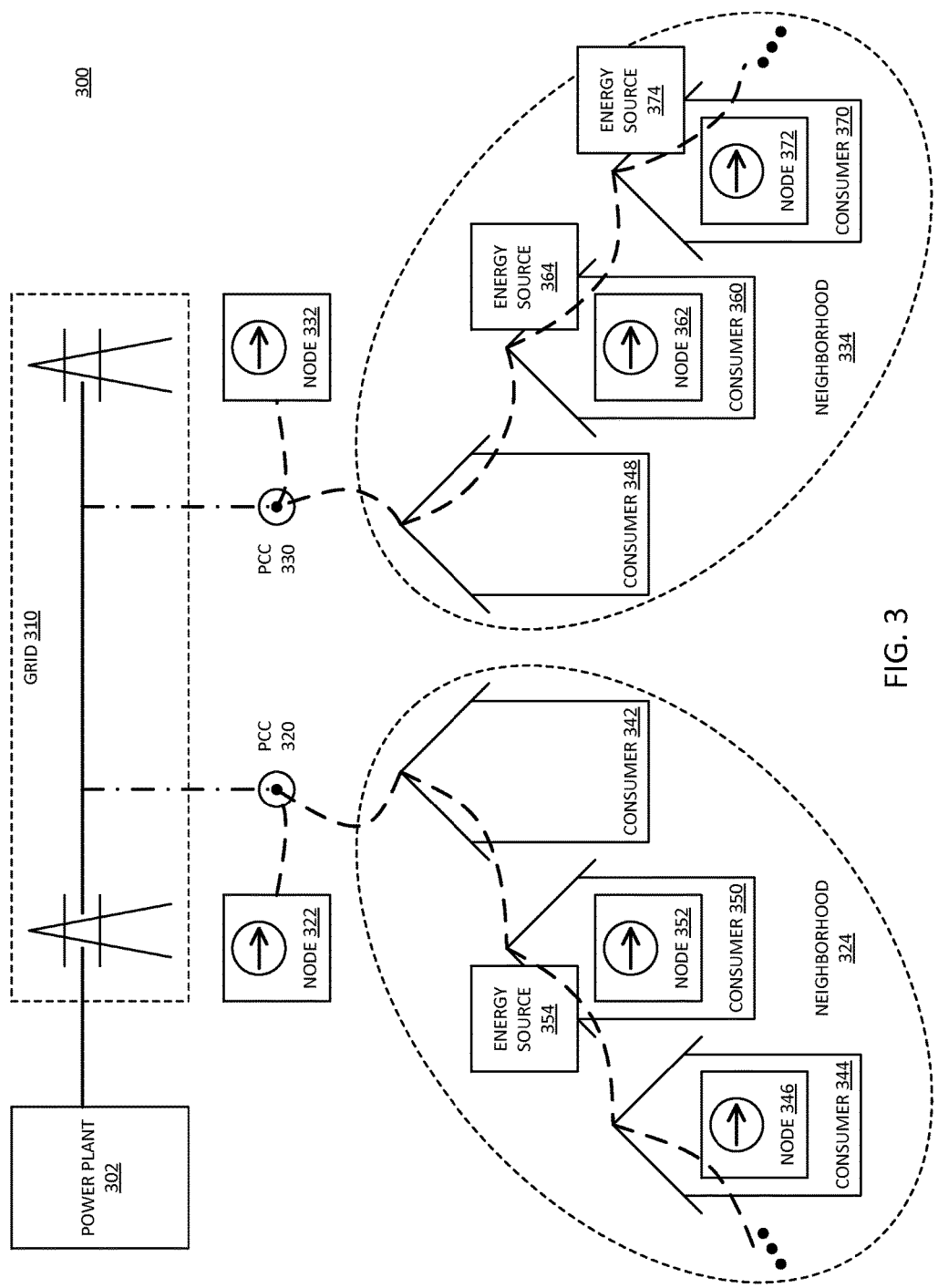
FIG. 3 is a block diagram of an embodiment of a system with monitoring and control at a point of common coupling among neighborhoods.

FIG. 3 is a block diagram of an embodiment of a system with monitoring and control at a point of common coupling among neighborhoods. System 300 includes a grid network, and can be one example of a grid network and/or system in accordance with an embodiment of system 100 of FIG. 1 and/or system 200 of FIG. 2. Grid 310 represents the grid infrastructure, which can include a central generator or power plant 302, and central grid control (not specifically shown). System 300 illustrates two neighborhoods, 324 and 334, but it will be understood that any number of neighborhoods can be included in system 300. As illustrated, neighborhood 324 is upstream from neighborhood 334, given that neighborhood 324 is closer to power plant 302 than neighborhood 334.

Each of neighborhoods 324 and 334 represent any segment or sub-segment of the grid in accordance with any embodiment of a neighborhood described herein. Neighborhood 324 couples to grid 310 via PCC 320, which has associated distributed control node 322. Neighborhood 334 couples to grid 310 via PCC 330, which has associated distributed control node 332. In one embodiment, neighborhoods 324 and 334 are the same level of hierarchy within system 300. In one embodiment, neighborhoods 324 and 334 are different levels of hierarchy; for example, either PCC 320 and/or PCC 330 can couple to grid 310 via other PCCs, and not necessarily the same number of PCCs. In one embodiment where one neighborhood provides support (e.g., voltage support) to the other, the neighborhoods will have sufficient geographic or electrical proximity to allow control at one PCC to affect the performance at the other PCC as seen from grid 310.

Control nodes 322 and 332 can be control nodes in accordance with any embodiment of a control node described herein. In one embodiment, control nodes 322 and 332 first seek compliance at their respective PCCs, 320 and 330, and then seek to support compliance of grid 310 as a whole. In one embodiment, each control node can be thought of as a gateway device. The gateway device can control the performance, power factor, load control, and/or harmonic distortion at its associated PCC. Each control node has an associated power converter to control the power output to upstream and the power consumption downstream.

In one embodiment, control nodes 322 and 332 are position-aware within the grid network. In one embodiment, each control node can know where it is in the hierarchy of the grid network. Furthermore, in one embodiment, each control node can know where it is relative to the grid from the power plant. For example, control node 322 can know where it is in the hierarchy of system 300, and can know that it is upstream from control node 332. In one embodiment, each node for each neighborhood first tries to manage the power consumption of its local neighborhood, and can also support the grid depending on conditions of the grid (e.g., what is happening at other neighborhoods). The conditions of the grid can include any performance parameter, such as voltage level, power factor, harmonic distortion, and/or other electrical parameter. Position awareness can enable the control node to factor conditions related to upstream operation of the grid to enable the control node to provide more specific support. In one embodiment, each control node can be enabled to provide support to the higher level PCC based on what is happening within the grid or the grid conditions. Thus, for example, neighborhood 334 could provide power to grid 310 if neighboring neighborhood 324 is not complying with grid requirements. In this way, each control node can seek to ensure local compliance, and also provide support to achieve overall compliance.

Neighborhood 324 includes multiple power consumers 342, 344, 350, and others not illustrated. Consumers 342, 344, and 350 can be any type of power consumer described herein. In one embodiment, a single consumer includes multiple customer premises. In one embodiment, one customer premises includes multiple consumers. In one embodiment, there is a one-to-one relationship between consumers and customer premises. It will be observed that consumers 342 and 344 do not have local energy sources or local power generation. Consumer 350 includes energy source 354, which is local power generation. In one embodiment, consumer 350 includes control node 352 to manage the use of locally generated energy locally, and to manage the output of energy back to neighborhood 324 and ultimately to grid 310.

Neighborhood 334 is also illustrated to include multiple consumers 348, 360, 370, and others. It will be understood that a neighborhood can include any number of consumers, whether fewer than what is shown or many time as many as shown. In one embodiment, a neighborhood can refer to a segment of power consumers connected to the grid that has independent control of power consumption and return of power back to the grid. As illustrated in neighborhood 334, consumer 348 does not include local power generation, which consumer 360 includes local energy source 364 and consumer 370 includes local energy source 374. Consumers 360 and 370 also include respective control nodes 362 and 372.

It will be understood that neighborhoods 324 and 334 can include any number of consumers that do not include local power generation and any number of consumers that do include local power generation. Thus, a neighborhood can include any mixture of consumers that do and do not include local power generation. In one embodiment, a consumer can include a control node without having local power generation, such as consumer 344 including control node 346. In such a configuration, local control node 346 can control the reactive power consumption of consumer 344 even without a local energy source. More details are provided below.

In one embodiment, a control node is not associated with a PCC and/or is not a gateway device if it does not include disconnection management. For example, in one embodiment, neighborhood 324 has only node 322 associated with PCC 320, and there are no sub-PCCs within neighborhood 324. In such an implementation, node 322 can be considered a gateway device. In one embodiment, disconnection management executes only at a gateway device. The gateway device presents all downstream devices to the grid. In one embodiment, neighborhood 324 can have no sub-PCCs, and neighborhood 334 can have sub-PCCs (or vice versa). Even with sub-PCCs, node 332 can operate as a gateway device for neighborhood 334, and other sub-PCCs would be managed by sub-gateway devices within the neighborhood, in accordance with whatever hierarchical network structure exists in system 300.

Position awareness within the grid can be referred to as string position awareness, referring to a circumstance where a device knows its position in a string of devices from the grid. Position awareness can enhance the utility of a microinverter or other power converter, by allowing it to provide support outside its own area. For example, microinverters or other power converters associated with nodes 322 and 332 may be better able to provide grid support with position awareness. In one embodiment, bulk inverters can use position awareness to adjust their operation for an overall desired output. Bulk inverters refer to inverters connected together in a star or cascade arrangement, or other network configuration. Bulk inverters refer to a group of multiple inverters that operate in connection to provide control over a consumer and/or power generation. Thus, any instance of a control node can include one or more power converters. In one embodiment, the head of a string of devices is a gateway device and controls the coupling for the entire string, such as node 322 as the head of a string of devices in neighborhood 324, and node 332 as the head of a string of devices in neighborhood 334. Such a head of the string could represent the entire string to the grid.

Figure 4:
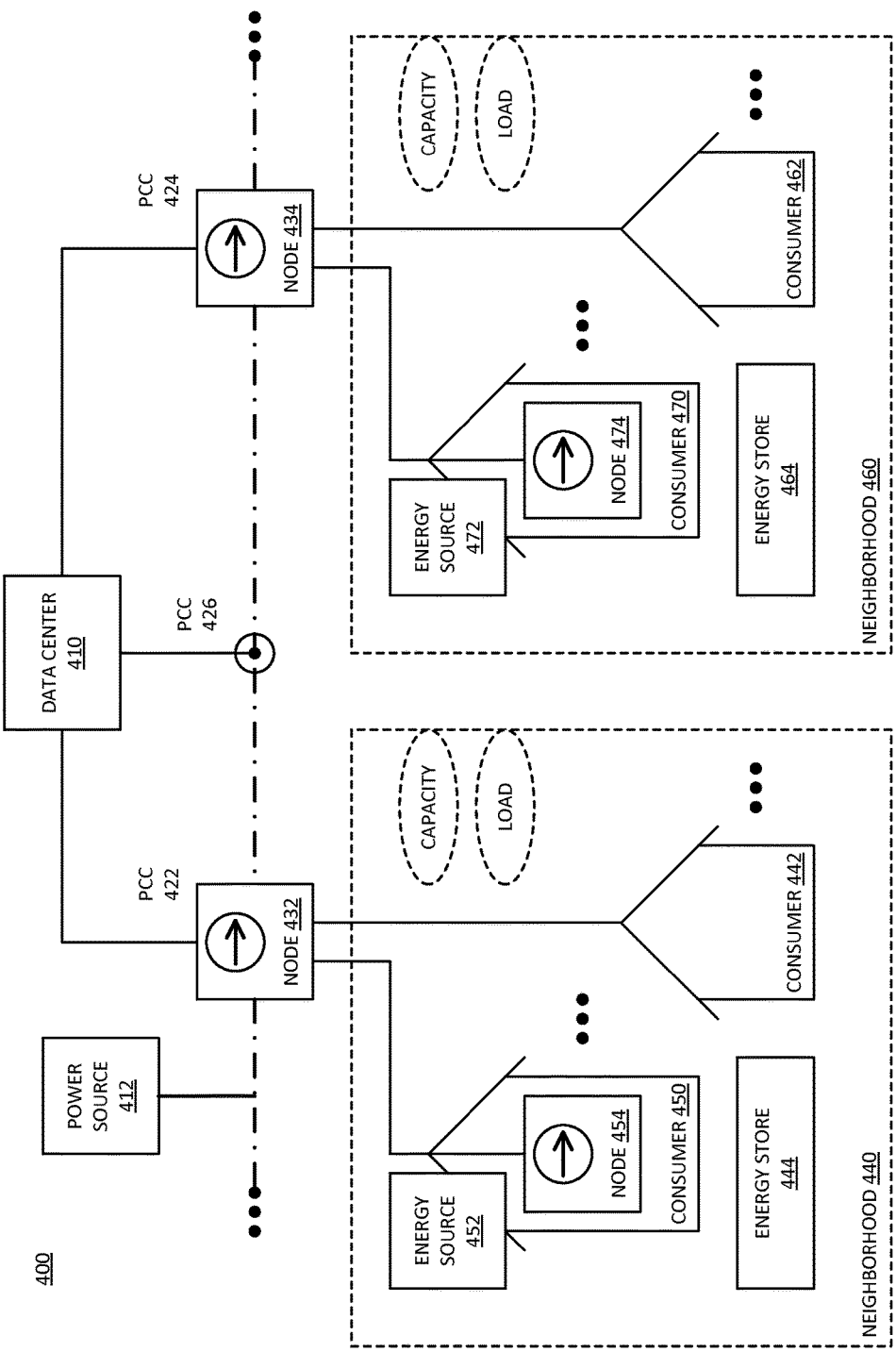
FIG. 4 is a block diagram of an embodiment of a distributed grid system.

FIG. 4 is a block diagram of an embodiment of a distributed grid system. System 400 includes a grid network, and can be one example of a grid network and/or system in accordance with an embodiment of system 100 of FIG. 1 and/or system 200 of FIG. 2 and/or system 300 of FIG. 3. System 400 may be only a segment or portion of one of the previously-described systems. In one embodiment, system 400 can be an alternative to one of the previously-described systems. In one embodiment, system 400 is a grid network that operates without central grid management. In one embodiment, system 400 is a grid network that operates without a central power plant or other large-scale power source that provides power to the entire grid. In one embodiment, system 400 is a virtual grid and/or a modular grid. In one embodiment, system 400 is a virtual grid that can still connect to a traditional grid as an independent segment. In one embodiment, system 400 can connect to other virtual grid and/or modular grid segments.

System 400 illustrates neighborhood 440 and neighborhood 460, which can be neighborhoods in accordance with any embodiment described herein. More specifically, neighborhoods 440 and 460 can have any number of consumers that do and do not include local energy sources, and can include any number of consumers that do and do not include local control nodes. Neighborhood 440 couples to control node 432. Similarly, neighborhood couples to control node 434. Control odes 432 and 434 can represent control nodes in accordance with any embodiment described herein. Control nodes 432 and 434 are coupled to each other by some infrastructure, which may be the same as a grid infrastructure, or may simply be a power line having sufficient capacity to enable the control nodes to couple to each other and provide electrical support to each other.

In one embodiment, the control nodes are the PCCs. Thus, control node 432 can be PCC 422 and control node 434 can be PCC 424. In one embodiment, control nodes 432 and 434 are coupled to a central data center 410. Data center 410 can aggregate information about the operation of multiple distributed nodes within the grid network of system 400. Data center 410 is central in that control nodes 432 and 434 provide data to and receive information from the data center. In one embodiment, data center 410 includes processing and analysis engines that can determine what operation each node should take in response to grid conditions. In one embodiment, data center 410 is similar to central grid management, but it can be simpler. Whereas central grid management typically controls interconnection or interface of a central power plant to the grid and potentially the operation of a substation, data center can provide information to distributed nodes. The distributed nodes can independently operate within their segment of the grid network to respond to grid conditions. In one embodiment, data center 410 provides dispatch information to the distributed control nodes.

In one embodiment, neighborhood 440 includes one or more consumers 442 that do not have local energy sources. In one embodiment, neighborhood 440 includes one or more consumers 450 that include local energy source 452 and local control node 454. The energy source and local control node can be in accordance with any embodiment described herein. In general, neighborhood 440 has a total load that represents the power demand within the neighborhood, and a total capacity that represents the power generation within the neighborhood. The load minus the capacity can represent the net power demand, which can be positive or negative. A negative power demand can indicate that neighborhood 440 generates more energy than will be consumed by its local consumers. It will be understood that power demand fluctuates throughout the day and year as consumers use and generate different amounts of power. Control node 432 can continuously monitor the net power demand for its associated neighborhood 440.

In one embodiment, neighborhood 460 includes one or more consumers 462 that do not have local energy sources, and one or more consumers 470 that include local energy source 472 and local control node 474. The description of neighborhood 440 can apply equally well to neighborhood 460. Neighborhood 460 also has a total load that represents the power demand within the neighborhood, and a total capacity that represents the power generation within the neighborhood, which can be completely different from those of neighborhood 440.

In one embodiment, either or both of the neighborhoods can include local energy storage. For example, neighborhood 440 is illustrated with energy store 444, and neighborhood 460 is illustrated with energy store 464. In one embodiment, at least one neighborhood does not include energy storage. In one embodiment, all neighborhoods include energy storage. Energy store 444 and 464 represent any type of energy storage that can exist within the neighborhoods. Energy store 444 and 464 can represent a sum of all local energy storage resources of individual consumers within the neighborhood. In one embodiment, one or more neighborhood includes a neighborhood energy store. The neighborhood energy store can be in addition to or as an alternative to local energy storage at the individual consumers.

In one embodiment, energy store 444 and 464 can include battery resources, which can include any type of battery. A battery is a device that stores energy via chemical and/or electrical means which can later be accessed. However, energy storage is not limited to batteries. For example, in one embodiment, an energy store, either local to one consumer or shared among multiple consumers or the entire neighborhood, includes a mechanism to perform work to convert active energy into potential energy, which can then later be recovered via conversion back from potential energy to active energy. For example, consider a water storage system as an energy store. When excess capacity exists within a consume and/or within the neighborhood, the system can trigger a pump to operate on the excess power to pump water "uphill," essentially in any manner to pump against gravity. Recovery of the energy can include allowing the water to flow back downhill with gravity to turn a generator or mini-generator to generate energy. Another alternative can be to use energy to compress air, and then run a generator with the air as it is decompressed. It will be understood that other examples could also be used where energy storage is not limited to traditional battery resources.

In one embodiment, system 400 is a segment of a grid that includes distributed control. In such a scenario, each node within a grid network hierarchy can manage its own conditions at its PCC for compliance with standards or expectations of performance. In one embodiment, each node can also provide electrical support to neighboring segments or PCCs as it sees conditions at the grid network side (upstream from its segment) fall in performance. In one embodiment, each node can provide electrical support to neighboring segments or PCCs in response to receiving information from data center 410, from other nodes, and/or dispatch or control information from a central management.

In one embodiment, system 400 includes one or more power sources 412 coupled to provide power to the grid network. One or more power sources 412 can be in addition to local energy sources at consumers. In one embodiment, no single power source 412 has sufficient capacity to meet consumer power demands. For example, rather than an industrial or utility-scale power plant, one or more power sources 412 can be included local to a segment of the grid. The segment can be within a neighborhood or shared among multiple neighborhoods. Power sources 412 can include smaller scale generators that would be smaller than a full utility implementation, but larger than what would typically be used at a consumer or customer premises. Neighborhood-based power sources 412 can be directly associated with a control node (for example, power source 412 can be coupled to and controlled by control node 432). The control node can manage the output of the power source.

Without a large-scale power plant, and instead with smaller-scale energy generation (e.g., a neighborhood generator, a neighborhood solar installation, a small-scale hydro-electric generator, or other power sources), a grid network can be installed with minimal infrastructure compared to today's grids. Such a modular grid network can enable the building out of a grid based on current needs and then interconnecting to other independent grid network segments. Each segment can continue to operate independently, but can then benefit from being able to better distribute power generation and power demand based on availability to and from neighboring segments. Each interface or interconnection can include one or more control nodes, which can include one or more power converters each, to control the use of power and the presentation of power upstream. Thus, a local grid network can be built, and then later coupled with another local grid network as another layer of grid network hierarchy is added to interface the two independent segments.

In one embodiment, consider that neighborhood 440 has multiple customer premises 450 that have local energy sources 452. Traditionally grids are designed and built to be unidirectional, as they are designed to deliver power from a single large-scale power plant to the consumers. With power generation at customer premises 450, neighborhood 440 and up through a connected grid can effectively become a bidirectional system where power can be delivered from the central power source to the consumers, but then the consumers can also generate excess capacity that is placed back out onto the grid. If the power generation for the neighborhood and neighboring neighborhoods exceeds instant power demand, the generated power will be pushed back up the grid toward to the power plant. Such a condition can challenge the grid infrastructure.

Grid operators (e.g., utilities) typically set limits on how much local power generation can be coupled to the grid, to reduce the risk of a scenario where significant amounts of energy get pushed back up the grid to the power plant. Such a limit is often referred to as saturation, where there is a threshold amount of capacity that is permitted to be attached to the grid. If the saturation threshold has been reached, a consumer typically has to pay for additional grid infrastructure (additional equipment) that will enable the utility to selectively disconnect the consumer's power generation from the grid. Such scenarios also put consumers and utilities at odds with each other, as the consumer does not get to see the same levels of cost reduction because the power generation cannot be used by the grid, and so the grid operator does not pay the consumer for it.

In one embodiment, system 400 can provide an alternative mechanism to deal with grid saturation. In one embodiment, the distributed control in system 400 can provide dynamic control over power demand and power generation as seen at a PCC and/or as seen at a customer premises or anywhere downstream from a control node. In one embodiment, the control node includes a power converter to control real and reactive power demand and real and reactive power generation. More specifically, the control node can adjust operation to affect a real power component of power as seen downstream from the PCC, and a real power component as seen upstream from the PCC. The control node can adjust operation to affect a reactive power component of power as seen downstream from the PCC, and a reactive power component as seen upstream from the PCC. In one embodiment, the control node can include one or more inverters or one or more microinverters as power converters to apply control over demand and generation.

In one embodiment, node 432 includes a grid connector to connect upstream in a grid network. The grid connector can include known connectors and high voltage and low voltage signal lines. Node 432 is or connects to a PCC (PCC 422) for the grid network segment of neighborhood 440. Node 432 includes control logic, such as a controller or microprocessor or other logic to determine how to operate. In one embodiment, node 432 determines that a saturation threshold has been reached within neighborhood 440. Such a determination can be a result of dynamic monitoring to determine that power generation exceeds power demand. Such a determination can be in response to a notification from a data center or central grid management. Such a determination can be in response to data from other distributed control nodes. In one embodiment, each energy source 452 in neighborhood 440 is associated with a control node 454 within the neighborhood. In one embodiment, each control node 454 is configured with information about the capacity of its associated energy source 452. In one embodiment, each local control node 454 registers with control node 432, which can allow node 432 to know a total capacity for neighborhood 440.

In one embodiment, node 432 knows a total peak real power demand for neighborhood 440, such as by configuration and/or dynamic identification via communication with meters or other equipment distributed at the consumers. In one embodiment, there is a threshold percentage of the total peak real power demand that identifies a value of real power, and when real power generation capacity exceeds the value, neighborhood is considered to be in saturation. In response to the saturation condition, in one embodiment, node 432 dynamically adjusts operation of power converter(s) to adjust an interface between neighborhood 440 and the grid. In one embodiment, node 432 adjusts a ratio of real power to reactive power for neighborhood 440 as seen from upstream from PCC 422 (e.g., as seen from PCC 424 and/or as seen from central grid management or another part of the grid network).

In one embodiment, node 432 receives dispatch information from data center 410 or central grid management indicating a level of grid saturation for neighborhood 440. In one embodiment, node 432 receives information from downstream such as a via meters and/or node(s) 454 indicating levels of grid saturation downstream from PCC 422. In one embodiment, node 432 adjusts at least an amount of real power generation with neighborhood 440, such as by communicating to downstream control nodes 454 to adjust their real power output. In one embodiment, node 432 can communicate downstream to cause control nodes 454 to change a ratio of reactive to real power output upstream. In one embodiment, node 432 adjusts real and/or reactive power generation and/or demand at PCC 422 to adjust the electrical conditions as seen upstream from PCC 422. In one embodiment, node 432 and/or node(s) 454 adjust operation to divert at least a portion of real and/or reactive power to energy store 444.

In one embodiment, system 400 represents a virtual grid or virtual grid segment. As a virtual grid, system 400 does not require the traditional infrastructure, central power plant, or central grid management common to traditional utility grids. System 400 can be a virtual grid in that in one embodiment, each neighborhood 440, 460 can generate local power and satisfy local demand independent of other areas. Despite being independent, neighborhoods 440 and 460 can be coupled to each other to enable each neighborhood to provide support to and/or receive support from the other neighborhood. The interconnection between neighborhoods 440 and 460 can be minimal compared to requiring significant infrastructure in a traditional grid.

In one embodiment, nodes 432 and 434 are coupled together as a PCC and/or can be considered to couple together via another PCC. In one embodiment, PCC 422 and PCC 424 will couple together via PCC 426, which will have a separate control node (not explicitly shown). PCC 426 can be considered higher up a grid network hierarchy from PCCs 422 and 424. PCC 426 can be managed from the perspective of a control node seeking to control operation of all downstream connections and managing upstream connections. In one embodiment, nodes 432 and 434 are coupled together not via PCC 426, but are at a highest level of hierarchy of the grid network and can communicate and provide grid support to each other. In one embodiment, whatever power generation is available within neighborhood 440, even if sufficient to meet its own peak power demand, is not sufficient to meet peak power demands of neighborhoods 440 and 460. The same could be true with respect to power generation of neighborhood 460.

Control nodes 432 and 434 independently manage their local power sources. From the perspective of each neighborhood, the neighborhood as a whole appears to have a "power source" in that power generation resources within the neighborhood can generate power. Nodes 432 and 434 control distribution of the locally generated power, each from its respective neighborhood. It will be understood that while referred to as neighborhoods, the same principles can apply to two distinct consumers, each having local power generation and each having a control node. Coupling the two consumers together can generate a virtual grid. Thus, the virtual grid can operate at the level of individual consumers or large groups of consumer and neighborhoods. In one embodiment, each control node operates based on its local power demand and local power generation, as well as based on monitoring and/or communication regarding power demand and power generation from the coupled neighborhood or consumer.

In one embodiment, one or more virtual grid network segments can be connected to a utility power grid. In one embodiment, one or more additional consumers or neighborhoods can be coupled together as a virtual grid with consumers or neighborhoods that are coupled together. In one embodiment, each control node includes communication and control logic to discover the network structure. In one embodiment, one control node within system 400 can operate as a master node, such as node 432. A master control node can have one or more slave nodes coupled to it. For example, node 434 could be a slave node to node 432. In a master-slave scenario, control node 432 can control the operation of node 434 to cause node 434 to control its local or downstream resources in accordance with one or more commands or requests generated by master node 432. Thus, node 432 can provide control over its local segment and one or more sub-segments connected as slave segments. In such a scenario, node 432 can be responsible to ensure compliance of each grid network segment with regulations or requirements. Node 432 can thus control distribution of power and power demand throughout system 400.

In one embodiment, a grid network of system 400 can be modularly adjusted in size. Seeing that each neighborhood 440, 460, . . . , in the grid network can independently operate, neighborhoods, consumers, and/or other segments or groupings of the network, can be added and/or removed from the grid network dynamically. For example, in a developing area, a first neighborhood 440 can be built with its power generation to attempt to satisfy demand for its consumers. In one embodiment, a power source 412 can be connected, but it insufficient in itself to satisfy peak demand for neighborhood 440, but can provide demand when local energy sources are insufficient to meet demand. In one embodiment, neighborhood 460 can be further developed, and then connected to neighborhood 440 (e.g., coupling nodes 432 and 434). Other neighborhoods could similarly be added, via a higher level PCC and control node, and/or by coupling neighborhood control nodes. In one embodiment, power source 412 can then service both neighborhoods by distribution via the control nodes, and the neighborhoods would generally rely on local power generation, but can receive power from power source 412 as a support power source. In one embodiment, power is used from source 412 when local power generation including converting power from energy stores does not satisfy demand. In one embodiment, one control node supports the other control node by adjusting reactive power output to change voltages and power flow at the interconnection of the neighborhoods. Changing the reactive power or the phase offset of power generated and/or consumed locally at the neighborhood can cause an electrical condition that will cause power to flow a different direction, depending on whether the other neighborhood needs to receive additional power or offload it.

Figure 5:
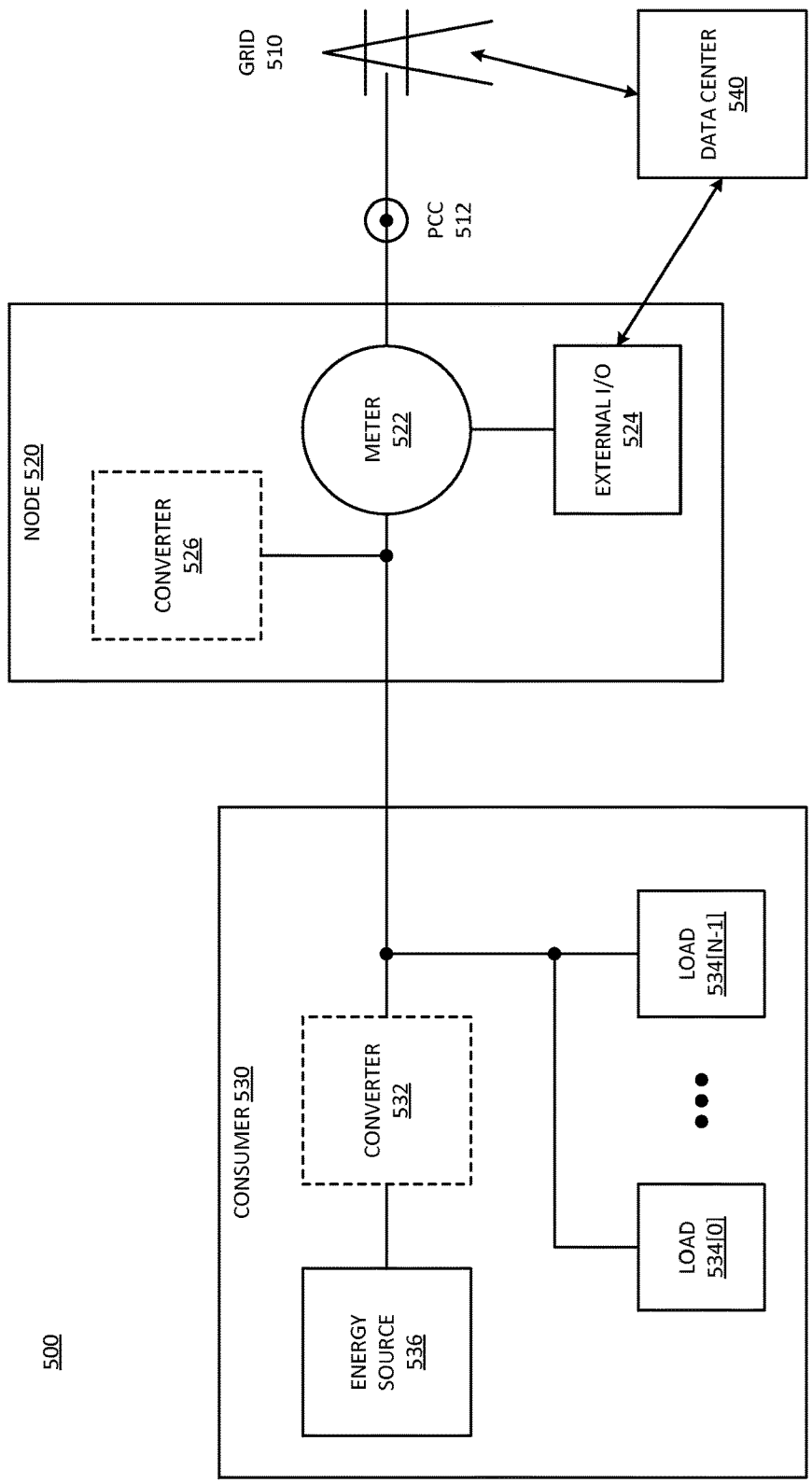
FIG. 5 is a block diagram of an embodiment of a system with a consumer premises that includes an energy source controlled by a converter based on monitoring by a meter.

FIG. 5 is a block diagram of an embodiment of a system with a consumer premises that includes an energy source controlled by a converter based on monitoring by a meter. System 500 represents elements of a grid network. System 500 provides one example of elements of an embodiment of a grid network that can be in accordance with one or more of system 100, system 200, system 300, and/or system 400. System 500 includes meter 522, which represents a power meter that can be in accordance with an embodiment of FIG. 10.

In one embodiment, system 500 includes consumer 530, which is coupled to node 520. Node 520 includes hardware to couple to grid 510, which can be a utility power grid, a virtual grid, or any embodiment of a grid network. Node 520 includes meter 522, which represents a power metering device, which monitors power downstream (e.g., net power demand from consumer 530 and potentially other consumers). In one embodiment, node 520 includes external I/O (input/output) 524 to connect to data center 540. Data center 540 represents a central repository of information for grid 510. In one embodiment, data center 540 provides dispatch information to meter 522/node 520. Node 520 represents a control node, and can be one example of a control node in accordance with any embodiment described herein.

Meter 522 enables node 520 to monitor power demand and power generation. One or more energy sources, such as energy source 536, can generate power. Consumer 530 includes loads 540[0:(N−1)]. Loads 540 can be any type of loads. In one embodiment, consumer 530 includes converter 532, which represents a power converter, and can be, for example, a microinverter. In one embodiment, consumer 530 does not include converter 532. Meter 522 includes a controller or processor to control its operation. In one embodiment, meter 522 monitors power demand, and controls one or more converters, 526 and/or 532.

Converter 526 represents a local power converter at node 520. In one embodiment, each control node includes a meter 522 and a power converter 526. In one embodiment, each node is virtual and includes a meter 522 coupled to a converter 532. In one embodiment, node 520 is virtual and represents an abstraction of the control provided by meter 522 and power converter. In one embodiment, converter 532 is not necessarily within a customer premises, but controls power distribution for a customer premises. Converter 526 can be a power converter for PCC 512. Controlling power distribution can refer to distributing power downstream to a consumer and distributing upstream power generated from a customer premises. In one embodiment, meter 522 is responsible for representing compliance with grid regulations at PCC 512. In one embodiment, meter 522 determines that an adjustment is needed to a ratio of real to reactive power to keep compliance at PCC 512, due to changing conditions of grid 510. In one embodiment, meter 522 provides commands or requests to converter 526 and/or converter 532 to adjust operation. Converter 532 can adjust operation with respect to consumer 530. Converter 526 can adjust operation with respect to multiple consumers, of which consumer 530 is one.

In one embodiment, meter 522 can determine that power factor as seen at PCC 512 should be adjusted. In one embodiment, meter 522 can determine that more real power is needed at PCC 512. In one embodiment, meter 522 can determine that more reactive power is needed at PCC 512, and can determine whether the power should lead or lag a voltage waveform of grid 510. Meter 522 can make the determinations based on measuring energy at PCC 512. In one embodiment, meter 522 can respond to information indicating saturation conditions for grid 510 and/or for devices connected downstream from PCC 512. Thus, meter 522 can respond to dispatch information from grid 510 and/or to information from data center 540.

Figure 6:
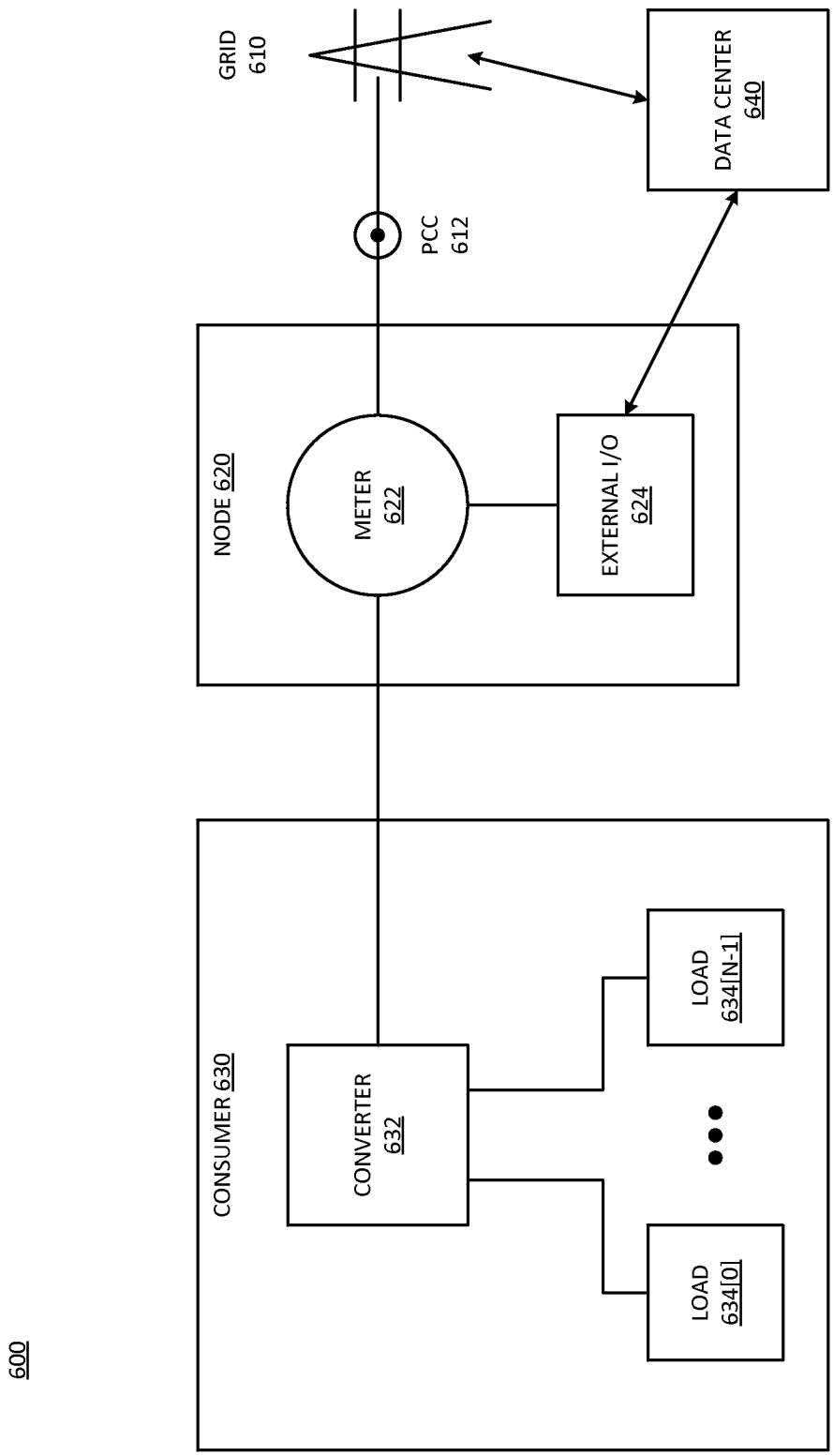
FIG. 6 is a block diagram of an embodiment of a system with a converter that controls a consumer premises based on monitoring by a meter.

FIG. 6 is a block diagram of an embodiment of a system with a converter that controls a consumer premises based on monitoring by a meter. System 600 represents elements of a grid network. System 600 provides one example of an embodiment of elements of a grid network that can be in accordance with one or more of system 100, system 200, system 300, and/or system 400. System 600 is similar to system 500 of FIG. 5, but does not include energy source resources at a customer premises. Even without the local generation of energy, the customer premises can benefit significantly through dynamic, intelligent control by a power converter and control node as described herein.

System 600 includes consumer 630, which represents a power consumer in accordance with any embodiment described herein. Consumer 630 is coupled to node 620. Node 620 includes hardware to couple to grid 610 via PCC 612. Grid 610 can be a utility power grid, a virtual grid, or any embodiment of a grid network. Node 620 includes meter 622, which represents a power metering device, which monitors power downstream (e.g., net power demand from consumer 630 and potentially other consumers). In one embodiment, node 620 includes external I/O (input/output) 624 to connect to data center 640. Data center 640 represents a central repository of information for grid 610. In one embodiment, data center 640 provides dispatch information to meter 622/node 620. Node 620 represents a control node, and can be one example of a control node in accordance with any embodiment described herein.

Meter 622 enables node 620 to monitor power demand from consumer 630 and potentially other consumers. Consumer 630 includes loads 634[0:(N−1)]. Loads 634 can be any type of loads. In one embodiment, consumer 630 includes converter 632, which represents a power converter, and can be, for example, a microinverter. Meter 622 includes a controller or processor to control its operation. In one embodiment, meter 622 monitors power demand, and controls the operation of converter 632. In one embodiment, converter 632 is part of node 620. In one embodiment, node 620 is virtual and represents an abstraction of the control provided by meter 622 and converter 632. In one embodiment, converter 632 is not necessarily within a customer premises, but controls power distribution for a customer premises.

Converter 632 controls power distribution to consumer 630. Because consumer 630 does not include power generation, controlling power distribution refers to distributing power downstream to the consumer, and can include controlling the power demand of the consumer. In one embodiment, meter 622 is responsible for representing compliance with grid regulations at PCC 612. In one embodiment, meter 622 determines that an adjustment is needed to a ratio of real to reactive power to keep compliance at PCC 612, due to changing conditions of grid 610. In one embodiment, meter 622 provides commands or requests to converter 632 to adjust operation. Converter 632 can adjust operation with respect to consumer 630.

In one embodiment, meter 622 can determine that consumer 630 requires reactive power in addition to or instead of real power. Traditionally, a consumer would be required to pull all reactive power from the grid. Thus, all reactive power needs of consumer 630 would be provided by grid 610. In one embodiment, converter 632 can change an interface at PCC 612 via either upstream-facing operation and/or downstream-facing operation. Upstream-facing operation includes how power factor, real power, reactive power, and others are controlled as seen from grid 610. Converter 632 can change operation by managing power demand as seen from grid 610. In one embodiment, converter 632 can change an interface based on needs of consumer 630 and availability of power at grid 610.

Consider a scenario where consumer 630 requires real power to operate loads 634. Traditionally, real power requirements by the consumer would require the consumer to either generate real power locally and/or to pull real power from grid 610. In one embodiment, if grid 610 can benefit from reactive power being drawn (e.g., for grid voltage support by drawing current from the grid at a leading or lagging phase with respect to grid voltage), converter 632 can change an interface to the grid and draw reactive power from grid 610, while changing an interface with respect to loads 634 to provide real power from the reactive power drawn. Similarly, in one embodiment, converter 632 can operate to draw real power from grid 610 and provide reactive power to loads 634. Such operations can involve converter 632 changing a phase offset of an input impedance to the loads and/or a phase offset of an input impedance to the grid (e.g., via or as monitored by meter 622).

Thus, node 620 and/or meter 622 and converter 632 can provide benefit to a consumer that does not have an energy source. Consumer 530 of FIG. 5 can provide at least a portion of its own power, and meter 522 and converter 526/532 can determine through calculations what power should be created from the locally generated power. Consumer 630 does not include an energy source, but meter 622 and converter 632 can control how power from grid 610 is used at consumer 630. In one embodiment, based on energy signatures measured by meter 622 for various loads (where energy signatures are explained in more detail below), meter 622 can calculate how to use power from grid 610. In one embodiment, converter 632 can pull only real power from grid 610, but then create reactive power to be used by loads 634. Thus, converter 632 can supply the reactive power needs of consumer 630 from only real power pulled from the grid. Thus, consumer 630 will not be seen by grid 610 as using reactive power, but only real power. In some cases, reactive power is less expensive than real power. If, however, a condition exists where reactive power consumption is preferred, even temporarily, converter 632 can draw reactive power and produce real power for consumption by loads 634. In one embodiment, in general, converter 632 can draw power at any mix of reactive and real power from grid 610 and provide whatever mix of real and reactive power is needed by loads 634. Such operation can be affected by dispatch information from data center 640, and/or can provide information to data center 640.

In one embodiment, a consumer includes local power converter 632. Converter 632 can perform one or more operations to manage or control an interface. In one embodiment, the interface represents the interconnection of a device to a PCC. In one embodiment, the interface represents the electrical interconnection or electrical coupling of a device to another point. For example, converter 632 can operate to adjust an interface between the PCC and one or more local loads, such as by changing how power or energy is transferred between the grid and the load. In one embodiment, converter 632 can operate to adjust an interface between a local energy source and a local load, for example, to deliver power to the load from a local energy source. In one embodiment, converter 632 can operate to adjust an interface between a local energy source and a PCC, for example, to deliver power from the energy source to the grid from the consumer side of the PCC. In one embodiment, converter 632 can operate to adjust an interface between an energy storage and the PCC and/or energy source, for example, to charge the energy store and/or provide power from the energy store to use for the load and/or the grid.

Figure 7:
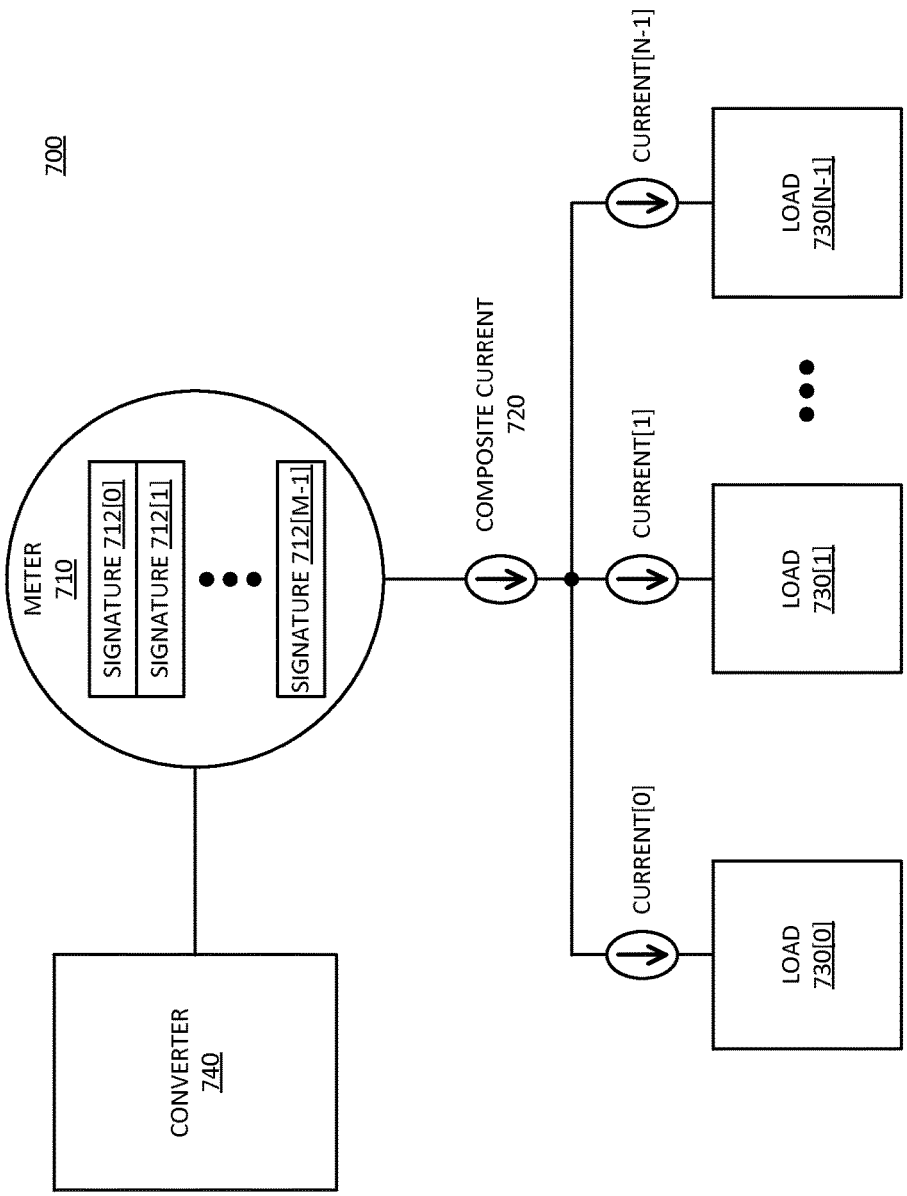
FIG. 7 is a block diagram of an embodiment of a system with a meter that monitors different energy signatures that describe complex current vectors.

FIG. 7 is a block diagram of an embodiment of a system with a meter that monitors different energy signatures that describe complex current vectors. System 700 represents elements of a control node coupled to loads. System 700 can be one example of a control node in accordance with any embodiment described herein. More specifically, system 700 includes meter 710 and converter 740. In one embodiment, meter 710 and converter 740 perform the operations of monitoring and controlling of a control node. In one embodiment, system 700 monitors and controls power usage in accordance with energy signatures.

In one embodiment, meter 710 monitors power usage at the customer premises or other downstream connections. In one embodiment, converter 740 provides control over power generation and/or power usage based on monitoring by meter 710. Converter 740 can control power generation by controlling what type of power is generated, even from a source that produces only real power. Converter 740 can control power consumption by controlling what type of power is made available to the loads, even when the loads needs a different mix of reactive and real power than is available—converter 740 can generate the right real and reactive power components to satisfy the power demands of the loads.

In one embodiment, meter 710 includes storage and processing elements. For example, meter 710 can include on-board memory to store data. Meter 710 can include a processor and/or embedded computing board to performance computations and control operation. In one embodiment, meter 710 stores signatures 712. Signatures 712 represent complex current vectors for one or more loads. The complex current vectors are composite currents that a drawn when a load is active. In one embodiment, meter 710 stores M signatures, which may be greater than or less than the number of N loads 730 monitored by meter 710. When M is less than N, meter 710 may omit storing signatures for loads that are infrequent or do not deviate from real power by more than a threshold, for example. In one embodiment, meter 710 stores signatures based on times of day instead of by specific loads, which can result in energy signatures that are different in number from the number of loads.

In one embodiment, load 730[0] has a corresponding current or current signature Current[0]. Furthermore, load 730[1] has a corresponding current or current signature Current[1], and so forth until load 730[N−1] has a corresponding current or current signature of Current[N−1]. Each of the signature currents Current[0:(N−1)] can be complex vector current, having a real power component and a reactive power component. More detail is provided below with respect to FIGS. 8 and 9. Composite current 720 is a complex current vector that includes the complex current vectors of various loads. Each load current vector Current[0:(N−1)] can itself be complex by having an apparent power component, and harmonic components that shift the actual power used by the load. In one embodiment, meter 710 can track the signatures and cause converter 740 to operate differently based on detecting specific loads coming online and/or going offline.

In one embodiment, meter 710 includes a processor to perform vector calculations and/or vector analysis of the monitored currents. Thus, meter 710 can identify and track various energy signatures or current signatures. Signatures 712 can be referred to as current signatures, referring to the fact that when the various loads are active or operational, there will be a specific, identifiable current vector associated with the load coming online. Signatures 712 can be referred to as energy signatures, referring to the fact that the complex vectors themselves are representations of the complex energy usage of the loads when they are active.

Traditional systems have been known to monitor a so-called "energy profile" that includes a representation of how much energy is consumed by a device or load, on average over time. Signatures 712 can extend the concept of a traditional energy profile, with enhanced or modified information. More specifically, signatures 712 can represent not just the measurable power component of energy for a load, but also include information about the harmonics or harmonic noise as well. Thus, in one embodiment, meter 710 can aggregate harmonic information as well as measurable energy usage. The resulting representation of signatures 712 is not a power vector as previously known. Instead, the resulting representation of signatures 712 includes information about harmonics. In one embodiment, knowledge of harmonics can inform the operation of converter 740 to adjust an interface to power supply to suppress harmonics.

Consider that system 700 provides an example of a control node for a customer premises tied to a grid network, and the customer premises includes a solar source or other energy source that feeds back into the grid network. The control node includes meter 710 and converter 740, which can be a smart inverter. The grid network can include a data center, which provides information and can fill the traditional role of a utility. Instead of the data center controlling the distribution of centralized power, the data center can provide distributed information for distributed control of distributed power. In one embodiment, the data center can dispatch information and control the generators of the grid network, control the operation of distributed control nodes, control the operation of energy storage, and/or perform other functions.

In one embodiment, converter 740 can control the power generated by the energy source of the customer premises. Meter 710 is a device that can monitor what the customer premises is doing as far as power usage is concerned. In one embodiment, meter 710 and/or converter 740 can receive dispatch information from a data center. The control node can also provide information to a data center. Converter 740 can specifically generate the power required for the customer premises and/or the grid. In one embodiment, the utility can offer preferred rates for generating certain types of energy.

As an example, consider a motor connected to the grid. It is traditionally connected to a capacitor bank to prevent the reactive noise going back into the grid. Not do motors tend to generate reactive noise that feeds back onto the grid, but LED (light emitting diode) based lights, flatscreen TVs, computer devices (especially power supplies for electronics, such as switching power supplies), and other electronic equipment also put noise on the grid. The devices create noise back onto the grid based on resonance or magnetic feature that creates an impedance and/or heat that the system has to compensate for. Thus, current to provide power to the loads and/or power from the customer premises to the grid has to be pushed and/or pulled through the magnetic resonance, which takes more energy to move the current. More energy is required to move the same amount of current through the magnetic resonant field as compared to moving current through a line where no magnetic resonance exists.

Reference to creating reactive power can refer to generation of a current that has phase and waveform shape properties to compensate for the harmonic distortion. Thus, meter 710 can compute and store signatures 712 for use in determining how to interface with the grid. Meter 710 can measure and monitor what signatures are present at any given time. For example, meter 710 can regularly continuously monitor power demand for the consumer. Continuously monitoring will be understood to be a regular cycle of sampling input and/or output lines and determining what composite current 720 is. Meter 710 can direct converter 740 to change its input impedance and/or output impedance, and/or change its generation of an output current waveform to provide as close to an ideal output signal as possible. More details are provided below with respect to FIGS. 15 and 16.

In one embodiment, converter 740 adjusts its operation to reduce a harmonic component as seen by the grid. Thus, operation of converter 740 can make the power demand and/or the power generation as presented to the grid at the PCC to be "clean" of harmonics. Thus, system 700 can interface much more efficiently, resulting in better transfer of energy back and forth from the grid, in addition to being able to provide grid support, and grid condition correction. In one embodiment, grid support and/or grid conditions is one factor in a calculation of how converter 740 should generate output power, whether output to the load as received from the grid and/or output to the grid as supplied from the customer premises.

In one embodiment, in response to signatures 712, and/or dispatch information from a data center or grid operator (e.g., central grid management), and/or energy monitoring by a meter, system 700 enables the control of reactive power at a PCC and/or at a consumer. The reactive power can be referred to as VARs (volt-amperes reactive). In one embodiment, meter 710 measures current drawn by a load, including harmonics of the current. The load can include any one of multiple different devices electrically coupled to the grid, which consumer energy. In one embodiment, meter 710 generates an energy signature by computing a current vector for the measured current. The energy signature will be unique to the load or the load condition (assuming the aggregate of multiple distinct load devices producing the load current). The energy signature includes a complex current vector for the load in operation. In one embodiment, meter 710 identifies a real power component and a reactive power component for the primary current, and a real power component and a reactive power component for one or more harmonics of the load. In one embodiment, energy signature 712 includes an angular displacement of the harmonics relative to the primary current. Meter 710 controls the operation of converter 740 (e.g., via providing information to the converter) to control a noise contribution of the load due to the harmonics as seen at the PCC. The converter can adjust an interface to the PCC to compensate for, and therefore, reduce noise introduced onto the grid from the load.

Again, in one embodiment, converter 740 adjusts a reactive power component of power output by a local energy source. In one embodiment, converter 740 adjusts a reactive power component of power demand by the load. In one embodiment, converter 740 adjusts (e.g., reduces or increases) a frequency of an operating voltage of the load. In one embodiment, converter 740 is on a same side of the PCC as loads 730, and controls an interface from internal to the PCC. In one embodiment, converter 740 is on a grid side of the PCC relative to loads 730, and controls the interface from the grid side of the PCC, and adjusts how the grid will see power demand and/or generation looking into the PCC at the consumer.

In one embodiment, meter 710 monitors an electrical and/or performance condition of the grid. In one embodiment, meter 710 receives dispatch information or other distributed information indicating a condition of the grid. In one embodiment, the meter can be considered to receive dispatch information by measuring a grid condition at the PCC. In one embodiment, meter 710 is on a same side of the grid as local loads 730. In one embodiment, converter 740 is on the same side of the grid as local loads 730. In one embodiment, meter 710 computes and stores signatures 712.

In one embodiment, meter 710 is preconfigured with signature information. In one embodiment, meter 710 is trained on signatures 712 for specific loads 730 connected to it. In one embodiment, meter 710 computes and stores signatures 712 as different load conditions that occur throughout a day. In one embodiment, composite current 720 is considered the same when the vector is within a predefined range of a signature, or a signature is determined to exist when composite current 720 is within a defined range of a signature 712. In one embodiment, meter 710 provides specific parameters for operation to converter 740 based on a specifically identified signature 712.

In one embodiment, meter 710 identifies an energy signature 712 unique to one or more loads 730 or load conditions based on measuring and computing composite current 720. In one embodiment, loads 730 represent load conditions (a scenario when various loads are concurrently on), as opposed to identifying a specific device. Meter 710 can identify a complex current vector for a load 730 including identifying a real power component and a reactive power component for the primary current, and a real power component, a reactive power component, and an angular displacement relative to the primary current for the harmonics. Again, meter 710 can cause converter 740 to operate to reduce or minimize noise introduced onto the grid based on the load.

In one embodiment, meter 710 receives dispatch information from the grid network indicating that the grid network needs voltage support at the PCC managed by the control node of which meter 710 is a part. In one embodiment, converter 740 provides positive reactive power onto the grid network to provide voltage support. In one embodiment, converter 740 provides negative reactive power onto the grid network to provide voltage support. Converter 740 can provide positive reactive power in response to a need by a downstream node of the grid network needs voltage support. Converter 740 can provide negative reactive power in response to a need by an upstream node of the grid network needs voltage support. If meter 710 includes position awareness, the control node via meter 710 can determine whether it is an upstream or downstream that needs voltage support, and take appropriate action.

In one embodiment, meter 710 can compute or process different load energy signatures even when other loads are present. For example, consider a composite current that is already present in system 700. The addition of another load 730 coming online will change the overall composite current. In one embodiment, meter 710 computes a difference between the new composite current and the previous composite current to determine the energy signature of the new load(s). As such, meter 710 can identify the specific load and determine to effect a change in operation within system 700 to respond to the power demands of the specific load 730. It will be understood that such computations could require vector analysis and/or calculations to distinguish specific loads.

Figure 8:
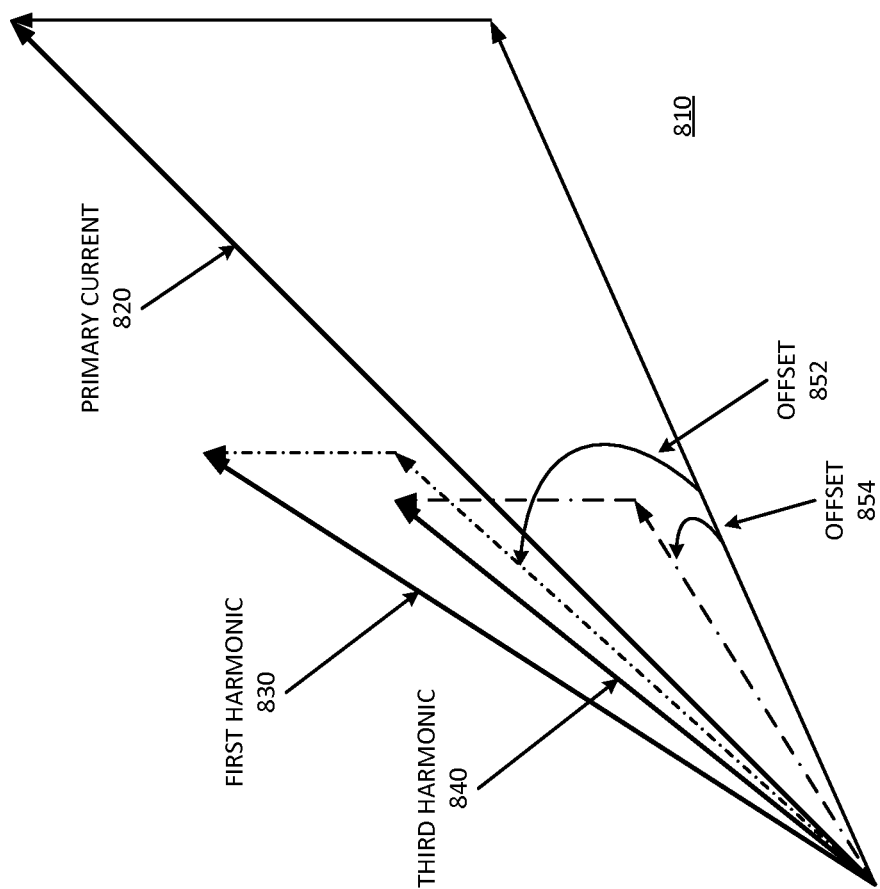
FIG. 8 is a graphical representation of an embodiment of components of a current in a system in which harmonic components of current have angular offsets with respect to a primary current component.

FIG. 8 is a graphical representation of an embodiment of components of a current in a system in which harmonic components of current have angular offsets with respect to a primary current component. Diagram 810 provides a complex vector representation of current. A vector has a magnitude and a direction. Instead of simply measuring power as traditionally done, in one embodiment, a meter and/or a control node can monitor power as an energy signature including a representation of a complex power vector. In one embodiment, each signature identifies characteristics to define and/or "name" the signature. Each signature includes a complex vector representation that provides a vector for primary current and a vector for one or more harmonics.

Vector 820 is the vector for primary current. In typical representation, the x-coordinate is the vector component that extends from left to right across the page. The y-component goes from bottom to top of the page. It will be understood that while not represented here for purposes of simplicity, a vector could have a negative y-component. The x-y coordinates define the end of the vector. Now assume that the x and y coordinates of primary current vector 820 define a plane. The most correct way to envision the harmonics, in accordance with research and work done by the inventors, is to represent the harmonics as a three-dimensional vector. Thus, if the x-y coordinates of vector 820 define a reference plane, one or more of the harmonics can have an angular offset relative to the plane of the primary current vector.

For example, consider the example of diagram 810. The first harmonic is illustrated as having vector 830, which includes an x component and a y component, where the magnitudes of the components can be any magnitude with respect to the primary current components. In addition to the x and y coordinates, first harmonic vector 830 includes a z coordinate component, which defines angular offset 852 of the vector with respect to the reference plane of primary current vector 820. It will be understood that the starting points of the primary current and the harmonics are the same. Thus, the third dimension of the harmonic vectors or the complex vectors is not necessarily an absolute z coordinate component, but an angular offset relative to the primary current.

As illustrated, third harmonic vector 840 also has an x component and a y component, and angular offset 854, which can be different (greater or less than) angular offset 852 of first harmonic vector 830. The angular shift of the angular offsets represents a magnetic effect on the current. The inventors have measured noticeable effects on power consumption up to the fortieth harmonic. Thus, the contribution of harmonic offsets should not be understated. The harmonics shift with respect to the angular offset due to the differing resonant effects of magnetic flux when trying to move a current. Primary current vector 820 is the current the consumer expects to see. However, the harmonic components can add significant (measurable) power consumption. The offsets of the harmonics can shift the simple expected two-dimensional current vector into a three-dimensional current vector (complex current vector). The traditional power triangle does not fully address the power usage by the consumer, as additional power will be required to overcome the magnetic components represented by the shifted or offset harmonic components.

Figure 9:
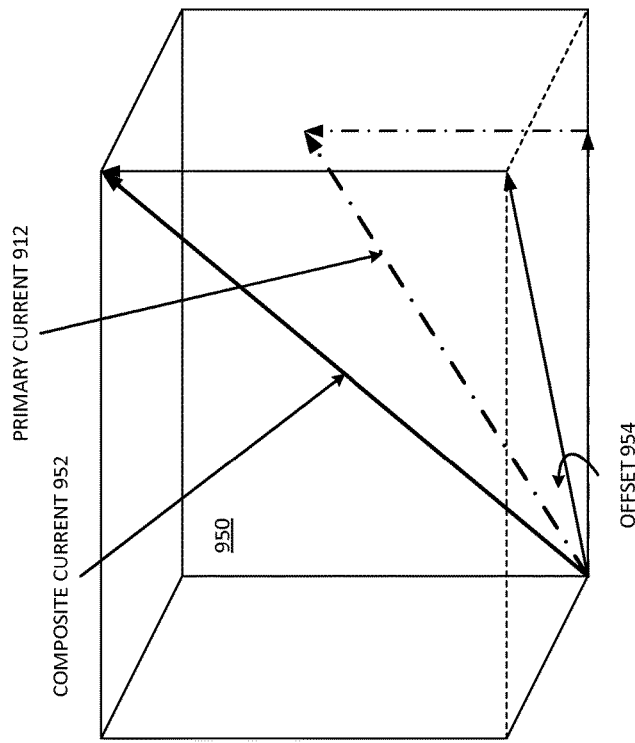
FIG. 9 is a graphical representation of an embodiment of components of a current in a system in which a current vector is a composite of a primary current component and harmonic current components.
Figure 9:
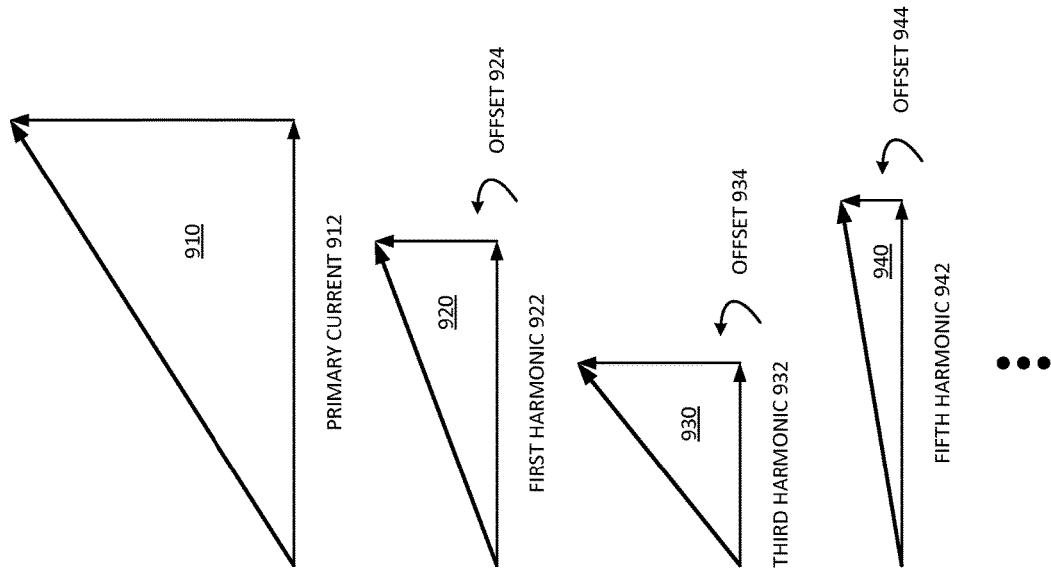

FIG. 9 is a graphical representation of an embodiment of components of a current in a system in which a current vector is a composite of a primary current component and harmonic current components. Diagrams 910, 920, 930, and 940 illustrate component parts of a complex current vector in accordance with an embodiment of diagram 810 of FIG. 8. As illustrated, diagram 910 represents the primary current vector 912. The primary current includes x and y components, and defines a reference frame for the harmonics.

Diagram 920 represents first harmonic vector 922, which includes x and y components and angular offset 924. Diagram 930 represents third harmonic vector 932, which includes x and y components and angular offset 934. Diagram 940 represents fifth harmonic vector 942, which includes x and y components and angular offset 944. Each of the primary current 912 and various harmonics (922, 932, 942) are shown as two-dimensional "power triangle" representations, which is what is traditionally expected for each one. However, as mentioned already, the harmonics are frequently at an angular offset with respect to the primary current component vector, and thus the resulting composite current vector will not be in the same plane as primary current vector 912.

Rather, consider the power triangle of the composite current vector as a triangle in a three dimensional box. Diagram 950 provides a simple illustration of this concept. It will be observed that primary current vector 912 is on a face of the three dimensional box of diagram 950. The harmonics push the triangle for the composite current "into" the box in some way. Composite current vector 952 is both larger in magnitude, and offset angularly with respect to primary current vector 912. Offset 954 represents the angular offset. It will be understood that primary current vector 912 and composite current vector 952 define the "shape" of the box. Depending on the amount of harmonic contribution, the box shape will be different. The composite current vector 952 can be a signature stored by the metering device. The reference plane of primary current 912 can be defined as a plane of the grid power (referring to the power condition as seen at the grid via the PCC.

With respect to the noise and harmonics generated, it will be understood that there are regulations on switching power supplies and magnetic resonance in general. Each device is tested for compliance (e.g., UL certification). When each device or load works individually as designed and tested, each one will comply as required per regulations. However, when there are multiple loads and/or devices coupled together, they tend to create unanticipated resonance. The inventors have measured contributions to the energy triangle from the first up to the 40th harmonic. Thus, there is typically a significant amount of harmonic noise happening on the power lines. Harmonic suppression traditionally includes filters that target specific noise components. However, the noise components can continue to vary as different devices come online and offline, and the electrical resonance structure of the network continually changes. In one embodiment, meter 710 detects the characteristics of each load or group of loads. The characteristics can be referred to as a signature of the harmonics.

In one embodiment, the power meter or energy meter can detect such shifts as the angular offsets of the harmonic current vectors, by measuring energy contributions. The power converter can compensate for the actual composite current by providing the reactive power needed to match the load and/or PCC to the grid. Thus, the current at the load can be adjusted by the converter to bring the composite current into alignment with the grid, not simply in power factor, but in complex vector. Such operation will naturally eliminate or at least reduce harmonic distortion caused by loading on the grid.

In one embodiment, what is described in reference to loading can also be performed with reference to energy generation. In one embodiment, the meter can determine an energy signature at the PCC and compute what current would be needed to offset the grid to a desired offset (if some power factor other than unity is desired) and/or to match to the grid in a case where unity power factor is desired. The converter can adjust operation to adjust the power output to not only match reactive power needs, but complex current vector shift as well to more efficiently match the interface of the grid with the downstream from the PCC.

It will be understood that the energy triangle represented in diagram 950 can be represented as a mathematical representation of the effect seen when looking at the current component of power drawn by a load or consumer. The effect is wasted energy, which usually manifests itself as heat. The problem traditionally is that systems do not match well, and there are significant noise components. In one embodiment, a control node matches not just impedance, but matches noise or harmonic correction to provide a specific energy signature connection to the grid. Thus, the control node can provide a "cleaner" connection to the grid network with respect to the power interface, whether outputting power onto the grid or receiving power from the grid.

Figure 10:
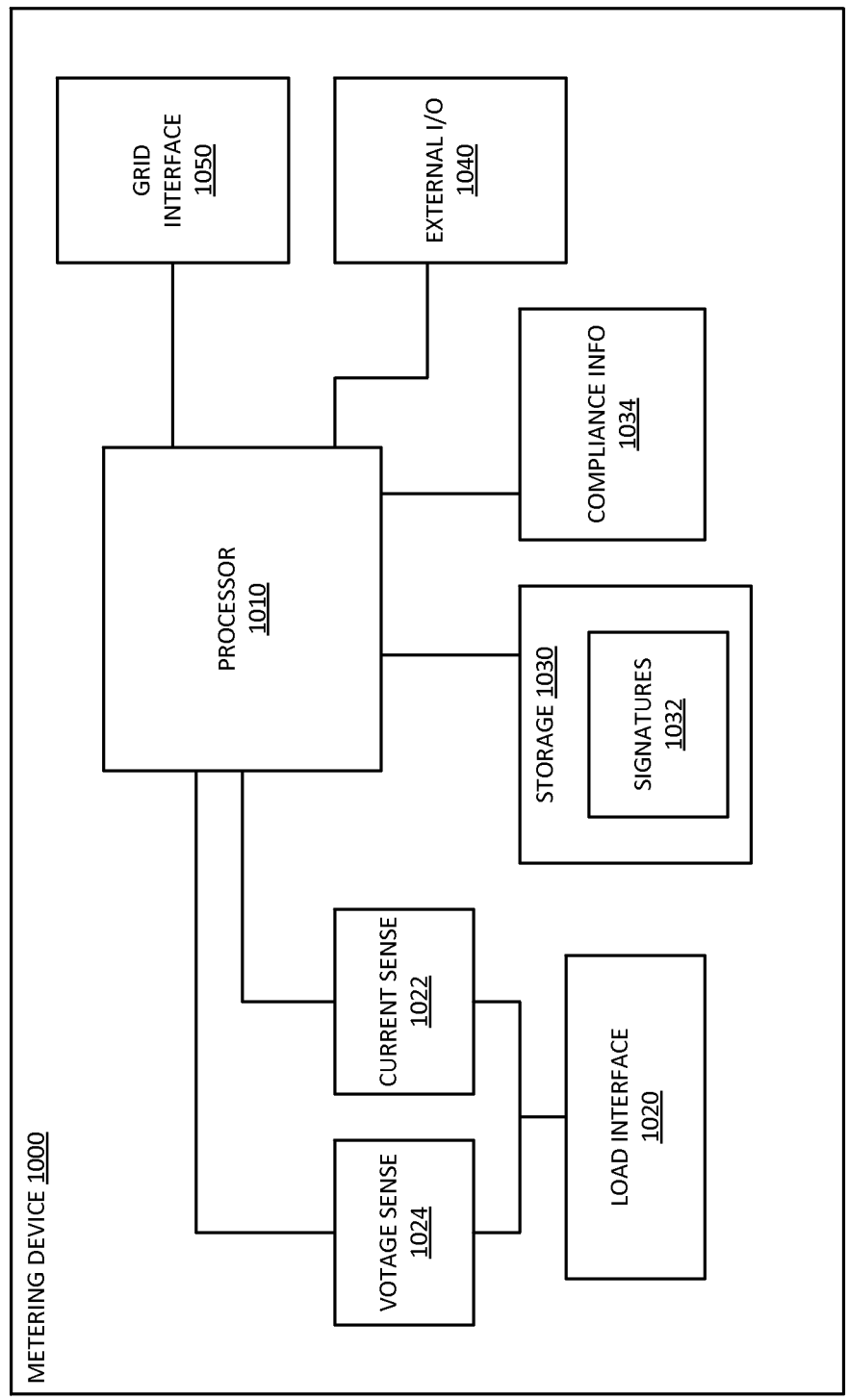
FIG. 10 is a block diagram of an embodiment of a metering device that monitors power at a PCC.

FIG. 10 is a block diagram of an embodiment of a metering device that monitors power at a PCC. Metering device 1000 can be a power meter or an energy meter in accordance with any embodiment described herein. In one embodiment, metering device 1000 is or is part of a control node in accordance with any embodiment described herein. Device 1000 includes hardware components to interconnect to a grid network, connecting upstream and/or connecting to neighboring grid network nodes. In one embodiment, device 1000 includes hardware components to interconnect to one or more loads and/or other devices or nodes coupled downstream from the power metering. It will be understood that device 1000 can be separate from a meter used by the grid to measure and charge for power delivered from the grid. There can be multiple devices 1000 that couple to a single grid meter.

Device 1000 includes load interface 1020. Load interface 1020 provides hardware to interconnect to downstream devices. Device 1000 monitors the energy usage of downstream devices. In one embodiment, device 1000 includes voltage sense hardware 1024 and current sense hardware 1022. Current sense hardware 1022 can measure current drawn by the loads, and can include hardware capable to measure harmonic components of power demand. Current sense 1022 can include magnitude, phase offset (e.g., power factor), frequency, and/or other electrical properties of a current drawn by a load or group of loads. In one embodiment, device 1000 can generate energy signatures and compare such energy signature computations to stored energy signatures. Device 1000 can also store new energy signatures computed. Voltage sense hardware 1024 can measure a voltage including phase, frequency, magnitude, and/or other electrical property of the voltage waveform.

Processor 1010 represents control logic or a controller for device 1000. Processor 1010 can be configured or programmed to perform the energy monitoring. Processor 1010 can be configured to perform computations to compute energy signatures and/or compare current and voltage readings to energy signatures. In one embodiment, processor 1010 determines how current can be adjusted to compensate for harmonics, a grid condition, or other condition to bring the PCC into compliance, and/or to provide support to compensate for a failure at another control node. Processor 1010 can perform operations and include hardware and/or control logic to track energy consumption of the grid network segment below device 1000, and determines how to compensate to bring the local grid network segment below it into compliance. While not shown, metering device 1000 operates in conjunction with a power converter to provide the needed reactive power indicated by the monitoring.

Device 1000 includes external I/O 1040 to enable device 1000 to connect to other metering devices or control nodes, and to connect to a data center or other central data device. In one embodiment, external I/O 1040 enables device 1000 to connect to grid management of a traditional utility power grid. In one embodiment, external I/O 1040 enables device 1000 to send data to and/or to receive data from a central data center. External I/O 1040 can receive dispatch information for device 1000. External I/O 1040 can include any type of communication interfaces, including known wired and/or wireless communication mechanisms. In one embodiment, external I/O 1040 includes proprietary and/or customer communication mechanisms, which can include wireline and/or wireless communication platforms, including hardware and software stacks or other processing logic to send and receive communication.

Grid interface 1050 represents hardware to enable device 1000 to couple to the grid network. In one embodiment, grid interface 1050 enables device 1000 to determine a condition of a grid at a PCC associated with device 1000. In one embodiment, grid interface 1050 represents hardware to enable device 1000 to couple to a local energy source. In one embodiment grid interface 1050 and/or other interface within device 1000 enables device 1000 to determine what type (how much) energy support can be provided from its downstream devices. For example, device 1000 can determine how much energy is being produced by local energy source(s). The power converter adjusts the interface to the grid at the PCC by adjusting its operation, including what current waveform appears at the PCC.

In one embodiment, device 1000 includes storage resources, such as memory and/or hard drives or solid state storage. Storage 1030 represents memory resources for device 1000. In one embodiment, device 1000 stores multiple signatures 1032 to be used in monitoring and controlling loads. In one embodiment, each signature 1032 is a complex current vector representing a condition of a current waveform drawn under various loads. In one embodiment, processor 1010 can generate and store signature 1032. In one embodiment, signatures 1032 are preloaded on device 1000. In one embodiment, processor 1010 computes composite current waveform information to compare to signatures 1032. Depending on matching to the signatures, processor 1010 can calculate a current waveform phase and shape that is desired for a given load scenario (power demand) and/or power generation scenario.

In one embodiment, processor 1010 accesses one or more items of compliance information 1034. In one embodiment, compliance information 1034 is stored in storage 1030. In one embodiment, compliance information 1034 is received via external I/O 1040. In one embodiment, processor 1010 computes a current waveform phase and shape desired for a given power demand scenario and/or power generation scenario based on compliance information 1034. Thus, compliance information 1034 can affect how device 1000 operates. In one embodiment, external I/O 1040 enables device 1000 to couple to an associated converter or converters. Based on calculations made by processor 1010, device can signal a converter how to operate to achieve the desired current. In one embodiment, device 1000 simply indicates the desired current to the converter, which can then separately compute how to generate the current. In one embodiment, device 1000 computes specific parameters as input to a converter device to cause it to adjust its operation for the desired current waveform at the PCC.

In one embodiment, metering device 1000 is capable of location awareness, in accordance with location awareness mentioned previously. With location awareness, processor 1010 can, in one embodiment, determine its location. Thus, based on conditions measured or received for grid interface 1050, processor 1010 can compute a reactive power needed based on location detection. External I/O 1040 can then signal the associated converter(s) to generate the power.

Device 1000 can detect and determine to provide voltage support upstream towards the generator or central grid network management by causing the control node at the PCC to give negative or lagging-phase reactive support. Device 1000 can detect and determine to provide voltage support downstream away from the generator or central grid network management by causing the control node at the PCC to positive or leading-phase reactive support. It will be understood that leading support refers to a current waveform that leads an AC voltage of the grid in phase. Similarly, lagging support refers to a current waveform that lags the AC voltage of the grid in phase.

Figure 11:
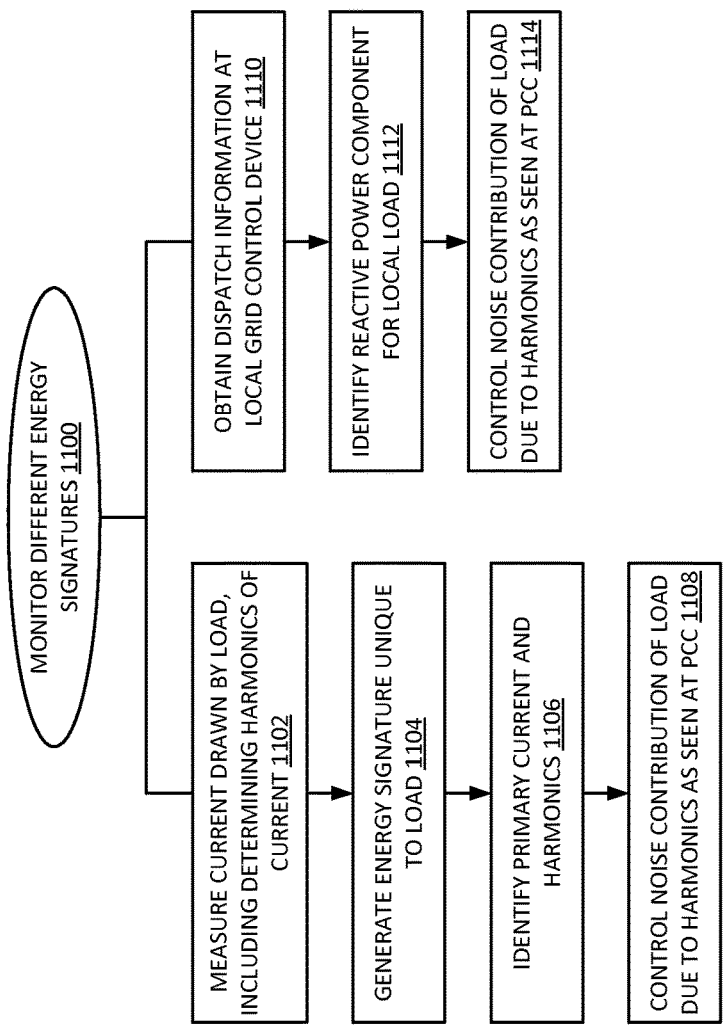
FIG. 11 is a flow diagram of an embodiment of a process for monitoring different energy signatures that describe complex current vectors.

FIG. 11 is a flow diagram of an embodiment of a process for monitoring different energy signatures that describe complex current vectors. In one embodiment, process 1100 for monitoring different energy signatures includes operations performed by an embodiment of a metering device and/or a power converter. In one embodiment, the meter measures current drawn by one or more loads, including determining harmonics of the primary current, 1102. In one embodiment, the meter measures energy instead of power (W-hr). As mentioned above, the harmonics can be at an angular offset relative to the primary current, and thus create a complex current vector.

In one embodiment, the meter generates an energy signature for the load or loads or load condition that is unique to the load, 1104. In one embodiment, the meter stores the energy signature for later analysis of energy usage in the system. In one embodiment, the meter generates the energy signature to compare against saved energy signatures to determine what loads exist in the system. In one embodiment, the energy signatures are stored temporarily and are used to dynamically generate a compensation current. The compensation current can be dynamically generated or generated on the fly by computations, and/or can be generated based on stored information.

In one embodiment, the meter identifies the primary current and the harmonics, 1106. In one embodiment, as a practical matter, the system can use a voltage of the grid network to which it is attached and simply measure a composite current with angular offset relative to the reference plane, without having to specifically, separately identify individual harmonics and the primary current. In one embodiment, the meter measures a composite current, which can indicate the primary current and the harmonics. The meter issues commands to a converter to cause the converter to configure an interface to the grid network to adjust for the measured composite current and/or the primary current and harmonics if measured separately, 1108. In one embodiment, the converter changes an interface with respect to the load(s) to change how power is delivered to the load(s). In one embodiment, the converter changes an interface to the grid network to change how power is presented and/or drawn from the grid network.

In one embodiment, the meter can obtain dispatch information, 1110. In one embodiment, the dispatch information can be obtained by the grid network such as central management or a data center sending information to the local control node. In one embodiment, the dispatch information can be obtained by measurement of the grid network conditions via the meter. In one embodiment, the meter identifies a reactive power component for a local load, 1112. The reactive power component can be an amount of reactive power needed by the local load for operation. In one embodiment, the meter can control or command a converter to change operation by changing an interface to the grid network and/or to the loads. The changing of the interface can include changing a frequency, a reactive power component, a real power component, and/or some other aspect of the electrical interface to the grid via the PCC. Thus, the converter can control the noise contribution of the load due to harmonics as seen at the PCC by adjusting operation to offset the harmonic distortion created by the reactive component of the load(s), 1114.

Figure 12:
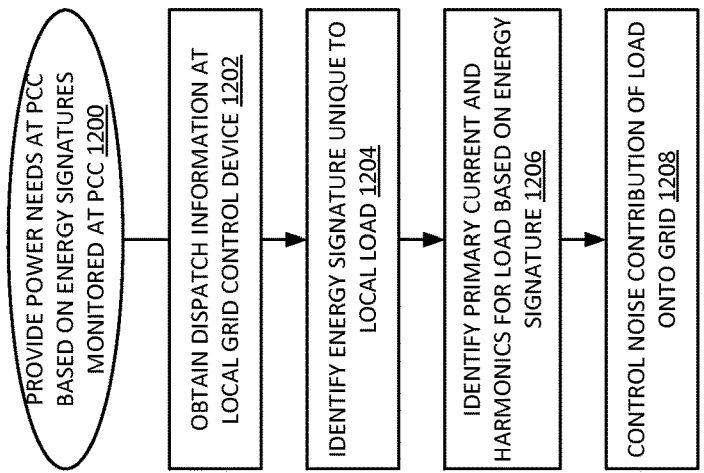
FIG. 12 is a flow diagram of an embodiment of a process for providing power needs at a point of common coupling based on energy signatures monitored at the point of common coupling.

FIG. 12 is a flow diagram of an embodiment of a process for providing power needs at a point of common coupling based on energy signatures monitored at the point of common coupling. In one embodiment, process 1200 for providing power needs at the PCC based on energy signature monitoring includes operations performed by an embodiment of a metering device and/or a power converter. While process 1200 refers to monitoring energy signatures, it will be understood that the energy signatures can refer to monitoring the operations of the grid at the PCC and the demand and power generation of loads and devices downstream from the PCC. The PCC can be a gateway PCC. The PCC can be at any level of hierarchy within a grid network. The monitoring can include any determination that results in the control node of the PCC changing an interface of the PCC to provide specific power needs at the PCC. In one particular embodiment, process 1200 incorporates any implementation where the downstream devices include power generation capability. In one embodiment, process 1200 incorporates any implementation where a converter can alter the reactive power consumption and/or convert real power to reactive power for consumption by the load(s). Loads can include other nodes or levels of the grid network hierarchy that are downstream from the PCC where the operations occur.

In one embodiment, the meter or control node can obtain dispatch information, 1202. In one embodiment, the dispatch information can be obtained from the grid network itself, such as central management or a data center sending information to the local control node. In one embodiment, the dispatch information can be obtained by measurement of the grid network conditions via the meter. In one embodiment, the meter identifies an energy signature unique to a local load, 1204. The energy signature can be embodiment of an energy signature referred to herein. The identifying of the energy signature can be in accordance with any embodiment described herein. In one embodiment, the meter identifies an energy signature for one or more device or element connected downstream from the PCC. Just as a meter can monitor individual loads for energy signatures at a level of hierarchy directly coupled to a consumer, a level of hierarchy that connects to different PCCs can identify energy signatures for the various control nodes coupled downstream.

In one embodiment, the meter identifies a primary current and harmonics for the load based on the energy signature, 1206. In one embodiment, the identification includes separately identify the primary current and one or more harmonics. In one embodiment, the identification includes identifying a composite current. In one embodiment, the meter can control or command a converter to change operation by changing an interface to the grid network and/or to the loads. The changing of the interface can include changing a frequency, a reactive power component, a real power component, and/or some other aspect of the electrical interface to the grid via the PCC. Thus, the converter can control the noise contribution of the load due to harmonics as seen at the PCC by adjusting operation to offset the harmonic distortion created by the reactive component of the load(s), for example, based on the energy signature, 1208.

In one embodiment, obtaining the dispatch information includes receiving information indicating a node on the utility power grid requires voltage support. In one embodiment, the control node including the metering device and the converter can obtain dispatch information indicating the need to provide support the grid network, and the meter can determine a location of its control nod with respect to a node on the grid network that needs support. In one embodiment, the control node determines the PCC is downstream on the utility power grid relative to the node of the utility power grid requiring voltage support. In one embodiment, the control node determines the PCC is upstream on the utility power grid relative to the node of the utility power grid requiring voltage support. The converter can provide positive or negative reactive power to provide support the grid.

Figure 13:
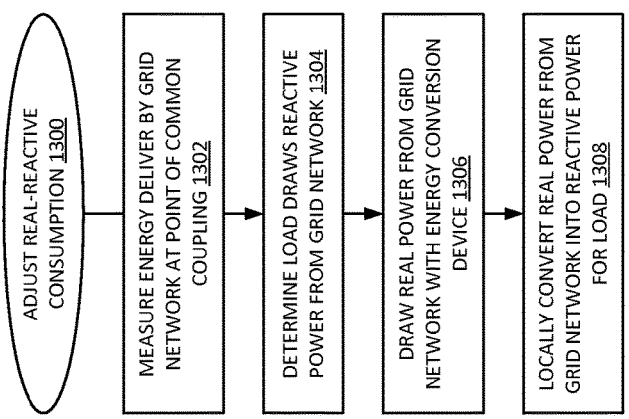
FIG. 13 is a flow diagram of an embodiment of a process for adjusting real-reactive power consumption at a point of common coupling.

FIG. 13 is a flow diagram of an embodiment of a process for adjusting real-reactive power consumption at a point of common coupling. In one embodiment, process 1300 for providing support the grid from the PCC includes operations performed by an embodiment of a metering device and/or a power converter. In one embodiment, process 1300 can apply to power drawn by a local load. In one embodiment, process 1300 can apply to power drawn by anything downstream from a PCC, which can include multiple loads and/or multiple nodes or other device.

In one embodiment, a meter measures energy delivered by a grid network at a PCC, 1302. The grid network can be a utility power grid or any other grid network as described herein. In one embodiment, the meter measures the reactive power component of the load in response to control information received at the metering device from a controller of the grid network. The controller can include central grid management of a utility power grid, and/or can include a data center of a grid network. In one embodiment, the meter determines based on the measurements that the load draws reactive power from the grid network, 1304. In one embodiment, determining that the load draws reactive power includes identifying an energy signature unique to the load. In one embodiment, in addition to determining that the load draws reactive power, the meter can determine what type of reactive power is used by the load, such as leading or lagging reactive power.

In one embodiment, the meter controls a converter to change an interface to draw real power from the grid network, 1306. The converter can locally change the real power drawn from the grid network into reactive power to be consumed by the load, 1308. The converter can convert the real power to the type of reactive power (e.g., leading or lagging) needed by the load. In one embodiment, the converter draws some real and some reactive power from the grid network. In one embodiment, the converter draws only real power from the grid network and supplies all reactive power needs of the load from converting the real power into reactive power.

While the example described in process 1300 refers specifically to drawing real power from the grid network and supplying reactive power, it will be understood that if favorable conditions existed where drawing reactive power from the grid was preferred, the converter could draw reactive power from the grid to convert to reactive and/or real power for the load or loads. In general, the meter can measure the reactive and real power needs of a load or loads. The converter can operate in response to the measurements to draw power available at the PCC and provide whatever power is needed downstream from the PCC.

Figure 14:
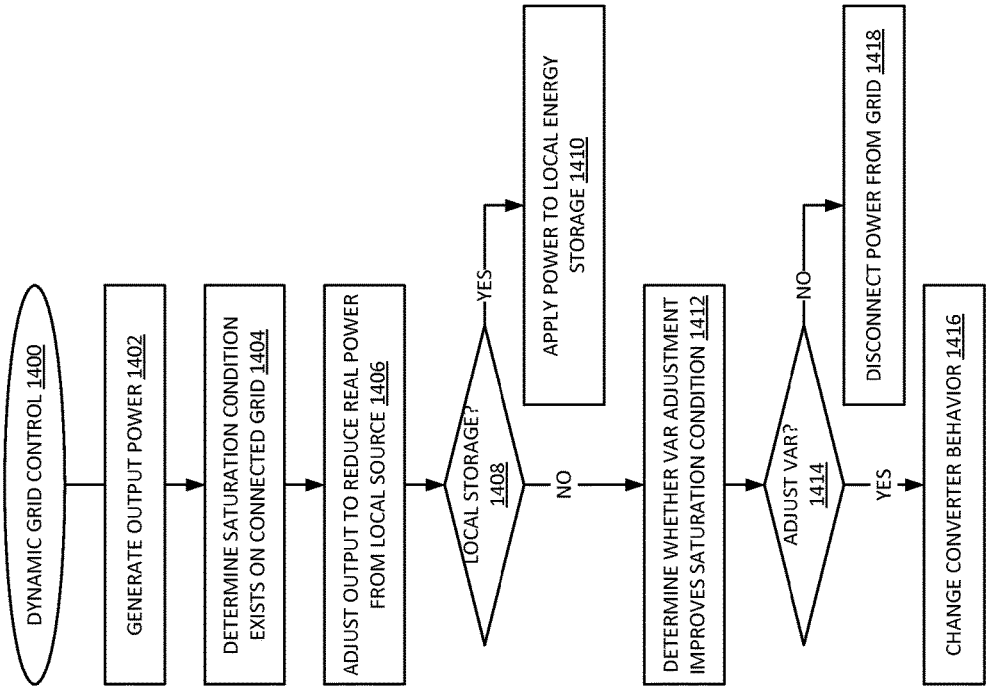
FIG. 14 is a flow diagram of an embodiment of a process for providing dynamic grid support, which can include addressing grid saturation.

FIG. 14 is a flow diagram of an embodiment of a process for providing dynamic grid support, which can include addressing grid saturation. In one embodiment, process 1400 for providing dynamic control of a grid network includes operations performed by an embodiment of a metering device and/or a power converter. In one embodiment, a segment of a grid generates a power output, 1402. In one embodiment, the power output comes from local energy sources at customer premises. In one embodiment, the power output comes from neighborhood power sources that provide power, but do not have sufficient capacity to satisfy peak demand from the consumers in the neighborhood.

In one embodiment, a control node determines that a saturation condition exists, 1404. In one embodiment, a saturation condition exists when a segment or neighborhood of the power grid has real power generation capacity of local energy sources that exceeds a threshold percentage of peak real power demand for the neighborhood. In one embodiment, the control node receives dispatch information from central grid management or a data center to indicate the saturation condition. In one embodiment, the control node receives information shared by other control nodes distributed in the grid network. The saturation threshold can be set to a specific percentage as determined by a utility, when the grid network includes connection to a utility power grid. The percentage can be, for example, 10, 15, 20, or 25 percent, or some other percentage. Some grids may be able to support percentages of 50 percent or more.

In one embodiment, the control node determines another reason to provide dynamic control to the grid, such as a condition having to do with reactive power needs at the grid and/or at the load(s), a failure condition at a node of the grid network, a connection of the grid segment to another grid segment, dispatch information requesting grid support, or other reasons. The converter can adjust output of power as seen from the neighborhood to reduce the real power from the local source, 1406. Typically local energy sources are designed to generate real power, by matching the grid voltage with near unity power factor. Instead of connecting to the grid always at unity power factor, the converter can determine a phase offset to generate reactive power. In one embodiment, the converter outputs power based on a complex current vector to provide not only reactive power, but power having an angular offset to compensate for harmonic distortion at the PCC.

In one embodiment, a customer premises or a neighborhood can include energy storage, which can be any energy storage described herein. If there is local storage, 1408 YES branch, in one embodiment, the can divert some or all power to apply to the local energy storage, 1410. Diverting the power to energy storage can reduce the overall real power generated from the local power source that would otherwise flow out to the grid network. If there is no local storage, 1408 NO branch, in one embodiment, the converter can determine if an adjustment to VAR or reactive power would improve the saturation condition or other electrical condition detected at the grid, 1412.

In one embodiment, the meter and/or converter determines that adjusting the reactive output would not improve the grid condition, 1414 NO branch. In one embodiment, if there is no local storage and VAR control would not improve the grid condition, and real power should not flow out to the grid, the control node can disconnect the power generation from the grid network, 1418, thus preventing the power from flowing onto the grid network. In one embodiment, the meter and/or converter determines that adjusting the reactive power output would improve the grid condition, 1414 YES branch, the converter can change its behavior to adjust an interface to the grid network, which can include changing an output of reactive power to the grid network, 1416. In one embodiment, the change in behavior can include any adjustment to a ratio of real power to reactive power downstream from the PCC.

Figure 15:
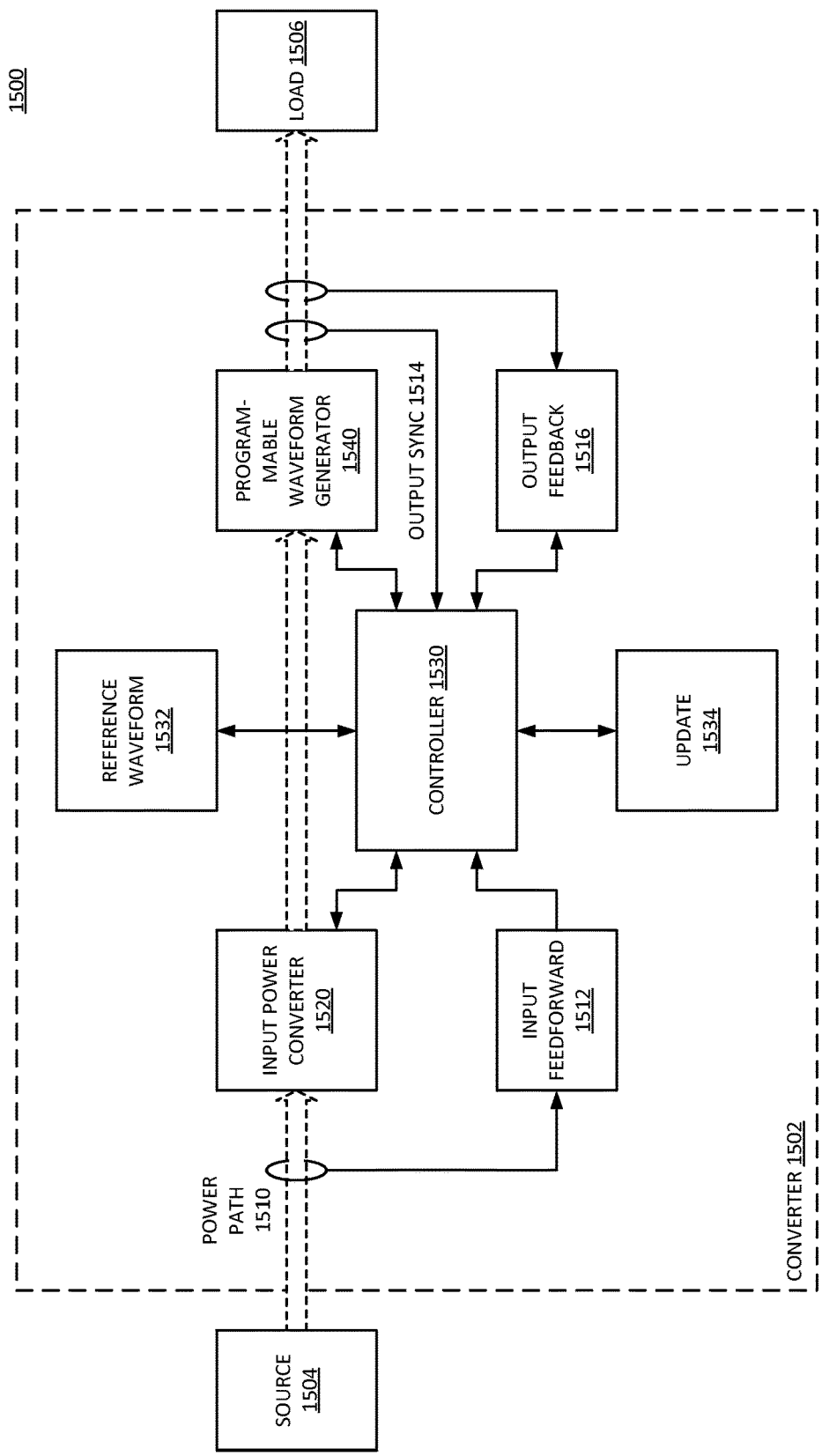
FIG. 15 is a block diagram of an embodiment of a system that controls harmonic distortion with a software feedback control subsystem coupled to a hardware waveform controller.

FIG. 15 is a block diagram of an embodiment of a system that controls harmonic distortion with a software feedback control subsystem coupled to a hardware waveform controller. System 1500 includes power source 1504, load 1506, and converter 1502 to generate output and control of an interface between the source and the load. In one embodiment, converter 1502 is in accordance with what is described in U.S. patent application Ser. No. 12/708,514, entitled "POWER TRANSFER MANAGEMENT FOR LOCAL POWER SOURCES OF A GRID-TIED LOAD," and filed Feb. 18, 2010. In one embodiment, the power conversion can be in accordance with U.S. patent application Ser. No. 11/849,242, entitled "MULTI-SOURCE, MULTI-LOAD SYSTEMS WITH A POWER EXTRACTOR," and filed Aug. 31, 2007. System 1500 can be one example of a system includes a converter for a control node in accordance with any embodiment described herein.

Power path 1510 represents the path of electrical power from source 1504 to load 1506, as controlled by converter 1502. Converter 1502 includes input power converter 1520 to receive input power from source 1504 and convert it to another form (e.g., DC to AC). Input power converter 1520 includes hardware components for receiving a power signal to convert, and may include appropriate power components. In one embodiment, input power converter 1520 implements dynamic impedance matching, which enables the input electronics to transfer maximum power from source 1504. Dynamic impedance matching includes constantly tracking a maximum power point, as well as driving an input power coupler (e.g., a transformer) to maintain as flat a power slope as possible (e.g., slope of zero). Input power converter 1520 may receive control signals or information from controller 1530, as well as providing input to indicate operation of the converter. In one embodiment, dynamic impedance matching includes high-frequency switching of the input power through a transformer or inductor to charge an internal node within converter 1502. The internal node can then act as an energy reservoir for high-frequency switching of an output through another transformer or inductor to allow a load to draw whatever power is needed. Thus, input power converter 1520 can provide unregulated energy transfer from an input to an output.

Input feedforward 1512 provides information (e.g., maximum power value, frequency as appropriate, or other information to control the input power converter hardware) about the source power to controller 1530. Controller 1530 controls input power converter 1520 based on the input information about the input power. Controller 1530 represents any type of processor controller that may be embedded in converter 1502. Controller 1530 may be or include any type of microcontroller, digital signal processor (DSP), logic array, or other control logic. Additionally, controller 1530 may include appropriate memory or storage components (e.g., random access memory, read only memory (ROM), registers, and/or Flash) to store code or values generated or obtained during runtime operation or pre-computed.

Controller 1530 drives programmable waveform generator 1540 to generate the desired output waveform. Generator 1540 also lies on power path 1510, and receives input power from input power converter 1520 to output. While the power may be transferred, it is not necessarily output with the same waveform as it is received. For example, a DC signal may be output as a sinusoidal signal. Other power conversions can similarly be accomplished. In one embodiment, generator 1540 includes a PWM (pulse wave modulator) to generate an output waveform. Generator 1540 receives control signals and information from controller 1530, and may provide status or operations information or feedback to controller 1530. The output waveform may be either current or voltage. In one embodiment, the output is a current having a phase offset and an angular offset with respect to a load voltage waveform to enable harmonic-free output.

Converter 1502 is able to incorporate specific timing, phasing, or other frequency information, into generating the output waveform. Such timing, phasing, or other frequency information may be referred to as "input synchronization data." In one embodiment, such input synchronization data arrives from real-time load information, in which case it may be referred to as "load synchronization input." The load synchronization input or input synchronization data indicates information necessary to determine the synchronization signal discussed above. Such information is indicated in converter 1502 as output sync 1514. In a system where the output is anticipated (e.g., connecting to an electrical grid), certain voltage, timing, or other information may be expected (e.g., 120V at 60 Hz), and an initial estimate programmed in or made by the system at startup. Based on load synchronization data, the initial estimate may be adjusted.

Controller 1530 also measures output feedback 1516 off power path 1510, to determine the actual output generated by generator 1540. The actual output is compared to an ideal reference to determine if the desired output is being generated. In one embodiment, output feedback 1516 is an abstraction to represent output measurement by controller 1530, and does not include separate components in itself. In one embodiment, output feedback 1516 includes a sampling mechanism or other data selection mechanism to compare to the ideal reference signal. The ideal reference signal can be an idealized representation of a desired output waveform. The output converges on the idealized waveform rather than on the target waveform of the load or grid itself. If output feedback 1516 includes components separate from controller 1530, it may be driven by controller 1530, and receive comparison data from controller 1530 and provide error or feedback information. In one embodiment, output feedback 1516 is understood to include at least hardware components necessary for a feedback control process to interface with the output lines. Additionally, output feedback 1516 may include other hardware for performing measurements, computations, and/or performing processing.

Both output sync 1514 and output feedback 1516 may be considered feedback loops. It will be understood that output sync 1514 and output feedback 1516 are not the same thing, and serve different purposes. Output sync 1514 indicates what the ideal reference signal should look like, as stored in reference waveform table 1532. Output feedback 1516 indicates how the actual output varies from the reference signal. Update table 1534 represents data generated in response to output feedback 1516. In one embodiment, output sync 1514 is based on voltage information on the output of power path 1510, while output feedback 1516 is based on output current generated at the output of power path 1510.

Based on output sync 1514 (or based on an initial estimate of the output sync), converter 1502 stores and/or generates reference waveform table 1532, which represents an ideal form of the output waveform desired to be generated by generator 1540. Reference waveform table 1532 may be stored as a table or other set of points (or setpoints) that reflect what the output waveform "should" look like. The reference waveform can be any periodic waveform. In one embodiment, the reference waveform is represented as a series of points that have an amplitude and a position. Thus, converging on the reference waveform can include driving an output waveform generator to match sampled output points to the setpoints representing the reference waveform. Reference waveform table 1532 may alternatively be referred to as a reference waveform source.

Based on output feedback 1516, converter 1502 generates update table 1534. Update table 1534 includes entries or points to indicate how to modify the operation of generator 1540 to provide an output more closely matching the waveform of reference waveform table 1532. While indicated as a table, update table 1534 may be a stored table that is modified at certain intervals (e.g., each entry is updated as necessary to reflect measured error data), or may be generated newly at each update interval. Update table 1534 may alternatively be referred to as an update data source. The "updates" may be modifications of old values, the replacement of values, or may be stored in different locations within a memory accessed by controller 1530. In one embodiment, each value of update table 1534 indicates an "up," "down," or no change for each of a set of points. Such values are applied to the hardware that controls the output of generator 1540 to cause the output signal to converge on the desired ideal waveform.

From one perspective, converter 1502 can be viewed as having five features or components. While these features are depicted in system 1500 via certain block diagrams, it will be understood that different configurations and a variety of different components can be used to implement one or more of these features. For purposes of discussion, and not by way of limitation, these features are described following with references such as "Feature 1," "Feature 2," and so forth. It will be understood that such a convention is merely shorthand to refer to the subject matter of the described feature or component, and does not necessarily indicate anything with respect to order or significance.

Feature 1 may include means for incorporating specific timing, phasing or other frequency information. The means includes hardware and/or software to generate and receive the input synchronization data or load synchronization input referred to above, which is based on output sync 1514. Feature 2 includes reference waveform table 1532, which may include a table of data or an equation within software that represents the ideal form of output waveform 1508. Feature 3 includes controller 1530, which may be or include a software algorithm that compares the actual output waveform generated by generator 1540 with the ideal tabular representation as represented by reference waveform table 1532. Feature 4 includes an algorithm within controller 1530 that computes or otherwise selects and generates update data represented by update table 1534. Feature 5 includes generator 1540 that uses the update data from update table 1534 to generate output waveform 1508 of the desired shape, proportion, timing, and phase.

With regard to Feature 1, the specific timing, phasing, or other frequency information provides synchronization information to the comparison and update algorithms in controller 1530. The information may come by way of a table, equation, sampling of real-time hardware monitored signals, or other source.

With regard to Feature 2, the data representing the reference waveform, can be of any length and of any format, integer or non-integer, if within a table. Such a table may be generated dynamically at runtime or be hard-coded at compile time. The ideal form of the waveform represented may be sinusoidal or non-sinusoidal. The waveform may be represented by data values evenly spaced in the time domain or non-evenly spaced, forward in time or backward in time or any mix thereof. The waveform could alternatively be represented by data values in the frequency domain, and organized in any fashion. The data may be compressed or non-compressed. The data may be represented by an equation rather than computed data setpoints, or part by an equation and part by a table. In one embodiment, the stored setpoints in a table are the computed results of an equation. The data may be altered during processing at runtime to change the form of the ideal waveform to a different ideal. The values in reference waveform table 1532 can be modified or replaced with different values if altered at runtime. The data may be aligned to be in exact phase with the input waveform or it may be shifted in phase.

With regard to Feature 3, controller 1530 may include any traditional or standard comparison algorithm. A control algorithm compares data values representing the output waveform, sampled by hardware, and transformed into software data values through standard or non-standard sampling techniques. In one embodiment, the controller compares the ideal setpoints of the table or equation computations with the synchronization information, point by point, and generates error data, point by point. In one embodiment, the controller can process multiple points at once instead of point-by-point.

With regard to Feature 4, controller 1530 includes a selection algorithm which creates or generates new data using any standard or non-standard technique. In one embodiment, the selection algorithm involves performing calculations. Alternatively, the selection algorithm may simply select data without performing processing or performing calculations. The selection algorithm may replace data values in a table of setpoints, or leave the data values in the table preferring to use another storage area. The selection algorithm may transform the data from the time domain to the frequency domain and vice-versa as part of its selection process. The algorithm provides an error update mechanism (e.g., algorithm) in that it identifies data values that will correct the output waveform when applied. Thus, the output waveform after application of the data values appears more like the preferred ideal waveform.

With regard to Feature 5, the new data values represented by update table 1534 are applied to hardware in generator 1540 through standard processes to drive the generation of the output waveform. In one embodiment, the new data values are applied via a PWM mechanism or any other mechanism that transforms discrete data values into an analog output form.

Figure 16:
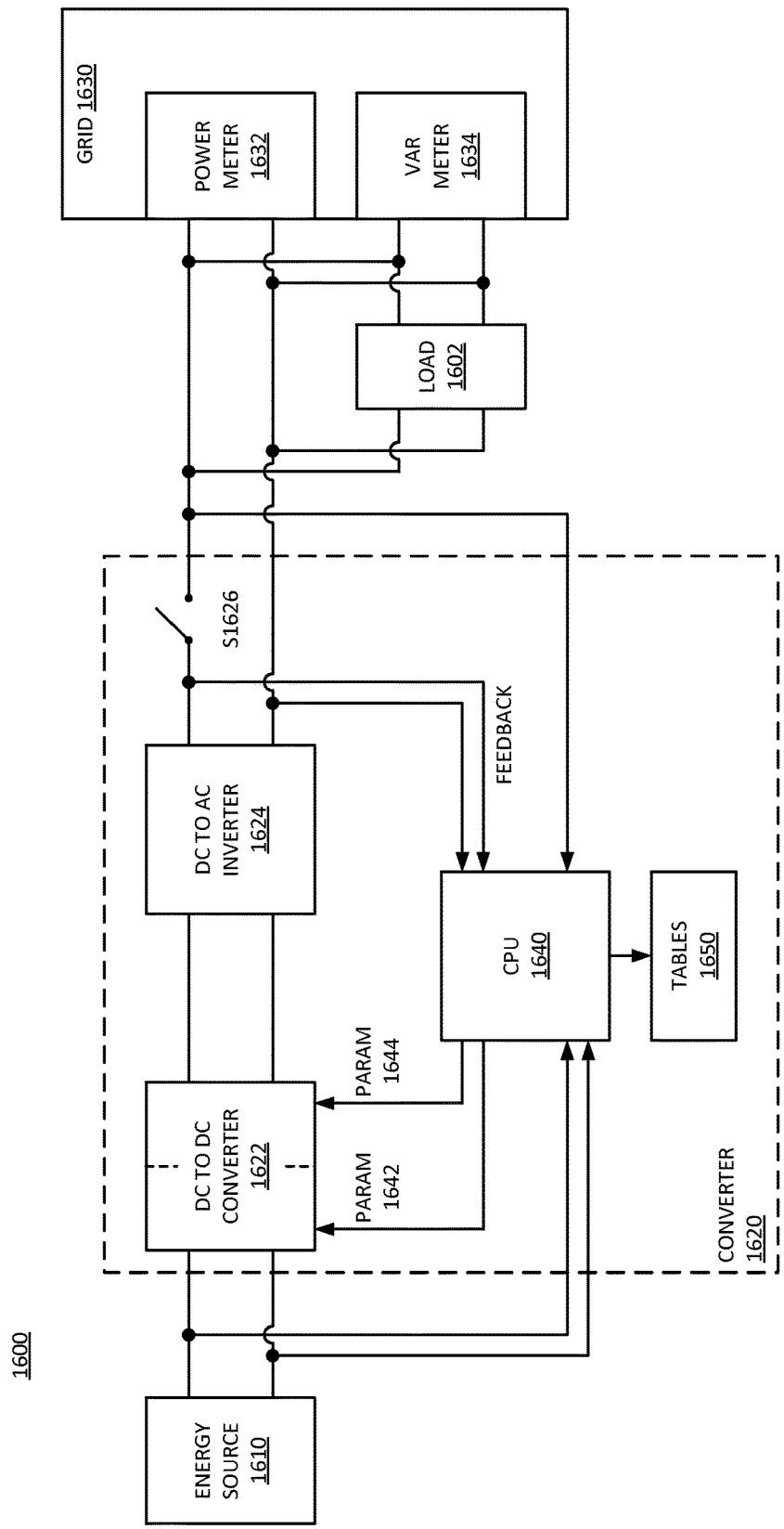
FIG. 16 is a block diagram of an embodiment of a system that transfers power from a local source to a grid-tied load with power factor conditioning.

FIG. 16 is a block diagram of an embodiment of a system that transfers power from a local source to a grid-tied load with power factor conditioning. System 1600 illustrates a grid-tied converter that couples to an energy source, a load, and a grid. Converter 1620 of system 1600 represents a converter for a control node, which can be in accordance with any embodiment described herein. System 1600 represents a power system that includes metastable energy source 1610, converter 1620, load 1602, and utility power grid 1630. Load 1602 represents a consumer tied to grid 1630. Grid 1630 can be any embodiment of a grid network described herein. Metastable source 1610 (e.g., solar cells/array, wind power generator, or other time-varying or green power source) and converter 1620 are local to load 1602, as being on a same side of a PCC, and provide power to the load. In one embodiment, metastable source 1610 produces a variable/unstable source of DC power. The source may be time-varying and/or change in available power due to environmental conditions. Converter 1620 represents a dynamic power extractor and inverter apparatus.

Source 1610 is a variable or unstable power source. System 1600 includes converter 1620, which includes DC/DC converter 1622, coupled to DC/AC inverter 1624, both of which are coupled to and controlled by controller (CPU) 1640. Additionally, switching device S1626 (e.g., a relay) selectively connects the inverter to load 1602 and grid 1630. Under normal operation, DC power is drawn from source 1610, and extracted, inverted, and dynamically treated by converter 1620, to dynamically produce maximum AC current relatively free of harmonic distortion and variability, and at a desired phase with respect an AC voltage signal from grid 1630. Putting the generated AC current in phase with the grid AC voltage produces AC power with a power factor at or near unity to load 1602, meaning that all reactive power drawn by the load comes from grid 1630. If source 1610 produces enough energy to satisfy the real power requirements of load 1602, converter can cause the only AC power drawn from grid 1630 by the load to be exclusively or nearly exclusively reactive power. When source 1610 is unable to produce DC power sufficient to completely satisfy the power demand from load 1602, converter 1620 can adjust an interface to allow real power to flow from grid 1630 to load 1602.

In one embodiment, converter 1620 can generate AC current intentionally out of phase to a certain extent with respect to the AC voltage signal of the grid. Thus, the single converter 1620 can deliver power at any desired power factor to compensate for conditions of power on power grid 1630. In one embodiment, multiple converters 1620 can operate in parallel at the same interface, and each can generate power with the same power factor, or each can be dynamically configured to produce different mixes of real and reactive power.

When energy source 1610 generates sufficient power to satisfy load 1602, the inverter current and the grid current will flow towards grid 1630. In general, power can be given back generally to the grid, and the consumer can be appropriately compensated for power provided to the grid. In one embodiment, a give back scenario can involve providing power to a neighbor consumer, in accordance with any embodiment described herein.

In one embodiment, power meter 1632 represents a meter to measure real power consumed by load 1602. In one embodiment, VAR meter 1634 represents a meter to measure the reactive power consumed by load 1602. In one embodiment, power meter 1632 and VAR meter 1634 can be combined physically and/or functionally by a meter. The meter can be on the side of grid 1630. In one embodiment, the meter (combining meters 1632 and 1634) is located with a PCC to connect to the grid, and is part of a control node with converter 1620. Such a meter can be in accordance with any embodiment described herein. In one embodiment, typically meter 1632 measures the voltage and current and computes power from those measurements. It will be understood that in the case only reactive power is drawn from grid 1630, power meter 1632 will not measure any power usage by load 1602. VAR meter 1634 can measure and compute the reactive power drawn, such as by measuring the phase of the current and voltage of the grid power at the load, and performing calculations based on the measured values.

As discussed, in one embodiment, the power factor delivered by converter 1620 to load 1602 is at or near 1.0 relative to grid 1630. Thus, converter 1620 can perform power factor correction. In one embodiment, converter 1620 can provide harmonic distortion correction. In one embodiment, converter 1620 provides table-based harmonic distortion correction. Previous harmonic distortion techniques use a hardware-based method or Fast Fourier Transform (FFT). The table-based method implemented on a processor or controller reduces cost per inverter and scales better than typical hardware implementations, and can be in accordance with what is described with reference to system 1500.

Inverter 1624 of converter 1620 generates output in accordance with a desired power factor (unity or otherwise). In one embodiment, inverter 1634 monitors the operating conditions at the point of connection to load 1602, and provides maximum power from source 1610 dynamically and in real time with changes in the energy source and current load. Thus, if the amount of energy generated by source 1610 changes, converter 1620 can modify the output based on that source in real time. Additionally, if the resistive conditions of load 1602 (e.g., an inductive motor such as a vacuum is turned on), converter can automatically generate changes to power output to track the needs of the load. All such changes can occur in realtime as conditions vary. In one embodiment, converter 1620 can provides output adjustments that provide total harmonic distortion control for harmonic distortion more efficiently than what is required by standards, thus complying with standards and improving performance of the system by dynamically adjusting to variable and unstable power sources, and to a changing load.

It will be understood that if the output voltage and current of converter 1620 are matched in phase with each other and with the voltage on the grid (e.g., through a phase lock loop, or through a power generation sampling and feedback mechanism), any reactive power necessary will be absorbed from the grid. The more real power provided by source 1610, the further out of phase the grid voltage and the grid current will be locally at load 1602. If all real power is provided locally, the current and voltage of the grid will be 90 degrees out of phase locally at load 1602, causing the grid real power contribution to fall to 0 (recall that Preal= (Vmax*Imax/2)cos(Vphase−Iphase)).

In one embodiment, DC to DC converter 1622 of power converter 1620 includes input and output portions, as represented by the dashed line separating the device into two portions. The portion coupled to source 1610 can be referred to as an input portion, and the portion coupled to DC to AC inverter 1624 can be referred to as the output portion. In one embodiment, the operation of converter 1622 is to vary input impedance and output impedance to transfer energy from source 1610 to inverter 1624. In one embodiment, converter 1622 can be referred to as a power extractor.

Converter 1622 can impedance match to change an interface on the input to maximize energy transfer from source 1610 without fixing the voltage or current to specific values. Rather, the input can allow the power to float to whatever voltage is produced by source 1610, and the current will match based on whatever total power is produced. Similarly, on the output, converter 1622 impedance matches to change an output interface to allow the load (in this case, inverter 1624) to draw whatever power is needed at whatever voltage the inverter operates at. Thus, the output of converter 1622 can float to match the voltage of inverter 1624, and generate current to match the total power. Converter 1622 can generate an output current waveform, where the magnitude is determined by how much energy is available, and whatever voltage inverter 1624 is at. Thus, the output floats to match the load, and is not fixed at current or voltage. An internal node within converter 1622 can act as an energy reservoir, where the input impedance matching enables the efficient charging of the internal node, and the output impedance matching enables the load to draw energy from the internal node. The input and output both couple to the internal node via inductors and/or transformers to isolate the input and output from each other and from the internal node.

Controller 1640 can monitor the AC current, which moves out of DC/AC inverter 1624, and the generated voltage of grid 1630, which appears across load 1602. Controller 1640 controls at least one electrical parameter of the interfaces of converter 1622 to control its operation. Parameters 1642 and/or 1644 represent control from controller 1640 to control the operation of converter 1622 within converter 1620. In one embodiment parameters 1642 and/or 1624 may be a duty cycle of a switching signal of the power extraction, which changes input and/or output impedance matching, which in turn controls the charging and drawing from the internal node. The modification of each parameter can be dependent on the quality of the monitored current and voltage. Controller 1640 further controls switching device S1626 to couple the load to power produced (by converter 1622 and inverter 1624 from source 1610), when suitably conditioned power is available for use by load 1602.

In one embodiment, converter 1620 includes tables 1650, which provides a table-based method for controlling power factor, to adjust the operation of converter 1620 to generate reactive power as desired. The tables may include entries that are obtained based on input conditions measured from the system, to achieve a desired mix of real and reactive power. Feedback from the grid-tied node may include voltage zero crossing, voltage amplitude, and current waveform information. With such information, controller 1640 uses tables 1650 to adjust the operation of converter 1622 and/or inverter 1624. The tables may include setpoints that provide idealized output signals the system attempts to create. By matching output performance to an idealized representation of the input power, better system performance is possible than simply attempting to filter and adjust the output in traditional ways.

In one embodiment, system 1600 can be applied without a specific energy source 1610. For example, converter 1620 can be coupled to receive power from grid 1630, and generate an output to load 1602 that provides whatever mix of real and reactive power is needed by load 1602. In one embodiment, converter 1622 can be adjusted to receive AC input. In one embodiment, a connection to converter 1622 can be configured with hardware to generate DC power from the grid, such as an AC to DC converter. However, it will be understood that such conversion cause some inefficiency. In one embodiment, converter 1622 can be implemented with an input transformer that will enable connection between grid power and the internal node.

Figure 17:
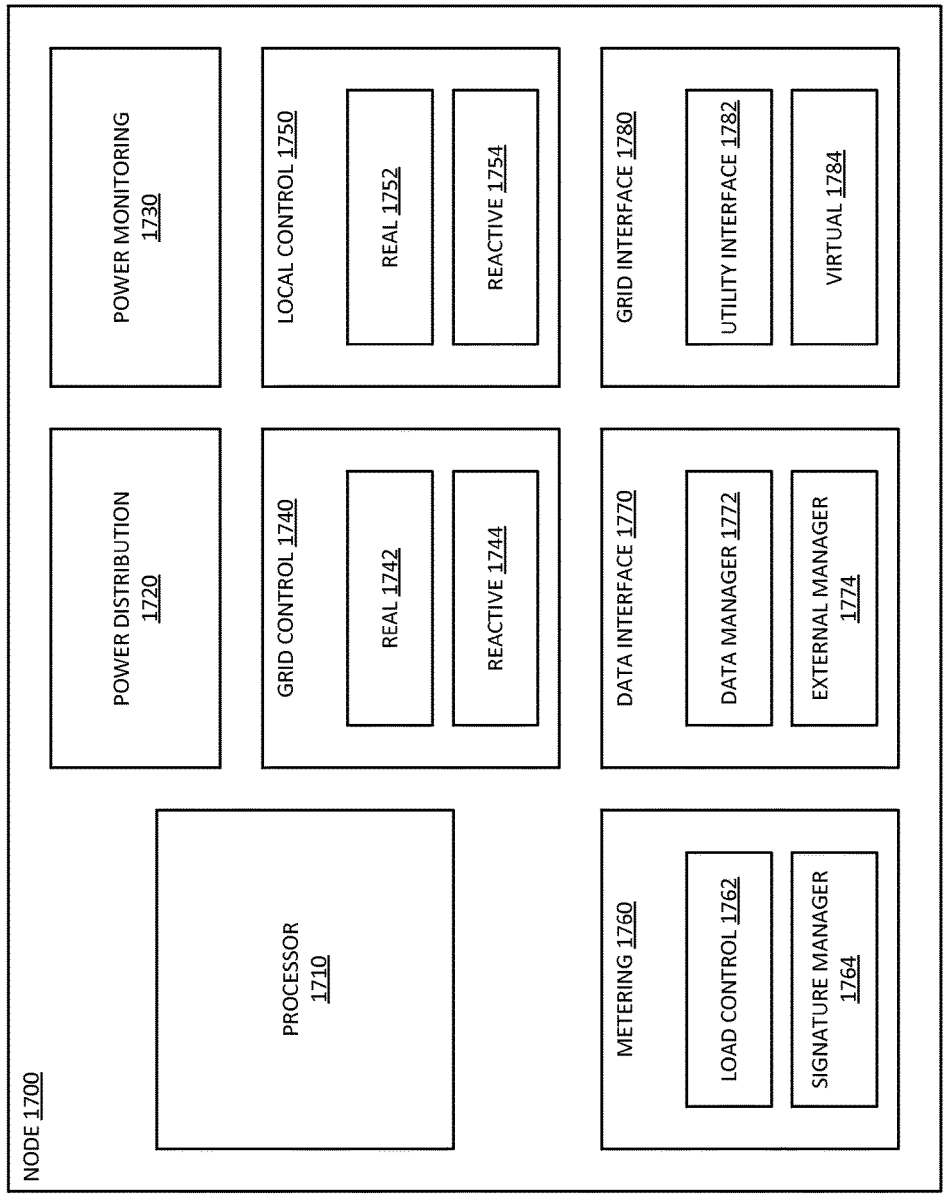
FIG. 17 is a block diagram of an embodiment of a node for a distributed power grid.

FIG. 17 is a block diagram of an embodiment of a node for a distributed power grid. Node 1700 represents a control node, and can be an example of a control node in accordance with any embodiment described herein. Node 1700 includes various hardware elements to enable its operation. In general, the hardware can be described as processor 1710, power distribution hardware 1720, and power monitoring hardware 1730. Each of these elements can include specific types and functionality of hardware, some of which can be represented by other elements of FIG. 17.

Processor 1710 represents one or more controllers or processors within node 1700. In one embodiment, node 1700 includes a power meter, a power converter, and control hardware to interface the two elements and couple to the grid. In one embodiment, each separate item includes a controller, such as a controller within the metering device, and a controller within the power converter. The power converter can include a power extractor controller, an inverter controller, and another controller to manage them. Thus, controller 1710 can represent multiple controllers or elements of control logic that enables node 1700 to monitor and distribute power.

Processor 1710 manages and controls the operation of hardware within node 1700, including any hardware mentioned above. Processor 1710 can execute to provide MGI (modern grid intelligence) for node 1700. In one embodiment, processor 1710 executes logic to provide at least some of the functions described with respect to node 1710. To the extent that functions described are provided by hardware, processor 1710 can be considered a controller to control the operation of the hardware. In one embodiment, processor 1710 executes a control node operating system for node 1700. In one embodiment, the operating system is MGIOS (Modern Grid Intelligent Operating System). MGIOS can provide capabilities and benefits including at least some of the following.

The MGIOS can provide computing, and general control over the operation of node 1700. In one embodiment, the MGIOS enables the node to collect data and make decisions to send data outside the node. In one embodiment, the MGIOS can use the data to control the local system, such as the local elements coupled to a same side of a PCC. In one embodiment, the MGIOS also sends data for use by external entities, such as a utility manager and/or other nodes in the grid network.

In one embodiment, the MGIOS controls dispatch functionality for node 1700. The dispatching can include providing and receiving data and especially alerts used to determine how to distribute power. In one embodiment, the MGIOS can enable autonomous dispatching, which allows the nodes of the grid network to share information among themselves that control the operation of the grid. The autonomous dispatching refers to the fact that a central grid operator does not need to be involved in generating or distributing the dispatch information.

In one embodiment, the MGIOS enables control functionality. The control can be by human, cloud, and/or automated control logic. In one embodiment, the MGIOS enables node 1700 to work independently as an individual node and/or work in aggregate with other control nodes in a grid network. The independent operation of each can enable the distributed network to function without a central power plant, and/or with minimal central grid management.

In one embodiment, the MGIOS can enable blackstart operation. Blackstart operation is where node 1700 can bring its segment of the grid back up online from an offline state. Such operation can occur autonomously from central grid management, such as by each node 1700 of a grid network independently monitoring conditions upstream and downstream in the grid network. Thus, node 1700 can come online when conditions permit, without having to wait for a grid operator to control distribution of power down to the node. Node 1700 can thus intelligently bring its node segment back up online by controlling flow of power to and from the grid, and can thus, prevent startup issues.

In one embodiment, the MGI enables node 1700 to offer multiple line voltages. In one embodiment, grid interface 1780, which may be through control logic of processor 1710, can be configured for multiple different trip point voltages. Each trip point voltage can provide a different control event. Each control event can cause processor 1710 to perform control operations to adjust an interface of the control node. The interface can be an interface to a load and/or an interface to the grid network.

In one embodiment, the MGI can economize interconnects within the grid network. In one embodiment, node 1700 controls backflow onto the grid network by limiting the backflow, and/or adjusting output to change a type of power presented to the grid. In one embodiment, node 1700 provides utility control functions that are traditionally performed by utility grid management that controls flow of power from a central power plant. Node 1700 can provide the grid control functions to enable a distributed power grid.

Power distribution hardware 1720 includes power lines, connectors, phase locked loops, error correction loops, interface protection or isolation such as transformers, and/or other hardware that enables the control node to transfer energy from one point to another, to control interfaces to control how power flows throughout the grid, or other operations. In one embodiment, a power converter can be included within the power distribution hardware. A power converter can be a smart inverter or microinverter, and can be in accordance with what is described with respect to systems 1500 and 1600.

Power monitoring hardware 1730 includes connectors, signal lines, sampling hardware, feedback loops, computation hardware, and/or other hardware that enables the control node to monitor one or more grid conditions and/or load conditions. The grid conditions can be or include voltage levels, phases, frequencies, and other parameters of the grid operation. The load conditions can be or include voltage, current, phase, frequency, and other parameters of power demand from loads.

In one embodiment, node 1700 includes grid control 1740. Grid control represents hardware and logic (e.g., such as software/firmware logic, configurations) to control an interface to the grid network. In one embodiment, grid interface 1780 represents grid network interfaces. Grid control 1740 can include real power control 1742 and reactive power control 1744. The real and reactive control can be in accordance with any embodiment described herein. In one embodiment, real power control 1742 includes logic (hardware and/or software) to provide real power to the grid. In one embodiment, reactive power control 1744 includes logic to provide reactive power to the grid. Providing power to the grid can include changing an interface to cause power of the type and mix desired to flow to the grid.

In one embodiment, node 1700 includes local control 1750. Local control represents hardware and logic (e.g., such as software/firmware logic, configurations) to control an interface to the load or to items downstream from a PCC coupled to a grid network. Local control 1750 can include real power control 1752 and reactive power control 1754. The real and reactive control can be in accordance with any embodiment described herein. In one embodiment, real power control 1752 includes logic (hardware and/or software) to provide real power to a load. In one embodiment, reactive power control 1754 includes logic to provide reactive power to a load. Providing power to the load can include changing an interface to cause power of the type and mix desired to flow to the load from a local energy source and/or from the grid.

It will be understood that a utility power grid has rate structures that are based on not just the amount of use, but the time of use. For example, a utility grid can have tiered rates. In one embodiment, processor 1710 includes rate structure information that enables it to factor in rate structure information when making calculations about how to change an interface with grid control 1740 and/or with local control 1750. Factoring in rate structure information can include determining what type of power (real or reactive) has more value in a given circumstance. Thus, processor 1710 can maximize value of energy production and/or minimize the cost of energy consumption. In an implementation where tiered rate structures exist, processor 1710 can instruct grid control 1740 and/or local control 1750 based on how to keep consumption to the lowest tier possible, and how to provide power at a highest rate possible. In one embodiment, processor 1710 takes into account utility or grid network requirements when controlling the operation of grid control 1740 and/or local control 1750. For example, the grid may have curtailments or other conditions that affect how power should be provided and/or consumed. In one embodiment, node 1700 can adjust power output as loads dynamically come online and offline. For example, local control 1750 can reduce output when loads go offline, and can increase output when load come online.

Metering 1760 represents metering capability of node 1700, and can include a meter in accordance with any embodiment described herein. In one embodiment, metering 1760 can include load control metering 1762. Load control 1762 can include logic to monitor load power demand. In one embodiment, metering 1760 can include signature manager 1764. Signature manager 1764 includes logic to create, store, and use energy signatures in monitoring what is happening with loads. More specifically, signature manager 1764 can manage energy signatures including complex current vectors in accordance with any embodiment described herein.

Traditionally, a net energy meter was required to connect to the grid. However, newer regulations may prevent connecting to the grid at all unless certain capabilities are met. Metering 1760 can enable node 1700 to control an inverter or converter to respond to specific loads and/or to specific energy signatures identified on the line. Based on what metering 1760 detects, node 1700 can provide realtime control over energy production and load consumption.

In one embodiment, node 1700 includes data interface 1770. In one embodiment, data interface 1770 includes data manager 1772 to control data that will be sent to a data center or data management, and data that is received from the data center or data management. Data manager 1772 can gather data by making a request to a data center or comparable source of data. In one embodiment, data interface 1770 includes external manager 1774, which can manage the interface with a data center, central grid management, other nodes in the grid network, and/or other data sources. In one embodiment, data manager 1772 receives data in response to data sent from a data source. In one embodiment, external manager 1774 makes a request for data from a data source. The request can be in accordance with any of a number of standard communication protocols and/or proprietary protocols. The medium for communication can be any medium that communicatively couple node 1700 and the data source. In one embodiment, external manager 1774 communicates with a data source at regular intervals. In one embodiment, external manager 1774 communicates with the data source in response to an event, such as more data becoming available, whether receiving indication of external data becoming available, or whether data manager 1772 indicates that local data is ready to send. Data interface 1770 can enable realtime data for market use. In one embodiment, data interface 1770 provides data collection, which can be used in one embodiment to identify currents for energy signatures.

In one embodiment, node 1700 includes grid interface 1780. In one embodiment, grid interface 1780 includes utility interface 1782 to interface with a utility grid. In one embodiment, grid interface 1780 includes virtual interface 1784 to interface with a distributed grid network. The operation of the grid interface can be referred to as MGI (modern grid intelligence), referring to execution of an MGIOS by processor 1710. Grid interface 1780 can include any type of interface that couples node 1700 to grid infrastructure, whether traditional utility grid infrastructure and/or distributed grid networks. In one embodiment, grid interface 1780 can enable node 1700 to know a power direction. In one embodiment, the grid network provides dispatch information, such as provide a signal from a feeder to indicate a power direction. Node 1700 can manage its operation based on the direction of power flow in the grid network. Grid interface 1780 can also dynamically monitor changes in direction of power flow.

In one embodiment, the MGIOS enables node 1700 to adjust operation of one or more elements connected downstream from a PCC, to scale back operation of the grid. Consider an example of air conditioners coupled downstream from a PCC. In one embodiment, the MGIOS can detect that the grid network is experiencing heavy load, and can determine to slow down all air conditioners to relieve the grid for 5 to 10 minutes. Thus, the devices do not need to be stopped, and the grid does not need to shut off power to any segment. Instead, the power can be reduced for a period of time to selected loads to allow the grid can recover itself. Thus, the MGIOS can control the load and/or the sources. Such operation can reduce or prevent brownouts or rolling blackouts, for example, by scaling power demand back instead of completely shutting supply down.

It will be understood that node 1700 requires a certain amount of power to operate. The power consumed by node 1700 can be referred to as tare loss, which indicates how much power the controlling devices consume when the node is not generating power. In one embodiment, node 1700 includes a sleep feature to reduce tare loss. For example, a node that controls a metastable energy source such as solar can sleep when there is no sun, and can wake up when the sun comes up. In one embodiment, the node can default to a low power state and awake in response to a signal from a solar detector, power over Ethernet, or some other external signal trigger to wake it up. In one embodiment, a node can wake up during a sleep cycle at night to perform upgrades or perform other ancillary services.

Figure 18:
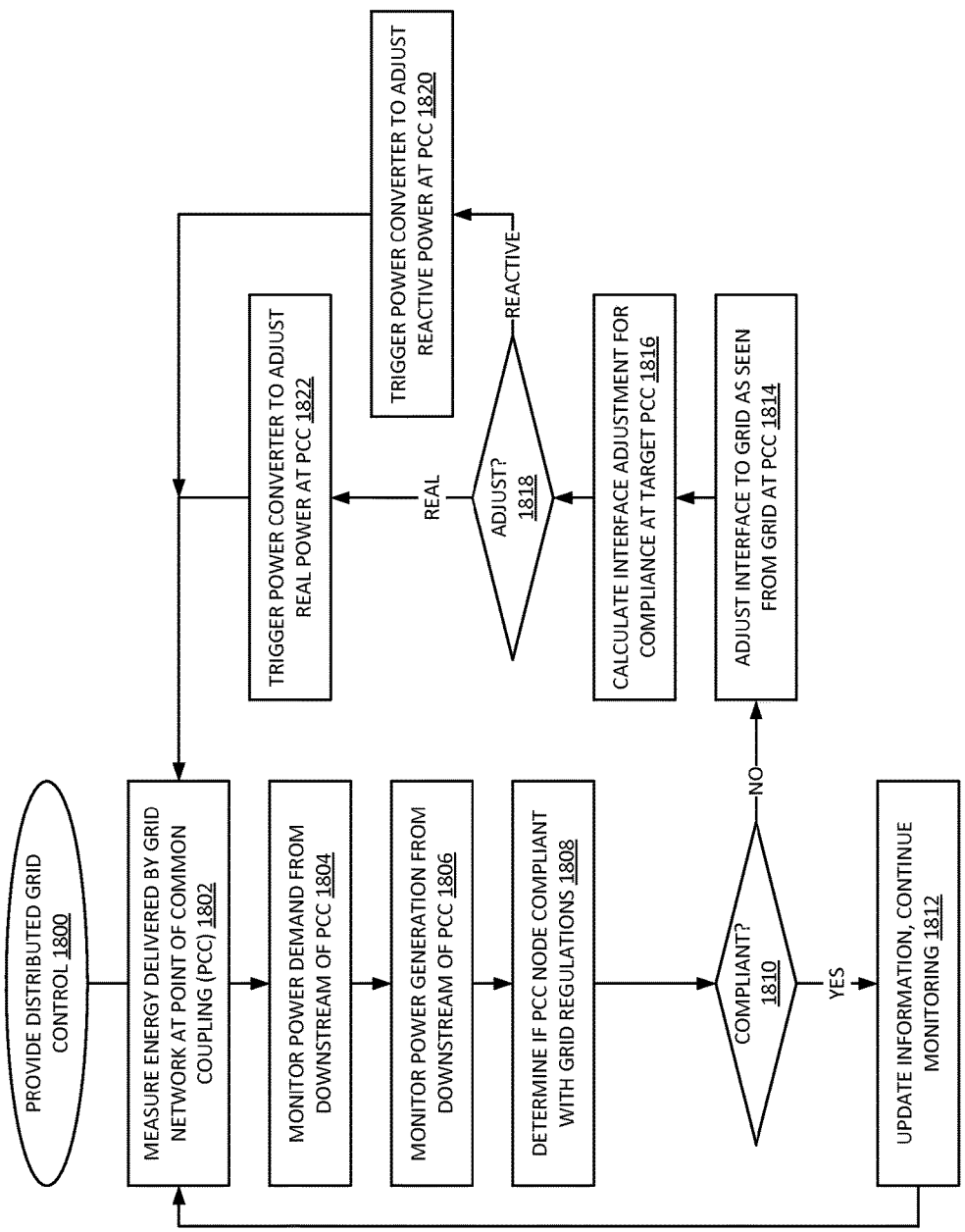
FIG. 18 is a flow diagram of an embodiment of a process for providing distributed grid control.

FIG. 18 is a flow diagram of an embodiment of a process for providing distributed grid control. In one embodiment, process 1800 for providing distributed grid control includes operations performed by an embodiment of a metering device and/or a power converter. In one embodiment, a control node includes metering functionality and measures energy delivered by a grid network at a PCC, 1802. The grid network can be any grid network described herein. In one embodiment, the grid network includes a utility power grid or includes a connection to a utility power grid. The measuring can be in accordance with any embodiment described herein. In one embodiment, the control node monitors power demand from downstream of the PCC, 1804. In one embodiment, the downstream devices include local energy sources, or other power sources, and the control node monitors power generation from downstream of the PCC, 1806. The energy sources can be local energy sources on a customer premises, and/or can include neighborhood power sources that are within a neighborhood.

In one embodiment, the control node determines if network node of the PCC is compliant with grid regulations, 1808. The grid regulations can include restrictions on over-voltage conditions (such as magnitude of over-voltage and/or timing of the voltage), waveform shape, frequency, power factor, and/or other conditions. The control node can include regulation controls configured into a controller and/or stored for use by a controller of the control node. The regulations can include parameters sent to the control node by the grid network.

In one embodiment, if the PCC node is compliant, 1810 YES branch, the control node can update information and continue monitoring, 1812. The continuing monitoring can resume at 1802. In one embodiment, updating information can include generating log or report information for storage locally and/or for transmission to the grid network. In one embodiment, the updating information can include sending data to a central data center for the grid network, which can include information shared by other nodes. In one embodiment, the control node accesses data from the data center to determine conditions of other nodes on the grid network. While compliance with regulations at the PCC node can be independent of other nodes in the grid network, in one embodiment, a control node can make a determination to adjust its operation based on lack of compliance by another node in the grid network.

Thus, whether by its own failure to comply with grid regulations, or a failure of another node to comply with grid regulations, in one embodiment, the control node determines there is a lack of compliance on the grid network that can be affected by control of operation at the PCC, 1810 NO branch. In one embodiment, the control node determines to adjust an interface to the grid as seen from the grid at the PCC, 1814. Controlling an interface can include changing electrical conditions as seen at the PCC from the grid network side of the PCC (e.g., looking back into the PCC). The electrical conditions as seen from the grid side of the interface are not necessarily the same as what would be seen from within the PCC, because of how the connection to the network affects how power flows through the PCC. The controlling of the interface refers to controlling how power flows through the PCC. The controlling can include changing operation at the PCC itself with a control node and/or changing operation of one or more downstream control nodes to change power flow throughout the PCC, which will change the aggregate effect of power flow through the PCC between the network segment and the grid network.

In one embodiment, the control node determines how to adjust the interface to the grid for compliance. Again, in one embodiment, the compliance can be at a different node of the grid network via dynamic control at the local PCC node for support of a different PCC node. Thus, the control node can calculate adjustments to make to the local interface for compliance at the target PCC, 1816. In one embodiment, the target PCC is the local PCC node. In one embodiment, the target PCC is an upstream PCC node (meaning upstream in the hierarchy). In one embodiment, the target PCC is a node closer to a power plant of a utility grid, and can thus be considered upstream in the utility grid. In one embodiment, the target PCC is a node further from a power plant of a utility grid, and can thus be considered downstream in the utility grid, even though it is not downstream within the local PCC node. Downstream and upstream can thus have two meanings, where upstream in the grid refers to nodes that are closer or farther from a utility power plant. Downstream and upstream with respect to a PCC can refer to anything coupled to the PCC from lower in the distributed grid hierarchy (downstream) or any node further up the distributed grid hierarchy (upstream). Thus, upstream in a traditional grid sense refers to closer to a power plant, and upstream in a distributed grid refers to a higher level of hierarchical, distributed control. Likewise, downstream in a traditional grid sense refers to further from a power plant, and downstream in a distributed grid refers to a lower level of hierarchical, distributed control.

If the control node is to adjust its local reactive power, 1818 REACTIVE branch, the control node can trigger a power converter to adjust its reactive power output and/or demand to affect the local PCC, 1820. In one embodiment, the converter can adjust reactive power generation from local energy sources. In one embodiment, the converter can adjust reactive power consumption relative to the loads. In one embodiment, adjusting reactive power can refer to adjust a current waveform with respect to a complex current vector. If the control node is to adjust its local active power, 1818 REAL branch, the control node can trigger the power converter to adjust real power output or demand to adjust the local PCC, 1822. In one embodiment, the power converter adjusts both real and reactive power at the PCC. After adjustment the control node can resume monitoring its operation at 1802.

In one aspect, method for controlling a power grid includes: monitoring power generation and power demand at a point of common coupling (PCC) to a utility power grid with a control node, on a same side of the PCC as the power generation and power demand, and on an opposite side of the PCC as central grid management; and adjusting an interface between the control node and the central grid management via the PCC to maintain compliance with grid regulations at the PCC.

In one aspect, an apparatus for controlling a power grid includes: a grid connector to couple to the power grid at a point of common coupling (PCC) for a consumer node; a controller to monitor power generation and power demand at the PCC on a side of the PCC of the consumer node; and a power converter to adjust an interface between the apparatus and central grid management via the PCC to maintain compliance with grid regulations at the PCC from the side of the PCC of the consumer node.

In one aspect, a power metering device includes: a grid connector to couple to the power grid at a point of common coupling (PCC) for a consumer node; a controller to monitor power generation and power demand at the PCC on a side of the PCC of the consumer node; and I/O (input/output) to connect to a power converter, the controller to send one or more signals via the I/O to the power converter to cause the power converter to adjust an interface between the apparatus and central grid management via the PCC to maintain compliance with grid regulations at the PCC from the side of the PCC of the consumer node in response to monitoring by the power metering device.

For the method, the apparatus, and/or the power metering devices of the preceding three paragraphs, the following embodiments provide examples of embodiments that can apply, and are illustrative, but not limiting. In one embodiment, the PCC comprises a connection of a customer premises to the grid. In one embodiment, the PCC comprises a connection to the grid of a neighborhood containing multiple customer premises. In one embodiment, the PCC comprises a transformer of the grid. In one embodiment, the PCC includes at least one additional PCC downstream from the grid. In one embodiment, monitoring the power generation comprises monitoring power generated by a renewable energy source at a customer premises. In one embodiment, adjusting the interface comprises adjusting a phase offset of reactive power at the PCC. In one embodiment, adjusting the phase offset of the reactive power comprises changing an amount of reactive power output via the PCC to the grid from power generation resources on the same side of the PCC. In one embodiment, adjusting the interface comprises adjusting an amount of real power output via the PCC to the grid from power generation resources on the same side of the PCC. In one embodiment, monitoring comprises receiving dispatch information from the grid management.

In one aspect, a method for grid control includes: measuring, with a metering device, energy delivered by a grid network at a point of common coupling (PCC) to which a load is coupled, where the metering device is located on a same side of the PCC as the load; determining that the load draws reactive power from the grid network; drawing real power from the grid network with an energy conversion device on the same side of the PCC as the load and the metering device; and converting, with the energy conversion device, the real power from the grid network into reactive power on the same side of the PCC to deliver to the load.

In one aspect, a distributed control node within a power grid system includes: a grid connector to couple a load to grid network; a metering device located on a same side of a point of common coupling (PCC) to the grid network as the load, the metering device to measure energy delivered by a grid network at the PCC, and determine that the load draws reactive power from the grid network; and an energy conversion device on the same side of the PCC as the load and the metering device to draw real power from the grid network in response to an indication from the metering device, and convert the real power from the grid network into reactive power on the same side of the PCC to deliver to the load.

In one aspect, a power grid system includes: multiple loads electrically coupled to a same side of a point of common coupling (PCC); and a control node coupled to the multiple loads at the PCC, the control node including a metering device to measure energy delivered by a grid network at the PCC, and determine that at least one of the loads draws reactive power from the grid network; and an energy conversion device to draw real power from the grid network in response to an indication from the metering device, and convert the real power from the grid network into reactive power on the same side of the PCC to deliver to the at least one load.

For the method, the distributed control node, and/or the power grid system of the preceding three paragraphs, the following embodiments provide examples of embodiments that can apply, and are illustrative, but not limiting. In one embodiment, the grid network comprises a utility power grid. In one embodiment, the load is one of multiple loads coupled to the PCC. In one embodiment, determining that the load draws reactive power further comprises: identifying an energy signature unique to the load, the energy signature including a complex current vector for the load in operation identifying for the primary current a real power component and a reactive power component, and identifying for the harmonics a real power component, a reactive power component, and an angular displacement relative to the primary current. In one embodiment, determining that the load draws reactive power further comprises: determining whether the load requires leading or lagging reactive power; and wherein converting the real power to reactive power comprises generating either leading or lagging power based on the determining. In one embodiment, drawing real power from the grid network comprises: drawing only real power from the grid network, and supplying all reactive power needs of the load from converting the real power into reactive power. In one embodiment, the measuring power delivered at the PCC and determining that the load draws reactive power from the grid network comprises: measuring and determining in response to control information received at the metering device from a data center of the grid network. In one embodiment, measuring and determining in response to the control information received from the data center comprises receiving information from a controller of central management of a utility power grid.

In one aspect, a method for interfacing with a power grid network includes: generating local real power with a local energy source coupled to a consumer side of a point of common coupling (PCC) to the grid network; identifying a condition of the grid network that can be adjusted by providing reactive power to the grid network; converting, with an energy conversion device on the consumer side of the PCC, the real power into reactive power on the consumer side of the PCC; and delivering the reactive power to the grid network via the PCC.

In one aspect, a consumer node within a power grid system includes: a grid connector to couple the consumer node to a grid network on a consumer side of a point of common coupling (PCC); a local energy source coupled to the consumer side of the PCC to generate real power; and an energy conversion device on the consumer side of the PCC to convert the real power from the local energy source into reactive power on the consumer side of the PCC, and deliver the reactive power to the grid network via the PCC.

In one aspect, a power grid system includes: a local energy source coupled to a consumer side of a point of common coupling (PCC) to a grid network of the power grid system, the local energy source to generate real power; and a control node coupled to the local energy source at the PCC, the control node including a metering device to identify a condition of the grid network that can be adjusted by providing reactive power to the grid network; an energy conversion device to convert the real power from the local energy source into reactive power on the consumer side of the PCC, and deliver the reactive power to the grid network via the PCC.

For the method, the consumer node, and/or the power grid system of the preceding three paragraphs, the following embodiments provide examples of embodiments that can apply, and are illustrative, but not limiting. In one embodiment, the grid network comprises a utility power grid. In one embodiment, generating the local real power with the local energy source comprises generating real power output at a solar power system. In one embodiment, generating the local real power with the local energy source comprises generating real power output with an energy source of a customer premises. In one embodiment, identifying the condition further comprises measuring grid conditions at the PCC with a metering device on the consumer side of the PCC. In one embodiment, identifying the condition further comprises receiving dispatch information from a grid side of the PCC. In one embodiment, receiving the dispatch information comprises receiving dispatch information from a distributed control node of the grid network. In one embodiment, receiving the dispatch information comprises receiving dispatch information from a data center. In one embodiment, receiving the dispatch information comprises receiving dispatch information from a controller of a utility power grid. In one embodiment, converting the real power into reactive power on the consumer side of the PCC comprises converting the real power into leading reactive power. In one embodiment, converting the real power into reactive power on the consumer side of the PCC comprises converting the real power into lagging reactive power.

In one aspect, a method for grid control includes: measuring current drawn by a load, including harmonics of the current, with a metering device located on a same side of a point of common coupling (PCC) to a grid network as the load, where the load includes one of multiple different devices electrically coupled on the same side of the PCC; generating an energy signature unique to the load including recording a complex current vector for the load in operation identifying for the primary current a real power component and a reactive power component, and identifying for the harmonics a real power component, a reactive power component, and an angular displacement relative to the primary current; and controlling a noise contribution of the load due to the harmonics as seen at the PCC to reduce noise introduced onto the grid network from the load.

In one aspect, a distributed control node within a power grid system includes: a grid connector to couple a load to the power grid system, where the load includes one of multiple different devices electrically coupled on the same side of a point of common coupling (PCC); a metering device located on a same side of the PCC to the grid network as the load, the metering device to measure current drawn by a load; a controller to generate an energy signature unique to the load including recording a complex current vector for the load in operation identifying for the primary current a real power component and a reactive power component, and identifying for the harmonics a real power component, a reactive power component, and an angular displacement relative to the primary current, the controller further to control a noise contribution of the load due to the harmonics as seen at the PCC to reduce noise introduced onto the grid network from the load.

In one aspect, a power grid system includes: multiple loads electrically coupled to a same side of a point of common coupling (PCC); and a control node coupled to the multiple loads at the PCC, the control node including a metering device located on a same side of the PCC to the grid network as the loads, the metering device to measure current drawn by at least one of the loads, generate an energy signature unique to the at least one load including recording a complex current vector for the load in operation identifying for the primary current a real power component and a reactive power component, and identifying for the harmonics a real power component, a reactive power component, and an angular displacement relative to the primary current; and a power converter to control a noise contribution of the at least one load due to the harmonics as seen at the PCC to reduce noise introduced onto the grid network from the load.

For the method, the distributed control node, and/or the power grid system of the preceding three paragraphs, the following embodiments provide examples of embodiments that can apply, and are illustrative, but not limiting. In one embodiment, controlling the noise contribution from the harmonics of the load further comprises: adjusting a reactive power output component of a local energy source coupled to the same side of the PCC as the load. In one embodiment, controlling the noise contribution from the harmonics of the load further comprises: adjusting a reactive current component delivered to the load, to create a reactive current that offsets the energy signature for the load. In one embodiment, controlling the noise contribution from the harmonics of the load further comprises: reducing a frequency of an operating voltage of the load. In one embodiment, further comprising: sending current draw information about the load to a control device on the grid network that is not on the same side of the PCC as the load. In one embodiment, sending the current draw information about the load the control device comprises: sending the current drawn information to a grid controller. In one embodiment, sending the current draw information about the load the control device comprises: sending the current drawn information to a different control node of the grid network.

In one aspect, a method for monitoring power at a power grid node includes: obtaining dispatch information at a local grid control device located on a same side of a point of common coupling (PCC) to a grid network as a local load, the dispatch information indicating an electrical condition of the grid network at the PCC; identifying an energy signature unique to the local load, the energy signature including a complex current vector for the load in operation identifying for the primary current a real power component and a reactive power component, and identifying for the harmonics a real power component, a reactive power component, and an angular displacement relative to the primary current; and controlling a noise contribution of the load due to the harmonics as seen at the PCC to reduce noise introduced onto the grid network from the load.

In one aspect, a distributed control node within a power grid system includes: a grid connector to couple a load to a grid network of the power grid system, where the load includes one of multiple different devices electrically coupled on the same side of a point of common coupling (PCC); and a controller to obtain dispatch information indicating an electrical condition of the grid network at the PCC; identify an energy signature unique to the local load; the energy signature including a complex current vector for the load in operation identifying for the primary current a real power component and a reactive power component, and identify for the harmonics a real power component, a reactive power component, and an angular displacement relative to the primary current; and, control a noise contribution of the load due to the harmonics as seen at the PCC to reduce noise introduced onto the grid network from the load.

In one aspect, a power grid system includes: a load electrically coupled to a point of common coupling (PCC); and a control node coupled to the load at a same side of the PCC as the load, the control node including a controller to obtain dispatch information indicating an electrical condition of the grid network at the PCC; identify an energy signature unique to the local load; the energy signature including a complex current vector for the load in operation identifying for the primary current a real power component and a reactive power component, and identify for the harmonics a real power component, a reactive power component, and an angular displacement relative to the primary current; and a power converter to control a noise contribution of the at least one load due to the harmonics as seen at the PCC to reduce noise introduced onto the grid network from the load.

For the method, the distributed control node, and/or the power grid system of the preceding three paragraphs, the following embodiments provide examples of embodiments that can apply, and are illustrative, but not limiting. In one embodiment, obtaining the dispatch information comprises: receiving load information from another local grid control device located on the grid network on a different side of the PCC. In one embodiment, obtaining the dispatch information comprises: receiving information from a utility controller. In one embodiment, obtaining the dispatch information further comprises: receiving information indicating a node on the grid network requiring voltage support; and further comprising: determining the PCC is downstream on the grid network relative to the node of the grid network requiring voltage support; and providing positive reactive power to the grid network. In one embodiment, obtaining the dispatch information further comprises: receiving information indicating a node on the grid network requiring voltage support; and further comprising: determining the PCC is upstream on the grid network relative to the node of the grid network requiring voltage support; and providing negative reactive power to the grid network. In one embodiment, controlling the noise contribution from the harmonics of the load further comprises: adjusting a reactive power output component of a local energy source coupled to the same side of the PCC as the load. In one embodiment, controlling the noise contribution from the harmonics of the load further comprises: adjusting a reactive current component delivered to the load, to create a reactive current that offsets the energy signature for the load.

In one aspect, a method of controlling a power grid includes: determining that a segment of the power grid exceeds a saturation threshold, where a real power generation capacity of local energy sources at consumer nodes connected to the power grid segment exceeds a threshold percentage of peak real power demand for the power grid segment; and dynamically adjusting an interface between the segment of the power grid and central grid management to adjust a ratio of real power to reactive power for the segment of the power grid as seen from the central grid management.

In one aspect, an apparatus for controlling a power grid includes: a grid connector to couple to the power grid at a point of common coupling (PCC) for a segment of the power grid, wherein the segment of the power grid includes multiple consumer nodes and multiple local energy sources at consumer nodes; a controller to determine that the segment of the power grid exceeds a saturation threshold, where a real power generation capacity of the local energy sources for the power grid segment exceeds a threshold percentage of peak real power demand for the power grid segment; and a power converter to dynamically adjust an interface between the segment of the power grid and the central grid management to adjust a ratio of real power to reactive power for the segment of the power grid as seen from the central grid management.

In one aspect, a power metering device includes: a grid connector to couple to the power grid at a point of common coupling (PCC) for a segment of the power grid, wherein the segment of the power grid includes multiple consumer nodes and multiple local energy sources at consumer nodes; a controller to determine that the segment of the power grid exceeds a saturation threshold, where a real power generation capacity of the local energy sources for the power grid segment exceeds a threshold percentage of peak real power demand for the power grid segment; and I/O (input/output) to connect to a power converter, the controller to send one or more signals via the I/O to the power converter to cause the power converter to dynamically adjust an interface between the segment of the power grid and the central grid management to adjust a ratio of real power to reactive power for the segment of the power grid as seen from the central grid management.

For the method, the apparatus, and/or the metering device of the preceding three paragraphs, the following embodiments provide examples of embodiments that can apply, and are illustrative, but not limiting. In one embodiment, determining that the power grid segment exceeds the saturation threshold comprises receiving dispatch information at a control node for the power grid segment from the central grid management. In one embodiment, determining that the power grid segment exceeds the saturation threshold comprises sharing information between distributed control nodes. In one embodiment, determining that the power grid segment exceeds the saturation threshold comprises determining that real power generation capacity of the power grid segment exceeds ten percent of peak real power demand. In one embodiment, adjusting the ratio of real power to reactive power comprises converting at least a portion of real power generation for the power grid segment into reactive power generation. In one embodiment, converting real power generation in reactive power generation comprises converting real power generation at a point of common coupling (PCC) for the segment of the power grid. In one embodiment, converting real power generation in reactive power generation comprises converting real power at distributed control nodes within the segment of the power grid to change the ratio of real power to reactive power at a point of common coupling (PCC) of the distributed control nodes. In one embodiment, adjusting the ratio of real power to reactive power comprises diverting at least a portion of real power to energy storage local to the segment of the power grid.

In one aspect, a power grid system includes: a first consumer node having a first local power source local to the first consumer node, the first consumer node coupled to a point of common coupling (PCC); a second consumer node having a second local power source local to the second consumer node, the second consumer node coupled to the PCC; a first control node coupled between the PCC and the first consumer node; a second control node coupled between the PCC and the second consumer node; wherein the first and second control nodes to control distribution of power from the first and second local power sources based on local power demand of each respective consumer node, and also based on distribution of power from the other respective control node.

In one aspect, a distributed control node within a power grid system includes: a grid connector to couple between a point of common coupling (PCC) and a first consumer node having a first local power source local to the first consumer node, and to couple via the PCC to a second consumer node having a second local power source local to the second consumer node; a controller to control distribution of power from the first local power source based on local power demand of the first consumer node, and also based on distribution of power from the second control node.

In one aspect, a method of controlling a power grid includes: monitoring, at a control node, generation of power from a first local power source of a first consumer node, operation of a second consumer node, and power demand from the first consumer node, wherein the first and second consumer nodes and the control node to couple together at a point of common coupling (PCC), wherein the second consumer node has a second local power source local to the second consumer node; and dynamically controlling distribution of power from the first local power source based on local power demand of the first consumer node, and also based on distribution of power from the second control node.

In one aspect, a power grid system includes: multiple consumer nodes coupled together as a grid segment via a point of common coupling (PCC); first and second power sources for the grid segment coupled with each other and the multiple consumer nodes via the PCC, wherein neither the first nor the second power source has sufficient generation capacity alone to meet peak demand of the multiple consumer nodes; and at least a first control node coupled to the first power source and at least a second control node coupled to the second power source, the first and second control nodes to control distribution of power from the first and second power sources to the multiple consumer nodes based on power demand from the multiple consumer nodes and based on operation of the respective other power source.

In one aspect, a distributed control node within a power grid system includes: a grid connector to couple to multiple consumer nodes and first and second power sources at a point of common coupling (PCC), wherein neither the first nor the second power source has sufficient generation capacity alone to meet peak demand of the multiple consumer nodes; a controller to control distribution of power from the first power source to the multiple consumer nodes based on power demand from the multiple consumer nodes and based on operation of the second power source.

In one aspect, a method of controlling a power grid includes: monitoring, at a control node, generation of power from a first power source, operation of a second power source, and power demand from multiple consumer nodes, wherein the multiple consumer nodes, the first and second power sources, and the control node are coupled together at a point of common coupling (PCC), and wherein neither the first nor the second power source has sufficient generation capacity alone to meet peak demand of the multiple consumer nodes; and dynamically controlling distribution of power from the first power source to the multiple consumer nodes based on power demand from the multiple consumer nodes and based on operation of the second power source.

For the power grid systems, the distributed control nodes, and/or the methods of the preceding six paragraphs, the following embodiments provide examples of embodiments that can apply, and are illustrative, but not limiting. In one embodiment, each consumer nodes comprises a customer premises. In one embodiment, a consumer node comprises multiple customer premises. In one embodiment, a single customer premises comprises multiple consumer nodes. In one embodiment, the PCC is further to couple to a utility power grid having a central management system and a central power source. In one embodiment, the PCC is further to couple to a third power source, wherein the first and second power sources are on a same side of the PCC as each other, and the third power source is on a different side of the PCC relative to the first and second power sources. In one embodiment, the first control node and second control node are coupled as master and slave, where one of the control nodes controls power distribution within the PCC as master, and the other control node distributes power as a slave under direction of the master. In one embodiment, the first and second control nodes are to control the distribution of power including locally controlling generation of reactive power from the first and second power sources. In one embodiment, a control node further comprises a power converter local to the control node. In one embodiment, further comprising a central data store coupled with the first and second control nodes, the central data store to store and dispatch information about power generation and power demand within the PCC. In one embodiment, further comprising a central energy store coupled to the first and second power sources via the PCC, the central energy store capable to store energy generated by the first and/or second power sources in response to control by the first and/or second control nodes. In one embodiment, further comprising at least one customer premises power source at a customer node, the customer premises power source to generate energy at the customer premises, wherein the first and second control nodes are to control distribution of power from the first and second power sources to the multiple consumer nodes based on power demand from the multiple consumer nodes and based on operation of the respective other power source and based on power generation from the customer premises power source.

Flow diagrams as illustrated herein provide examples of sequences of various process actions. The flow diagrams can indicate operations to be executed by a software or firmware routine, as well as physical operations. In one embodiment, a flow diagram can illustrate the state of a finite state machine (FSM), which can be implemented in hardware and/or software. Although shown in a particular sequence or order, unless otherwise specified, the order of the actions can be modified. Thus, the illustrated embodiments should be understood only as an example, and the process can be performed in a different order, and some actions can be performed in parallel. Additionally, one or more actions can be omitted in various embodiments; thus, not all actions are required in every embodiment. Other process flows are possible.

To the extent various operations or functions are described herein, they can be described or defined as software code, instructions, configuration, and/or data. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A method for grid control, comprising:
   measuring current drawn by a load, including harmonics of the current, with a metering device located on a consumer side of a point of common coupling (PCC) of a consumer premises to a grid network, which is a same side of the PCC as the load, where the load includes one of multiple different devices electrically coupled on the consumer side of the PCC;
   computing an angular displacement of harmonics, which include harmonic components of the current, relative to a primary current, which is a main energy component of the current;
   generating an energy signature unique to the load including recording a complex current vector for the load in operation identifying for the primary current a real power component and a reactive power component, and identifying for the harmonics a real power component, a reactive power component, and the angular displacement relative to the primary current; and
   adjusting an energy output of a power converter at the consumer premises on the consumer side of the PCC to control a noise contribution of the load due to the harmonics as seen at the PCC from a grid side that is not the same side of the PCC as the load, based on harmonics identified in the energy signature for the load, to reduce noise introduced onto the grid network from the load.

2. The method of claim 1, wherein adjusting the energy output to control the noise contribution from the harmonics of the load further comprises:
   adjusting a reactive power output component of the power converter from energy generated by a local energy source coupled to the consumer side of the PCC.

3. The method of claim 1, wherein adjusting the energy output to control the noise contribution from the harmonics of the load further comprises:
   adjusting a reactive current component delivered to the load, to create a reactive current that offsets the harmonics identified in the energy signature for the load.

4. The method of claim 1, wherein adjusting the energy output to control the noise contribution from the harmonics of the load further comprises:
   reducing a frequency of an operating voltage of the load.

5. The method of claim 1, further comprising:
   sending information about current drawn by the load to a control device on the grid network that is on the grid side of the PCC.

6. The method of claim 5, wherein sending the information about the current drawn by the load to the control device comprises:
   sending the information about the current drawn by the load to a grid controller.

7. The method of claim 5, wherein sending the information about the current drawn by the load to the control device comprises:
   sending the information about the current drawn by the load to a different control node of the grid network.

8. A distributed control node within a power grid system, comprising:
   a grid connector to couple a load to the power grid system, where the load includes one of multiple different devices electrically coupled on a consumer side of a point of common coupling (PCC) to the power grid system at a consumer premises, which is a same side of the PCC as the load;

a metering device located on the consumer side of the PCC to the power grid system as the load, the metering device to measure current drawn by the load;

a controller device to compute an angular displacement of harmonics, which include harmonic components of the current, relative to a primary current, which is a main energy component of the current, and to generate an energy signature unique to the load including recording of a complex current vector for the load in operation identifying for the primary current a real power component and a reactive power component, and identification of a real power component, a reactive power component, and an angular displacement relative to the primary current for the harmonics, the controller further to adjust an energy output of a power converter at the consumer premises on the consumer side of the PCC to control a noise contribution of the load due to the harmonics as seen at the PCC from a grid side that is not the same side of the PCC as the load, based on harmonics identified in the energy signature for the load, to reduce noise introduced onto the power grid system from the load.

9. The control node of claim 8, wherein the controller device is to adjust the energy output to control the noise contribution from the harmonics of the load further comprising to adjust a reactive power output component of the power converter from energy generated by a local energy source coupled to the consumer side of the PCC.

10. The control node of claim 8, wherein the controller device is to adjust the energy output to control the noise contribution from the harmonics of the load further comprising to adjust a reactive current component delivered to the load, to create a reactive current that offsets the harmonics identified in the energy signature for the load.

11. The control node of claim 8, wherein the controller device is adjust the energy output to control the noise contribution from the harmonics of the load further comprising to reduce a frequency of an operating voltage of the load.

12. The control node of claim 8, wherein the controller device is to further send information about current drawn by the load to a control device on the power grid system that is on the grid side of the PCC.

13. The control node of claim 12, wherein the controller device is to send the information about the current drawn by the load to a grid controller.

14. The control node of claim 12, wherein the controller device is to send the information about the current drawn by the load to a different control node of the power grid system.

15. A power grid system, comprising:

multiple loads electrically coupled to a consumer side of a point of common coupling (PCC) at a consumer premises; and a control node coupled to the multiple loads at the PCC, the control node including a metering device located on the consumer side of the PCC to the power grid system as the loads, the metering device to measure current drawn by at least one of the loads, to compute an angular displacement of harmonics, which include harmonic components of the current, relative to a primary current, which is a main energy component of the current, and to generate an energy signature unique to the at least one load including recording of a complex current vector for the load in operation identifying for the primary current a real power component and a reactive power component, and identification of a real power component, a reactive power component, and an angular displacement relative to the primary current for the harmonics; and a power converter to adjust an energy output of a power converter at the consumer premises on the consumer side of the PCC to control a noise contribution of the at least one load due to the harmonics as seen at the PCC from a grid side that is not the same side of the PCC as the load, based on harmonics identified in the energy signature for the load, to reduce noise introduced onto the power grid system from the load.

16. The power grid system of claim 15, wherein the power converter is to adjust the energy output to control the noise contribution from the harmonics of the load further comprising to adjust a reactive power output component of the power converter from energy generated by a local energy source coupled to the consumer side of the PCC.

17. The power grid system of claim 15, wherein the power converter is to adjust the energy output to control the noise contribution from the harmonics of the load further comprising to adjust a reactive current component delivered to the load, to create a reactive current that offsets the harmonics identified in the energy signature for the load.

18. The power grid system of claim 15, wherein the power converter is to adjust the energy output to control the noise contribution from the harmonics of the load further comprising to reduce a frequency of an operating voltage of the load.

19. The power grid system of claim 15, wherein the metering device is to send the information about the current drawn by the load to a different control node of the power grid system.

* * * * *